United States Patent
Shin et al.

(10) Patent No.: US 12,506,077 B2
(45) Date of Patent: Dec. 23, 2025

(54) SEMICONDUCTOR DEVICES AND METHODS OF FABRICATING THE SAME

(71) Applicant: Samsung Electronics Co., Ltd., Suwon-si (KR)

(72) Inventors: Jongchan Shin, Gwacheon-si (KR); Woojeong Shin, Suwon-si (KR); Changmin Park, Hwaseong-si (KR); Noyoung Chung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 426 days.

(21) Appl. No.: 17/409,069

(22) Filed: Aug. 23, 2021

(65) Prior Publication Data

US 2022/0216150 A1    Jul. 7, 2022

(30) Foreign Application Priority Data

Jan. 6, 2021    (KR) .......................... 10-2021-0001672

(51) Int. Cl.
*H01L 23/528*    (2006.01)
*H01L 21/02*    (2006.01)
(Continued)

(52) U.S. Cl.
CPC ...... *H01L 23/5286* (2013.01); *H01L 21/0259* (2013.01); *H01L 21/76816* (2013.01);
(Continued)

(58) Field of Classification Search
CPC ............ H01L 23/5286; H01L 21/0259; H01L 21/76816; H01L 21/76877;
(Continued)

(56) References Cited

U.S. PATENT DOCUMENTS 9,093,386 B2    7/2015    Huang et al.
9,563,731 B2    2/2017    Hsu et al.
(Continued)

FOREIGN PATENT DOCUMENTS

CN    111403477 A    7/2020
KR    20190120991 A    10/2019
TW    202002292 A    1/2020

*Primary Examiner* — Meiya Li
(74) *Attorney, Agent, or Firm* — Wolf, Greenfield & Sacks, P.C.

(57) ABSTRACT

A semiconductor device includes a logic cell on a substrate and a first metal layer on the logic cell. The first metal layer includes first and second power lines that extend in a first direction, and first, second, and third lower interconnection lines, which are respectively disposed on first, second, and third interconnection tracks defined between the first and second power lines that extend in the first direction parallel to each other. The first lower interconnection line includes first and second interconnection lines spaced apart from each other by a first distance, and the third lower interconnection line includes third and fourth interconnection lines spaced apart from each other by a second distance. The first and third interconnection lines have first and second ends, respectively, which face the second and fourth interconnection lines, respectively, and have different curvatures.

14 Claims, 41 Drawing Sheets

(51) Int. Cl.
*H01L 21/768* (2006.01)
*H10D 30/01* (2025.01)
*H10D 30/62* (2025.01)
*H10D 30/67* (2025.01)
*H10D 62/10* (2025.01)
*H10D 62/13* (2025.01)
*H10D 84/01* (2025.01)
*H10D 84/03* (2025.01)
*H10D 84/85* (2025.01)

(52) U.S. Cl.
CPC .... *H01L 21/76877* (2013.01); *H01L 23/5283* (2013.01); *H10D 30/024* (2025.01); *H10D 30/031* (2025.01); *H10D 30/6211* (2025.01); *H10D 30/6219* (2025.01); *H10D 30/6713* (2025.01); *H10D 30/6729* (2025.01); *H10D 30/6735* (2025.01); *H10D 30/6757* (2025.01); *H10D 62/118* (2025.01); *H10D 62/151* (2025.01); *H10D 84/0167* (2025.01); *H10D 84/0186* (2025.01); *H10D 84/0193* (2025.01); *H10D 84/038* (2025.01); *H10D 84/85* (2025.01)

(58) Field of Classification Search
CPC ..... H01L 21/823807; H01L 21/823821; H01L 21/823871; H01L 23/5283; H01L 27/092; H01L 29/0665; H01L 29/0847; H01L 29/41791; H01L 29/42392; H01L 29/66742; H01L 29/66795; H01L 29/7851; H01L 29/78618; H01L 29/78696; H01L 29/41733; H01L 29/456; H01L 21/0337; H01L 21/31144; H01L 23/485; H01L 29/41766; H01L 29/45; H01L 29/7848; H01L 21/025925; H01L 23/528; H01L 29/0673; H01L 29/42376; H01L 29/775; H01L 29/66439; H01L 21/76838; H01L 27/0207; H01L 21/823475; H01L 21/823828; H01L 21/823857; B82Y 10/00; H10D 30/014; H10D 30/024; H10D 30/031; H10D 30/43; H10D 30/6211; H10D 30/6219; H10D 30/6713; H10D 30/6729; H10D 30/6735; H10D 30/6757; H10D 30/797; H10D 62/118; H10D 62/121; H10D 62/151; H10D 62/83; H10D 64/256; H10D 64/518; H10D 64/62; H10D 84/0167; H10D 84/0184; H10D 84/0186; H10D 84/0193; H10D 84/038; H10D 84/85; H10D 84/853
USPC .......................................................... 257/351
See application file for complete search history.

(56) References Cited

U.S. PATENT DOCUMENTS

| | | | |
|---|---|---|---|
| 9,640,444 B2 * | 5/2017 | Do | ........................ H01L 27/092 |
| 9,793,164 B2 | 10/2017 | Machkaoutsan et al. | |
| 9,911,647 B2 | 3/2018 | Burns et al. | |
| 9,966,262 B2 | 5/2018 | Kim | |
| 10,373,829 B1 * | 8/2019 | Hsieh | ................ H01L 21/31144 |
| 10,468,252 B2 | 11/2019 | Shin | |
| 10,483,202 B2 * | 11/2019 | Aburada | ............... H01L 23/528 |
| 10,546,774 B2 * | 1/2020 | Burns | ............... H01L 21/31116 |
| 10,593,701 B2 * | 3/2020 | Seo | .................. H01L 27/11807 |
| 10,651,047 B2 | 5/2020 | Lee et al. | |
| 10,727,056 B2 | 7/2020 | Fan et al. | |
| 10,840,151 B2 * | 11/2020 | Leib | ................... H01L 29/0847 |
| 10,840,375 B2 | 11/2020 | Wu et al. | |
| 11,527,640 B2 | 12/2022 | Mehandru et al. | |
| 2018/0323290 A1 | 11/2018 | Koh et al. | |
| 2019/0164890 A1 * | 5/2019 | Yeoh | ................. H01L 23/53266 |
| 2019/0304900 A1 * | 10/2019 | Chen | ........................ G06F 30/39 |
| 2019/0318968 A1 * | 10/2019 | Seo | ................. H01L 21/823821 |
| 2020/0185414 A1 * | 6/2020 | Seo | ................... H01L 27/11807 |
| 2020/0279734 A1 | 9/2020 | Fangyuan | |
| 2020/0279739 A1 | 9/2020 | Jin | |
| 2020/0357823 A1 * | 11/2020 | Kumar | .................... G06F 30/39 |
| 2021/0134784 A1 * | 5/2021 | Kim | ................... H01L 29/78696 |
| 2021/0183786 A1 * | 6/2021 | Hong | .................. H01L 27/0207 |

* cited by examiner

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2021-0001672, filed on Jan. 6, 2021, in the Korean Intellectual Property Office, the entire contents of which are hereby incorporated by reference.

BACKGROUND OF THE INVENTION

The present disclosure relates to semiconductor devices and to methods of fabricating the same. In particular, the present disclosure relates to semiconductor devices including field effect transistors, and to methods of fabricating the same.

Some semiconductor devices may include an integrated circuit having metal-oxide-semiconductor field-effect transistors (MOSFETs). To meet increasing demand for semiconductor devices with small pattern sizes and reduced design rules, MOSFETs are being scaled down, and in some instances are being aggressively scaled down. The scaling down of MOSFETs is not without drawbacks, and it may lead to deterioration in operational properties of semiconductor devices. A variety of studies are being conducted to consider techniques to overcome technical limitations associated with the scaling-down of semiconductor devices, and to realize high performance semiconductor devices.

SUMMARY

Aspects of the present disclosure provide semiconductor devices with improved electric characteristics, and methods of fabricating the same.

According to some embodiments of the inventive concepts, a semiconductor device may include a logic cell on a substrate and a first metal layer on the logic cell. The logic cell may include a PMOSFET region and an NMOSFET region. The first metal layer may include a first power line and a second power line that extend in a first direction and are parallel to each other, and a first lower interconnection line, a second lower interconnection line, and a third lower interconnection line, which are respectively arranged on a first interconnection track, a second interconnection track, and a third interconnection track that extend in parallel in the first direction between the first power line and the second power line, with the second interconnection track between the first and third interconnection tracks. The first to third interconnection tracks may be extended in the first direction to be parallel to each other. The first lower interconnection line may include a first interconnection line and a second interconnection line spaced apart from each other in the first direction by a first distance, and the third lower interconnection line may include a third interconnection line and a fourth interconnection line spaced apart from each other in the first direction by a second distance smaller than the first distance. The first interconnection line may have a first end with a first curvature that faces the second interconnection line, and the third interconnection line may have a second end with a second, different curvature that faces the fourth interconnection line. The second lower interconnection line may extend in the first direction with a uniform linewidth in a second direction, including at a first portion across from the first distance between the first and second interconnection lines.

According to some embodiments of the inventive concepts, a semiconductor device may include a logic cell on a substrate and a first metal layer on the logic cell. The logic cell may include a PMOSFET region and an NMOSFET region. The first metal layer may include a first power line and a second power line, which extend in a first direction and are parallel to each other, and first to fifth lower interconnection lines, which are respectively disposed on first to fifth interconnection tracks that are sequentially defined between the first power line and the second power line and extend in the first direction parallel to each other. The first to fifth interconnection tracks may be arranged, at a constant pitch, in a second direction crossing the first direction. Linewidths of the first, third, and fifth lower interconnection lines may be equal to a first width, and linewidths of the second and fourth lower interconnection lines may be equal to a second width. The first width may be different from the second width.

According to some embodiments of the inventive concepts, a semiconductor device may include an active pattern on a substrate, a device isolation layer in a trench that defines the active pattern, a source/drain pattern on the active pattern and a channel pattern connected to the source/drain pattern, the channel pattern including a first semiconductor pattern, a second semiconductor pattern, and a third semiconductor pattern, which are sequentially stacked to be spaced apart from each other, a gate electrode that extends and crosses the channel pattern, the gate electrode including a first portion between the active pattern and the first semiconductor pattern, a second portion between the first semiconductor pattern and the second semiconductor pattern, a third portion between the second semiconductor pattern and the third semiconductor pattern, and a fourth portion on the third semiconductor pattern, a gate insulating layer between the channel pattern and the gate electrode, gate spacers on opposite side surfaces of the fourth portion of the gate electrode, respectively, a gate capping pattern on a top surface of the gate electrode, a first interlayer insulating layer on the gate capping pattern, an active contact that penetrates the first interlayer insulating layer and coupled to the source/drain pattern, a gate contact that penetrates the first interlayer insulating layer and is coupled to the gate electrode, a second interlayer insulating layer on the first interlayer insulating layer, a first metal layer in the second interlayer insulating layer and connected to the active contact and the gate contact, a third interlayer insulating layer on the second interlayer insulating layer, and a second metal layer in the third interlayer insulating layer. The first metal layer may include a first power line and a second power line, which extend in a first direction and are spaced apart from each other, and a first lower interconnection line, a second lower interconnection line, and a third lower interconnection line, which are respectively arranged on a first interconnection track, a second interconnection track, and a third interconnection track that extend in parallel between the first power line and the second power line with the second interconnection track between the first and third interconnection tracks. The first lower interconnection line may include a first interconnection line and a second interconnection line, which are spaced apart from each other in the first direction by a first distance, and the third lower interconnection line may include a third interconnection line and a fourth interconnection line, which are spaced apart from each other in the first direction by a second distance smaller than the first distance. The first interconnection line may have a first end with a first curvature that faces the second interconnection line, and the third interconnection line may have a second end with a second, different curvature that faces the fourth interconnection line. The second lower interconnection line may extend with a uniform linewidth in a second direction, including at a first portion, which is across from the first distance between the first and second interconnection lines.

According to some embodiments of the inventive concepts, a method of fabricating a semiconductor device may include forming an etch target layer on a substrate, forming a mold layer on the etch target layer, forming first line patterns, which extend in a first direction to be parallel to each other, on the mold layer, forming spacers on side surfaces of the first line patterns, forming second line patterns in spaces between the spacers, the second line patterns extending in the first direction, and parallel to each other, performing a first photolithography process on the second line patterns to form a first line and a second line from a first one of the second line patterns, the first line and the second line being spaced apart from each other in the first direction by a first distance, performing a patterning process to form two lines spaced apart from each other by the first distance, and performing a second photolithography process on the second line patterns to form a third line and a fourth line from a second one of the second line patterns. The third line and fourth line may be spaced apart from each other in the first direction by a second distance, and the first distance may be larger than the second distance.

DETAILED DESCRIPTION

Figure 1:
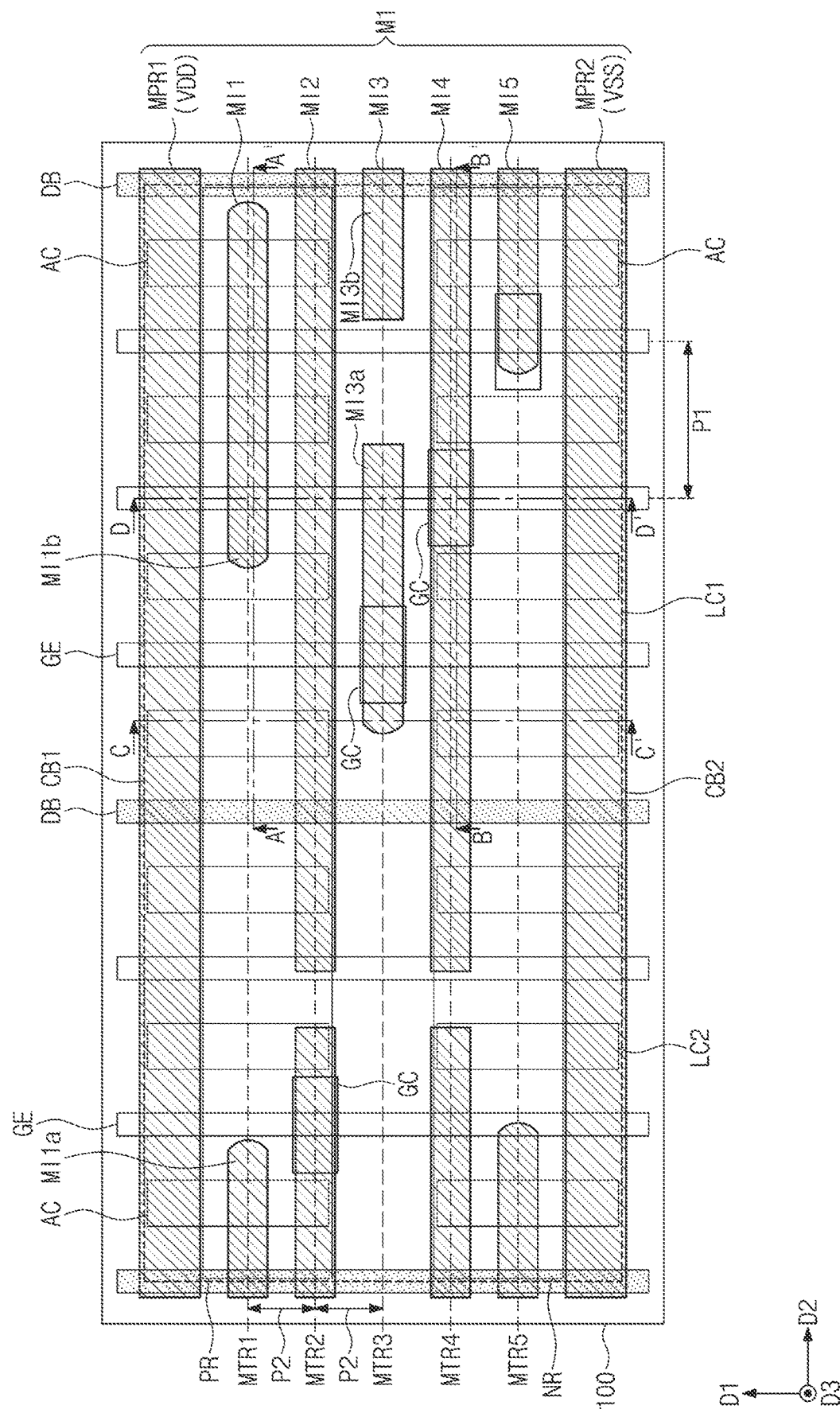
FIG. 1 is a plan view illustrating a semiconductor device according to some embodiments of the inventive concepts.

FIG. 1 is a plan view illustrating a semiconductor device according to some embodiments of the inventive concepts. FIGS. 2A to 2D are sectional views taken along lines A-A', B-B', C-C' and D-D', respectively, of FIG. 1.

Referring to FIGS. 1 and 2A to 2D, a plurality of logic cells LC1 and LC2 may be provided on a substrate 100. The substrate 100 may be a semiconductor substrate that is formed of or includes silicon, germanium, silicon-germanium, a compound semiconductor material, or the like. In some embodiments, the substrate 100 may be a silicon substrate.

As an example, the logic cells LC1 and LC2 may include a first logic cell LC1 and a second logic cell LC2, which are adjacent to each other in a second direction D2. Logic transistors of a logic circuit may be on each of the first and second logic cells LC1 and LC2. Each of the first and second logic cells LC1 and LC2 may include MOSFET regions of a first and second type, e.g., a PMOSFET region PR and an NMOSFET region NR. The PMOSFET and NMOSFET regions PR and NR may be spaced apart from each other in a first direction D1.

Figure 2A:
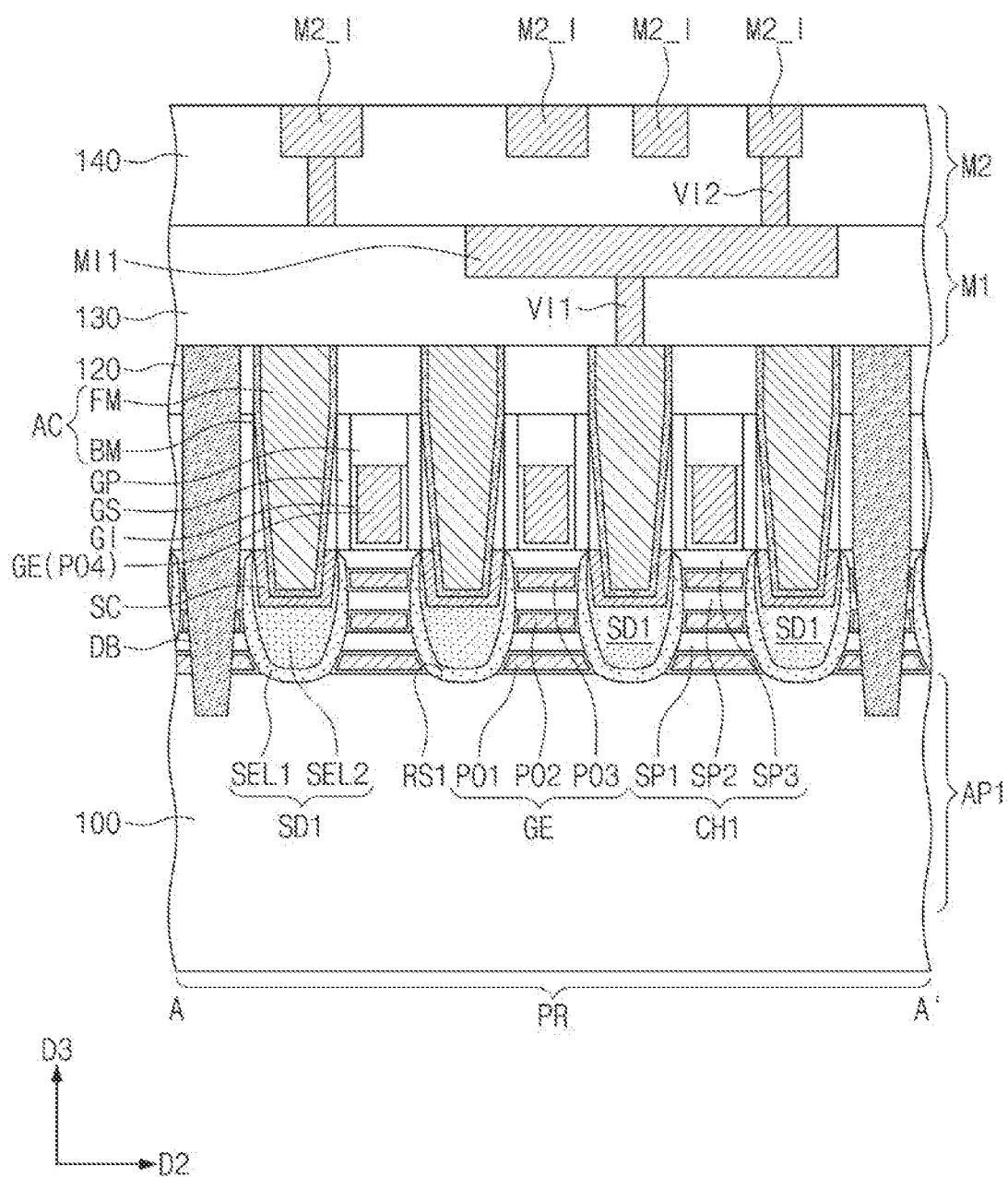
FIGS. 2A to 2D are sectional views taken along lines A-A', B-B', C-C' and D-D', respectively, of FIG. 1.
Figure 2B:
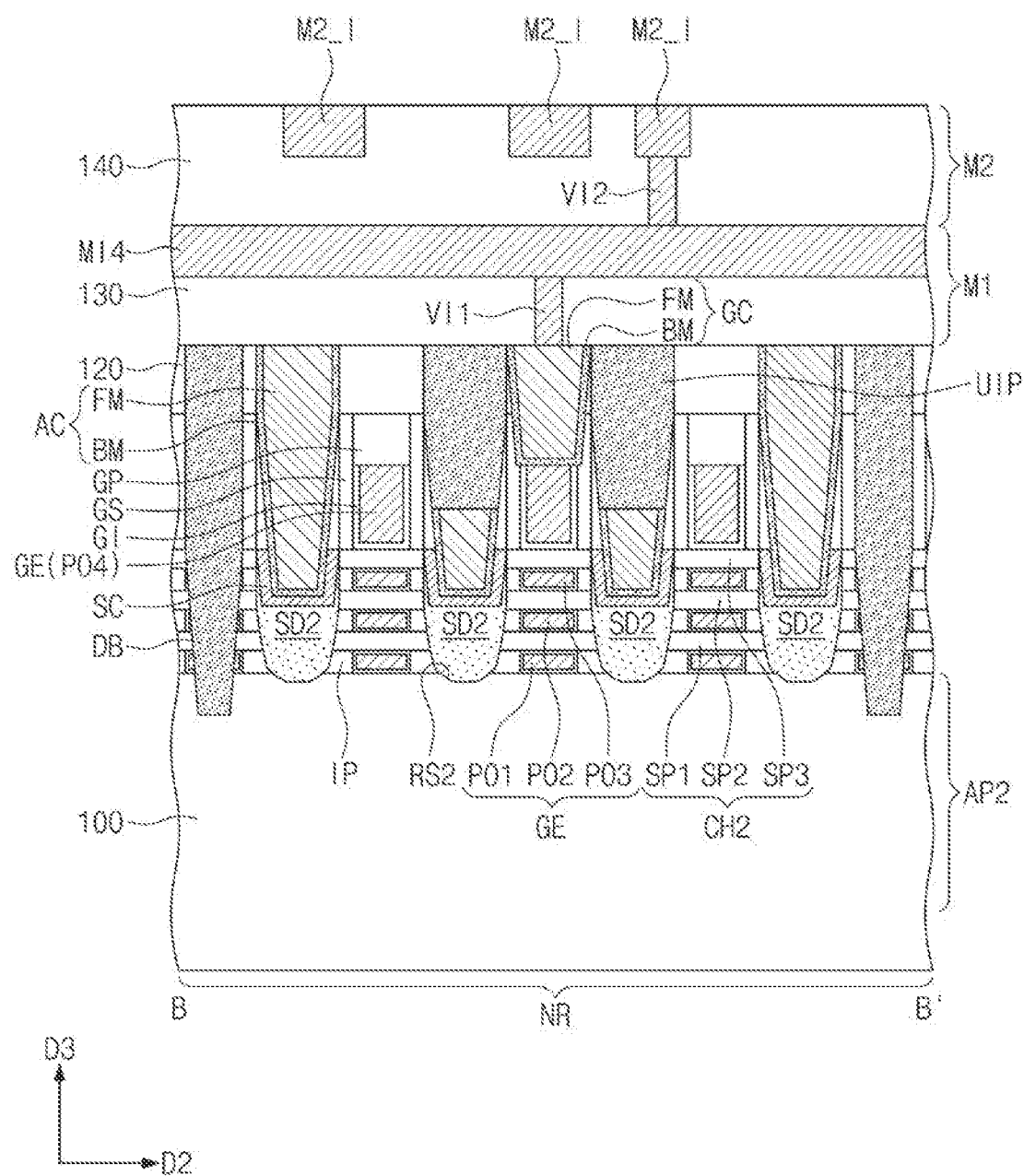
Figure 2C:
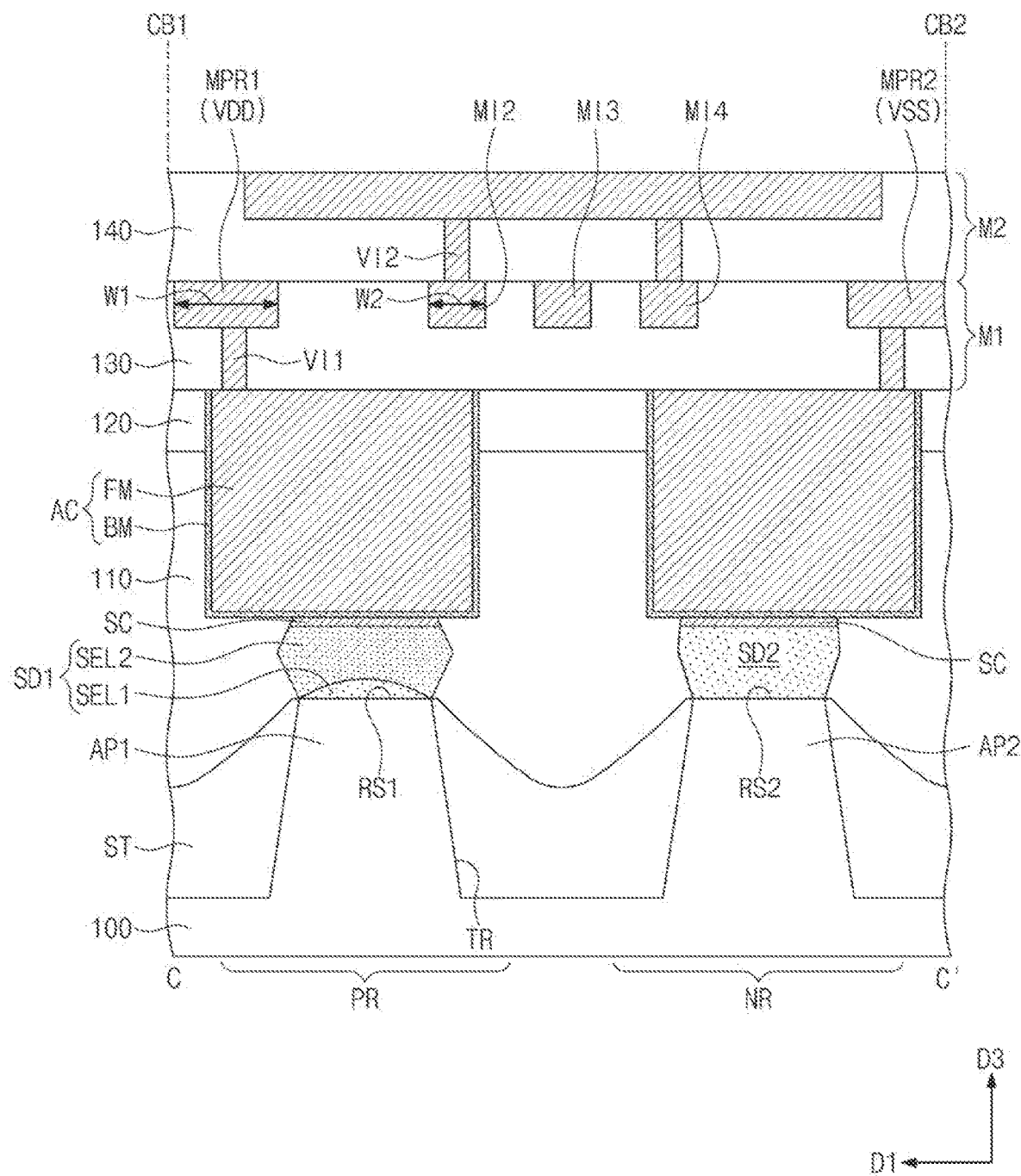

As best seen in FIG. 2C, a first active pattern AP1 and a second active pattern AP2 may be defined by a trench TR, which may be formed in an upper portion of the substrate 100. The first and second active patterns AP1 and AP2 may be provided on the PMOSFET and NMOSFET regions PR and NR, respectively. The first and second active patterns AP1 and AP2 may extend in the second direction D2. The first and second active patterns AP1 and AP2 may be vertically protruding portions of the substrate 100.

A device isolation layer ST may fill the trench TR. The device isolation layer ST may include a silicon oxide layer. The device isolation layer ST may not cover first and second channel patterns CH1 and CH2, which will be described below.

The first channel pattern CH1 may be provided on the first active pattern AP1. The second channel pattern CH2 may be provided on the second active pattern AP2. Each of the first channel pattern CH1 and the second channel pattern CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include silicon (Si), germanium (Ge), or silicon-germanium (SiGe). In some embodiments, each of the first to third semiconductor patterns SP1, SP2, and SP3 may be formed of or include crystalline silicon.

As best seen in FIG. 2A, a plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between adjacent first source/drain patterns SD1. In other words, two adjacent first source/drain patterns SD1 may be connected to each other by the stacked first to third semiconductor patterns SP1, SP2, and SP3 of the first channel pattern CH1 therebetween. At least some of the first source/drain patterns SD1 may be connected to two of the first channel patterns CH1.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between adjacent second source/drain patterns SD2. In other words, two adjacent second source/drain patterns SD2 may be connected to each other by the stacked first to third semiconductor patterns SP1, SP2, and SP3 of the second channel pattern CH2. At least some of the second source/drain patterns SD1 may be connected to two of the second channel patterns CH2.

The first and second source/drain patterns SD1 and SD2 may be epitaxial patterns, which may be formed by a selective epitaxial growth (SEG) process. As an example, each of the first and second source/drain patterns SD1 and SD2 may have a top surface that is located at substantially the same level from the substrate 100 as a top surface of the third semiconductor pattern SP3. However, in some embodiments, the top surface of each of the first and second source/drain patterns SD1 and SD2 may be higher than the top surface of the third semiconductor pattern SP3, or in other words farther from the substrate 100 than the top surface of the third semiconductor pattern SP3.

The first source/drain patterns SD1 may include a semiconductor material (e.g., SiGe) having a lattice constant greater than that of the substrate 100. In some embodiments, two adjacent first source/drain patterns SD1 may exert a compressive stress on the first channel patterns CH1 therebetween. The second source/drain patterns SD2 may be formed of or include the same semiconductor material (e.g., Si) as the substrate 100.

Each of the first source/drain patterns SD1 may include a first semiconductor layer SEL1 and a second semiconductor layer SEL2, which may be sequentially stacked. A sectional shape of the first source/drain pattern SD1 taken parallel to the second direction D2 will be described in greater detail herein.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be larger than a volume of the first semiconductor layer SEL1. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon-germanium (SiGe). In greater detail, the first semiconductor layer SEL1 may have a relatively low germanium concentration. In some embodiments, the first semiconductor layer SEL1 may contain only silicon (Si) and not germanium (Ge). The germanium concentration of the first semiconductor layer SEL1 may range from 0 atomic percent (at %) to 10 at %.

The second semiconductor layer SEL2 may have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % at a lower portion more proximate to the substrate 100 or near the first semiconductor layer SEL1, and may be about 60 at % at an upper portion or at its top level.

The first and second semiconductor layers SEL1 and SEL2 may include impurities (e.g., boron), allowing the first source/drain pattern SD1 to have conductivity of a first type (e.g., p-type conductivity). In some embodiments, a concentration of impurities in the second semiconductor layer SEL2 (as measured in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. Such a stacking fault may lead to an increase of a channel resistance. The stacking fault may easily occur on the bottom of the first recess RS1. Thus, if the first semiconductor layer SEL1 adjacent to the first recess RS1 is provided to have a relatively large thickness, the stacking fault may be prevented.

Additionally or alternatively, the first semiconductor layer SEL1 may protect the second semiconductor layer SEL2, in a process of replacing sacrificial layers SAL, which will be described in greater detail herein, with first to third portions PO1, PO2, and PO3 of a gate electrode GE. For example, the first semiconductor layer SEL1 may prevent the second semiconductor layer SEL2 from being undesirably etched by an etching material, which is used to remove the sacrificial layers SAL.

Gate electrodes GE may cross the first and second channel patterns CH1 and CH2 and may extend in the first direction D1. The gate electrodes GE may be arranged with a first pitch P1 in the second direction D2. Each of the gate electrodes GE may be overlapped with or by the first and second channel patterns CH1 and CH2 when viewed in a plan view.

The gate electrode GE may include a first portion PO1 interposed between the first and second active patterns AP1 and AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring to FIG. 2A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Figure 2D:
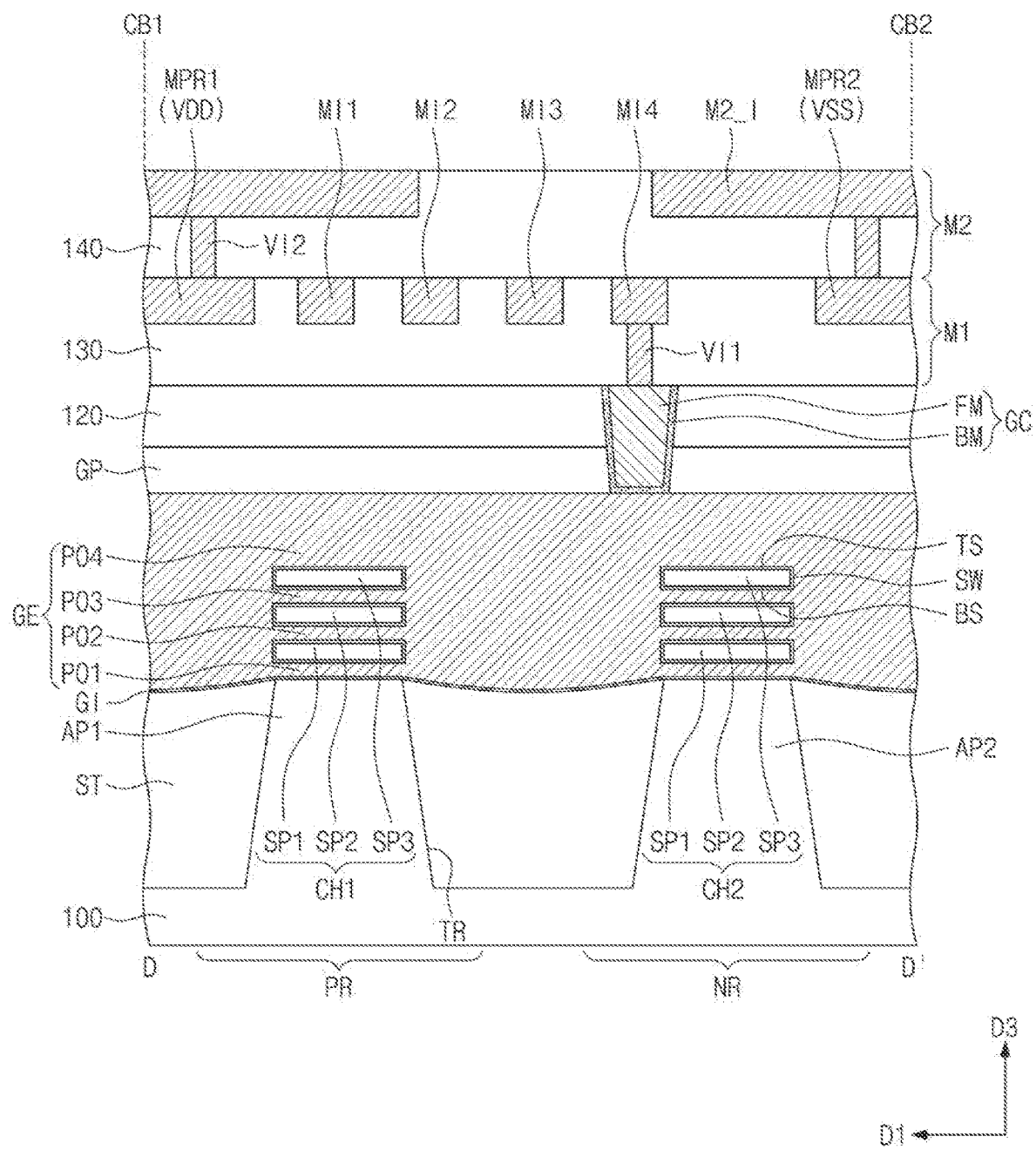

Referring to FIG. 2D, the gate electrode GE may be provided on a top surface TS, a bottom surface BS, and opposite side surfaces SW of each of the first to third semiconductor patterns SP1, SP2, and SP3. In other words, the logic transistor according to some embodiments may be a three-dimensional field-effect transistor (e.g., multi-bridge channel field-effect transistor (MBCFET)), in which the gate electrode GE surrounds the channel pattern, e.g., three-dimensionally surrounds the channel pattern.

Referring to FIGS. 1 and 2A to 2D, a pair of gate spacers GS may be respectively arranged on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE. For example, the top surfaces of the gate spacers GS may be coplanar with a top surface of a first interlayer insulating layer 110, which will be described in greater details herein. The gate spacers GS may be formed of or may include at least one of SiCN, SiCON, or SiN. In some embodiments, the gate spacers GS may have a multi-layered structure that includes at least two layers, each of which is made of SiCN, SiCON, or SiN.

A gate capping pattern GP may be provided on the gate electrode GE. The gate capping pattern GP may extend along the gate electrode GE and in the first direction D1. The gate capping pattern GP may be formed of or may include a material having an etch selectivity with respect to first and second interlayer insulating layers 110 and 120, which will be described in greater details herein. For example, the gate capping patterns GP may be formed of or may include at least one of SiON, SiCN, SiCON, or SiN.

A gate insulating layer GI may be interposed between the gate electrode GE and the first channel pattern CH1 and between the gate electrode GE and the second channel pattern CH2. As best seen in FIG. 2D, the gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE, as best seen in FIG. 2D.

In some embodiments, the gate insulating layer GI may include a silicon oxide layer, a silicon oxynitride layer, and/or a high-k dielectric layer. The high-k dielectric layer may be formed of or may include at least one of high-k dielectric materials whose dielectric constants are higher than that of silicon oxide. As non-limiting examples, the high-k dielectric materials may be formed of or may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In some embodiments, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance, and the paraelectric layer may have a positive capacitance. When two or more capacitors are connected in series and each capacitor has a positive capacitance, a total capacitance may be less than a capacitance of each of the capacitors. By contrast, when at least one of a series of serially-connected capacitors has a negative capacitance, a total capacitance of the serially-connected capacitors may have a positive value and may be greater than an absolute value of each capacitance.

When a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at room temperature.

The ferroelectric layer may have a ferroelectric material property. The ferroelectric layer may be formed of or may include at least one of, for example, hafnium oxide, hafnium zirconium oxide, barium strontium titanium oxide, barium titanium oxide, and/or lead zirconium titanium oxide. In some embodiments, the hafnium zirconium oxide may be hafnium oxide that is doped with zirconium (Zr). In some embodiments, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). In some embodiments, the kind of the dopants in the ferroelectric layer may vary depending on a ferroelectric material included in the ferroelectric layer.

In some embodiments, the ferroelectric layer includes hafnium oxide, and the dopants in the ferroelectric layer may include at least one of, for example, gadolinium (Gd), silicon (Si), zirconium (Zr), aluminum (Al), and/or yttrium (Y).

In some embodiments, the dopants are aluminum (Al), and a content of aluminum in the ferroelectric layer may range from 3 to 8 at % (atomic percentage). In some embodiments, the content of the aluminum as the dopants may be a ratio of the number of aluminum atoms to the number of hafnium and aluminum atoms.

In some embodiments, the dopants are silicon (Si), and a content of silicon in the ferroelectric layer may range from 2 at % to 10 at %. In some embodiments, the dopants are yttrium (Y), and a content of yttrium in the ferroelectric layer may range from 2 at % to 10 at %. In some embodiments, the dopants are gadolinium (Gd), and a content of gadolinium in the ferroelectric layer may range from 1 at % to 7 at %. In some embodiments, the dopants are zirconium (Zr), and a content of zirconium in the ferroelectric layer may range from 50 at % to 80 at %.

The paraelectric layer may have a paraelectric material property. The paraelectric layer may be formed of or may include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property only when it is in a specific range of thickness. In some embodiments, the ferroelectric layer may have a thickness ranging from 0.5 to 10 nm, but the inventive concepts are not limited to this example. Since a critical thickness associated with the occurrence of the ferroelectric material property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of or formed of the first metal pattern or the work function metal.

The first metal pattern may include a metal nitride layer. For example, the first metal pattern may include at least one metal, which may be selected from the group consisting of titanium (Ti), tantalum (Ta), aluminum (Al), tungsten (W) and molybdenum (Mo), and nitrogen (N), as examples. In some embodiments, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta), as examples. For example, the fourth portion PO4 of the gate electrode GE may include the first metal pattern and the second metal pattern on the first metal pattern.

Referring to FIG. 2B, inner spacers IP may be provided on the NMOSFET region NR. Each of the inner spacers IP may be interposed between the second source/drain pattern SD2 and a corresponding one of the first to third portions PO1, PO2, and PO3 of the gate electrode GE. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In some embodiments, at least one of the first and second interlayer insulating layers 110 and 120 may include a silicon oxide layer.

A pair of division structures DB, which may be opposite to each other in the second direction D2, may be provided at both sides of each of the first and second logic cells LC1 and LC2. For example, the division structure DB may be provided on a boundary between the first and second logic cells LC1 and LC2. The division structures DB may extend in the first direction D1 and parallel to the gate electrodes GE. A pitch between the division structures DB and the gate electrode GE adjacent to each other may be equal to the first pitch P1.

The division structures DB may penetrate the first and second interlayer insulating layers 110 and 120 and may extend into the first and second active patterns AP1 and AP2. The division structures DB may penetrate the first and second channel patterns CH1 and CH2. The division structures DB may separate the PMOS and NMOSFET regions PR and NR of the first logic cell LC1 from the PMOS and NMOSFET regions PR and NR of the second logic cell LC2.

Active contacts AC may penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view (e.g., as seen in FIG. 1), the active contact AC may have a bar shape that is elongated in the first direction D1.

The active contact AC may be a self-aligned contact. For example, the active contact AC may be formed by a self-alignment process using the gate capping pattern GP and the gate spacer GS. In some embodiments, the active contact AC may cover at least a portion of a side surface of the gate spacer GS. Although not shown, the active contact AC may cover a portion of the top surface of the gate capping pattern GP.

Silicide patterns SC may be interposed respectively between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or may include at least one of metal silicide materials (e.g., titanium silicide, tantalum silicide, tungsten silicide, nickel silicide, and cobalt silicide).

A gate contact GC, which is electrically connected to the gate electrode GE, may penetrate the second interlayer insulating layer 120 and the gate capping pattern GP. Referring to FIG. 2B, an upper region of each of the active contacts AC adjacent to the gate contact GC may be filled with an upper insulating pattern UIP. Accordingly, it may be possible to prevent a process failure (e.g., a short circuit), which may occur when the gate contact GC is in contact with the active contact AC adjacent thereto.

Each of the active contacts AC and gate contacts GC may include a conductive pattern FM and a barrier pattern BM enclosing the conductive pattern FM. For example, the conductive pattern FM may be formed of or may include at least one metal of aluminum, copper, tungsten, molybdenum, or cobalt. The barrier pattern BM may cover side and bottom surfaces of the conductive pattern FM. In some embodiments, the barrier pattern BM may include a metal layer and a metal nitride layer. The metal layer may be formed of or may include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first and second power lines MPR1 and MPR2, first to fifth lower interconnection lines MI1 to MI5, and lower vias VI1. The lower vias VI1 may be provided below the first and second power lines MPR1 and MPR2 and the first to fifth lower interconnection lines MI1 to MI5.

The first and second power lines MPR1 and MPR2 may extend in the second direction D2 and may be parallel to each other and cross the first and second logic cells LC1 and LC2. A drain voltage VDD and a source voltage VSS may be applied to the first and second power lines MPR1 and MPR2, respectively.

Referring to FIG. 1, a first cell boundary CB1, which may extend in the second direction D2, may be defined in each of the first and second logic cells LC1 and LC2. A second cell boundary CB2, which may extend in the second direction D2, may be defined at an opposite side of the first and second logic cells LC1 and LC2 from the first cell boundary CB1 in the first direction D1. The first power line MPR1, which as discussed above may be applied with the drain voltage VDD, may be arranged on the first cell boundary CB1. In other words, the first power line MPR1 applied with the drain voltage VDD may extend along the first cell boundary CB1 in the second direction D2. The second power line MPR2, which as discussed above may be applied with the source voltage VSS (e.g., a ground voltage), may be arranged on the second cell boundary CB2. In other words, the second power line MPR2 applied with the source voltage VSS may extend along the second cell boundary CB2 in the second direction D2.

The first to fifth lower interconnection lines MI1 to MI5 may be between the first and second power lines MPR1 and MPR2. In detail, first to fifth interconnection tracks MTR1-MTR5 may be defined between the first and second power lines MPR1 and MPR2. The first to fifth interconnection tracks MTR1-MTR5 may extend in the second direction D2 to be parallel to each other. The first to fifth lower interconnection lines MI1 to MI5 may be arranged at a second pitch P2 in the first direction D1. The second pitch P2 may be smaller than the first pitch P1.

At least one first lower interconnection line MI1 may be on the first interconnection track MTR1, at least one second lower interconnection line MI2 may be on the second interconnection track MTR2, at least one third lower interconnection line MI3 may be on the third interconnection track MTR3, at least one fourth lower interconnection line MI4 may be on the fourth interconnection track MTR4, and at least one fifth lower interconnection line MI5 may be on the fifth interconnection track MTR5.

The first to fifth lower interconnection lines MI1 to MI5 may extend along the first to fifth interconnection tracks MTR1-MTR5, respectively, in parallel to each other and in the second direction D2. When viewed in a plan view, each of the first to fifth lower interconnection lines MI1 to MI5 may have a line shape or a bar shape.

As best seen in FIG. 2C, a linewidth of each of the first and second power lines MPR1 and MPR2 may be a first width W1. A linewidth of each of the first to fifth lower interconnection lines MI1 to MI5 may be a second width W2. The linewidths of the first and second power lines MPR1 and MPR2 and the first to fifth lower interconnection lines MI1 to MI5 may be in the first direction D1. The second width W2 may be smaller than the first width W1 (e.g., see FIG. 2C). For example, the second width W2 may be smaller than 12 nm. The first width W1 may be larger than 12 nm.

The lower vias VI1 may be interposed between and electrically connect the first and second power lines MPR1 and MPR2 and the active contacts AC. The lower vias VI1 may be interposed between and electrically connect the first to fifth lower interconnection lines MI1 to MI5 and the active and gate contacts AC and GC.

As non-limiting examples, the first and second power lines MPR1 and MPR2 and the first to fifth lower interconnection lines MI1 to MI5 may be formed of or may include at least one metallic material (e.g., copper (Cu), aluminum (Al), ruthenium (Ru), cobalt (Co), tungsten (W), and molybdenum (Mo)).

The interconnection lines MPR1, MPR2, and MI1 to MI5 of the first metal layer M1 and the lower via VI1 thereunder may be formed by separate processes, respectively. For example, the interconnection lines MPR1, MPR2, and MI1 to MI5 of the first metal layer M1 may be formed by a single damascene process and the lower via VI1 of the first metal layer M1 may be formed by another single damascene process. The semiconductor device according to some embodiments may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line-shaped or bar-shaped pattern extending in the first direction D1. In other words, the upper interconnection lines M2_I may extend in the first direction D1 to be parallel to each other.

The second metal layer M2 may further include upper vias VI2. The upper vias VI2 may be provided below the upper interconnection lines M2_I. The upper vias VI2 may be interposed between and electrically connect the interconnection lines MPR1, MPR2, and MI1 to MI5 of the first metal layer M1 and the upper interconnection lines M2_I, respectively.

The upper interconnection line M2_I of the second metal layer M2 and the upper via VI2 thereunder may be formed by the same process and may form a single pattern. For example, the upper interconnection line M2_I and the upper via VI2 of the second metal layer M2 may be formed by a dual damascene process. The upper interconnection lines M2_I may be formed of or may include at least one f metallic material (e.g., copper (Cu), aluminum (Al), ruthenium (Ru), cobalt (Co), tungsten (W), and molybdenum (Mo)).

In some embodiments, although not shown, additional metal layers (e.g., M3, M4, M5, and so forth) may be further stacked on the fourth interlayer insulating layer 140. Each of the stacked metal layers may include routing lines.

Figure 3:
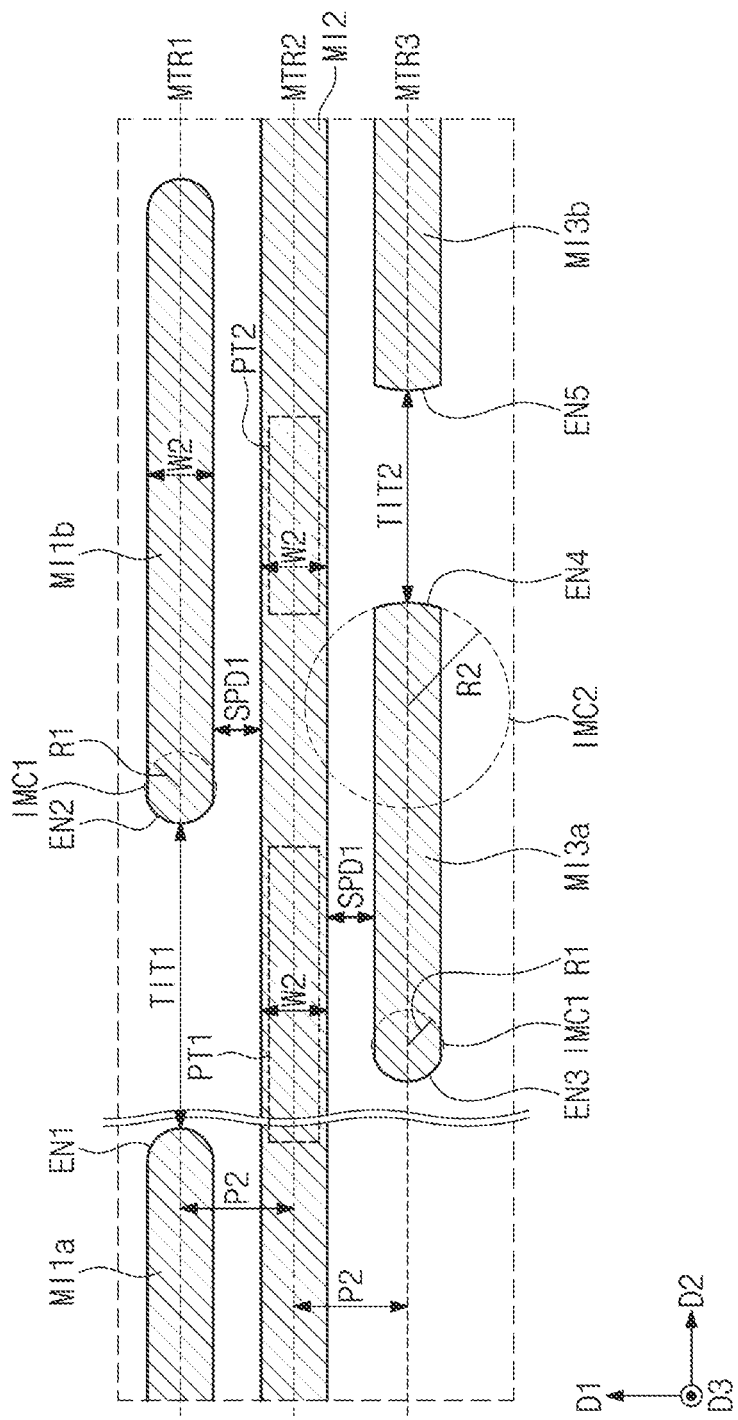
FIG. 3 is a plan view illustrating first to third lower interconnection lines, which may be on first to third interconnection tracks of FIG. 1.

FIG. 3 is a plan view illustrating the first to third lower interconnection lines, which are arranged on the first to third interconnection tracks of FIG. 1. Referring to FIG. 3, the first lower interconnection lines MI1, which are on the first interconnection track MTR1, may include a first interconnection line MI1a and a second interconnection line MI1b.

The first interconnection line MI1a may have a first end EN1 provided at its tip, and the second interconnection line MI1b may have a second end EN2 provided at its tip. The first end EN1 of the first interconnection line MI1a and the second end EN2 of the second interconnection line MI1b may face each other in the second direction D2.

A distance between the first end EN1 of the first interconnection line MI1a and the second end EN2 of the second interconnection line MI1b may be a first distance TIT1. The first distance TIT1 may be a distance between the tip of the first interconnection line MI1a and the tip of the second interconnection line MI1b (i.e., a tip-to-tip distance). The first distance TIT1 may be relatively large. For example, the first distance TIT1 may be larger than a second distance TIT2, which will be described below.

Each of the first end EN1 of the first interconnection line MI1a and the second end EN2 of the second interconnection line MI1b may have a curved or rounded shape. The curved or rounded shape may be convex. Each of the first end EN1 of the first interconnection line MI1a and the second end EN2 of the second interconnection line MI1b may have a relatively large curvature. For example, a first imaginary circle IMC1 may be defined to be in contact with the second end EN2 of the second interconnection line MI1b. The second end EN2 may include an arc corresponding to the first imaginary circle IMC1. Here, the first imaginary circle IMC1 may be a circle that is fitted to the second end EN2 of the curved shape. The first imaginary circle IMC1, and thus the second end EN2, may have a first radius R1. The first radius R1 may be a curvature radius of the second end EN2 of the second interconnection line MI1b.

In the present specification, the curvature will be defined as a reciprocal of a curvature radius. From this definition, the second end EN2 of the second interconnection line MI1b may have a relatively large curvature and/or may have a first curvature radius R1 that is relatively small.

As an example, the first curvature radius R1 of the second end EN2 of the second interconnection line MI1b may be smaller than a linewidth W2 of the second interconnection line MI1b. A ratio of the first curvature radius R1 to the linewidth W2 may range from 0.5 to 1. The first end EN1 of the first interconnection line MI1a may have substantially the same curvature and curvature radius as the second end EN2 of the second interconnection line MI1b. The first end EN1 of the first interconnection line MI1a and the second end EN2 of the second interconnection line MI1b may be curved or rounded toward each other across the first distance TIT1.

The third lower interconnection lines MI3, which are disposed on the third interconnection track MTR3, may include a third interconnection line MI3a and a fourth interconnection line MI3b. The third interconnection line MI3a may have a third end EN3 and a fourth end EN4, which are respectively provided at its opposite tips. The fourth interconnection line MI3b may have a fifth end EN5 provided at its tip. The fourth end EN4 of the third interconnection line MI3a and the fifth end EN5 of the fourth interconnection line MI3b may face each other in the second direction D2.

A distance between the fourth end EN4 of the third interconnection line MI3a and the fifth end EN5 of the fourth interconnection line MI3b may be a second distance TIT2. The second distance TIT2 may be a distance between the tip of the third interconnection line MI3a and the tip of the fourth interconnection line MI3b. The second distance TIT2 may be relatively small. The second distance TIT2 may be smaller than the first distance TIT1 of FIG. 3.

Each of the fourth end EN4 of the third interconnection line MI3a and the fifth end EN5 of the fourth interconnection line MI3b may have a curved or rounded shape. Each of the fourth end EN4 of the third interconnection line MI3a and the fifth end EN5 of the fourth interconnection line MI3b may have a relatively small curvature. For example, a second imaginary circle IMC2 may be defined to be in contact with the fourth end EN4 of the third interconnection line MI3a. The fourth end EN4 may include an arc corresponding to the second imaginary circle IMC2. The second imaginary circle IMC2, and thus the fourth end EN4, may have a second radius R2. The second radius R2 may be a curvature radius of the fourth end EN4 of the third interconnection line MI3a. The fourth end EN4 of the third interconnection line MI3a may have a relatively small curvature and may have a second curvature radius R2 that is relatively large.

The second curvature radius R2 of the fourth end EN4 of the third interconnection line MI3a may be larger than the linewidth W2 of the third interconnection line MI3a. A ratio of the second curvature radius R2 to the linewidth W2 may range from 1 to 10. The second curvature radius R2 of the fourth end EN4 of the third interconnection line MI3a may be greater than the first curvature radius R1 of the second end EN2 of the second interconnection line MI1b. In other words, a curvature of the fourth end EN4 of the third interconnection line MI3a may be smaller than a curvature of the second end EN2 of the second interconnection line MI1b. The fifth end EN5 of the fourth interconnection line MI3b may have substantially the same curvature and curvature radius as the fourth end EN4 of the third interconnection line MI3a. The fourth end EN4 of the third interconnection line MI3a and the fifth end EN5 of the fourth interconnection line MI3b may be curved or rounded toward each other across the first distance TIT2.

The third end EN3 of the third interconnection line MI3a, which is opposite to the fourth end EN4, may have the first curvature radius R1 smaller than the second curvature radius R2. A curvature of the third end EN3 of the third interconnection line MI3a may be larger than the curvature of the fourth end EN4. In some embodiments, opposite ends of at least one of the interconnection lines may have different curvatures from each other.

In some embodiments, the curvature of the tip of the interconnection line may vary depending on a tip-to-tip distance between the interconnection lines on each interconnection track. For example, in the case where a distance between the interconnection lines is relatively large (e.g., the distance TIT1 between the first and second interconnection lines MI1a and MI1b), the corresponding tips EN1 and EN2 may have a relatively large curvature. By contrast, in the case where a distance between the interconnection lines is relatively small (e.g., the distance TIT2 between the third and fourth interconnection lines MI3a and MI3b), the corresponding tips EN4 and EN5 may have a relatively small curvature.

The first to fourth interconnection lines MI1a, MI1b, MI3a, and MI3b described above may have the same linewidth (i.e., the linewidth W2). Each of the first to fourth interconnection lines MI1a, MI1b, MI3a, and MI3b may extend in the second direction D2 while the linewidth thereof in the first direction D1 is maintained at a constant value or at a substantially constant value (i.e., the linewidth W2). The linewidth W2 of each of the first to fourth interconnection lines MI1a, MI1b, MI3a, and MI3b may decrease at the ends EN1 to EN5 thereof based on the curvature of the ends EN1 to EN5, and the linewidth may not increase at the ends EN1 to EN5.

The second lower interconnection line MI2 may be provided on the second interconnection track MTR2, which may be located between the first and third interconnection tracks MTR1 and MTR3. For example, the second lower interconnection line MI2 may be interposed between the first lower interconnection line MI1 and the third lower interconnection line MI3.

The linewidth W2 of the second lower interconnection line MI2 may be substantially equal to the linewidth W2 of each of the first to fourth interconnection lines MI1a, MI1b, MI3a, and MI3b. A pitch P2 between the first and second lower interconnection lines MI1 and MI2 may be substantially equal to a pitch P2 between the third and second lower interconnection lines MI3 and MI2. The pitch P2 between the first and second lower interconnection lines MI1 and MI2 and the third and second lower interconnection lines MI3 and MI2 may be measured from a center or central portion of the interconnection lines MI1 to MI3, e.g., the first to third interconnection tracks MTR1 to MTR3. A distance SPD1 between the first and second lower interconnection lines MI1 and MI2 may be substantially equal to the distance SPD1 between the third and second lower interconnection lines MI3 and MI2.

The second lower interconnection line MI2 may extend in the second direction D2 while the linewidth thereof is maintained in the first direction D1 at a constant value or at a substantially constant value (i.e., the linewidth W2). In other words, the linewidth in the first direction D1 of the second lower interconnection line MI2 may be uniform along the second direction D2 for the extent of the second lower interconnection line MI2. In greater detail, the second lower interconnection line MI2 may include a first portion PT1 and a second portion PT2. The first portion PT1 may be a portion of the second lower interconnection line MI2 that is located near a region between the first end EN1 of the first interconnection line MI1a and the second end EN2 of the second interconnection line MI1b, or near the first distance TIT1. The second portion PT2 may be another portion of the second lower interconnection line MI2 that is located near a region between the fourth end EN4 of the third interconnection line MI3a and the fifth end EN5 of the fourth interconnection line MI3b, or near the second distance TIT2.

The first portion PT1 may extend in the second direction D2 while the linewidth thereof is maintained at a constant value or at a substantially constant value (i.e., the linewidth W2), even when the first lower interconnection line MI1 is absent in a region of the first interconnection track MTR1 adjacent to the first portion PT1. In other words, even at the first portion PT1 across from the first distance TIT1, the uniform linewidth of the second lower interconnection line MI2 may be maintained.

The second portion PT2 may extend in the second direction D2 while the linewidth thereof is maintained at a constant value or at a substantially constant value (i.e., the linewidth W2), even when the third lower interconnection line MI3 is absent in a region of the third interconnection track MTR3 adjacent to the second portion PT2. In other words, even at the first portion PT2 across from the second distance TIT2, the uniform linewidth of the second lower interconnection line MI2 may be maintained.

Figure 4:
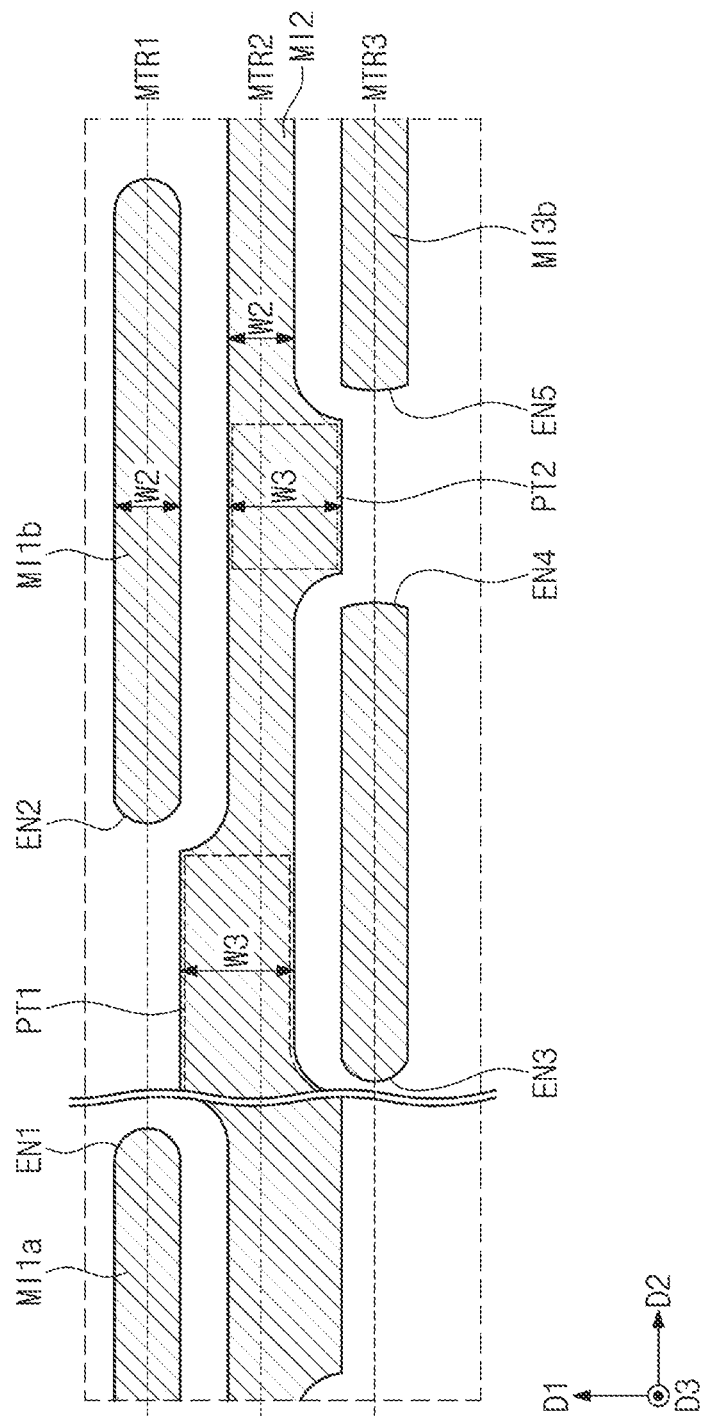
FIG. 4 is a plan view illustrating a structure according to a comparative example of FIG. 3.

FIG. 4 is a plan view illustrating a structure according to a comparative example of FIG. 3. Referring to FIG. 4, the first portion PT1 of the second lower interconnection line MI2 may protrude toward the first interconnection track MTR1. Accordingly, a width W3 of the first portion PT1 of the second lower interconnection line MI2 may be larger or greater than the linewidth W2 of the second lower interconnection line MI2. The second portion PT2 of the second lower interconnection line MI2 may protrude toward the third interconnection track MTR3. Thus, a width W3 of the second portion PT2 of the second lower interconnection line MI2 may be larger than the linewidth W2 of the second lower interconnection line MI2.

In the comparative example of FIG. 4, when lower interconnection lines are formed using a multi-patterning technology (MPT), the second lower interconnection line MI2 may be formed to include portions (e.g., the first and second portions PT1 and PT2) having an abruptly increased linewidth. For example, the first portion PT1 of the second lower interconnection line MI2 may have a shape that extends into an empty region between the first and second interconnection lines MI1a and MI1b. The second portion PT2 of the second lower interconnection line MI2 may have a shape that extends into an empty region between the third and fourth interconnection lines MI3a and MI3b.

Thus, as shown in FIG. 4, the second lower interconnection line MI2 that includes the first and second portions PT1 and PT2 having an increased linewidth may occupy a greater volume or area than is necessary or desired. For example, from a comparison of the second lower interconnection lines MI2 of FIGS. 3 and 4, it can be seen that a volume (or area) of the second lower interconnection line MI2 of FIG. 3 according to some embodiments is smaller than a volume (or area) of the second lower interconnection line MI2 of FIG. 4 of the comparative example. If a size of the second lower interconnection line MI2 is unnecessarily increased by a fabrication process, such as that of FIG. 4, a parasitic capacitance in the first metal layer M1 may be increased, and this may lead to deterioration in electric characteristics of the semiconductor device.

By contrast, in the embodiment of FIG. 3 (i.e., according to some embodiments of the inventive concepts), the first and second portions PT1 and PT2 of the second lower interconnection line MI2 may not be extended into the distances TIT1 and TIT2 and may have a constant linewidth W2 or substantially constant linewidth W2 that is maintained in the first direction D1. Accordingly, it may be possible to maximally reduce a volume or area that is occupied by a metal pattern (i.e., an interconnection line) in the first metal layer M1, and thereby to reduce parasitic capacitance in the first metal layer M1. As a result, the semiconductor device may have improved electric characteristics.

FIGS. 5, 7, 9, 11, 13, 15, 17, and 19 are plan views illustrating a method of fabricating a first metal layer, according to some embodiments of the inventive concepts. FIGS. 6, 8A, 10A, 12A, 14A, 16A, 18A, and 20A are sectional views taken along lines I-I' of FIGS. 5, 7, 9, 11, 13, 15, 17, and 19, respectively. FIGS. 8B, 10B, 12B, 14B, 16B, 18B, and 20B are sectional views taken along lines II-II' of FIGS. 7, 9, 11, 13, 15, 17, and 19, respectively.

Figure 5:
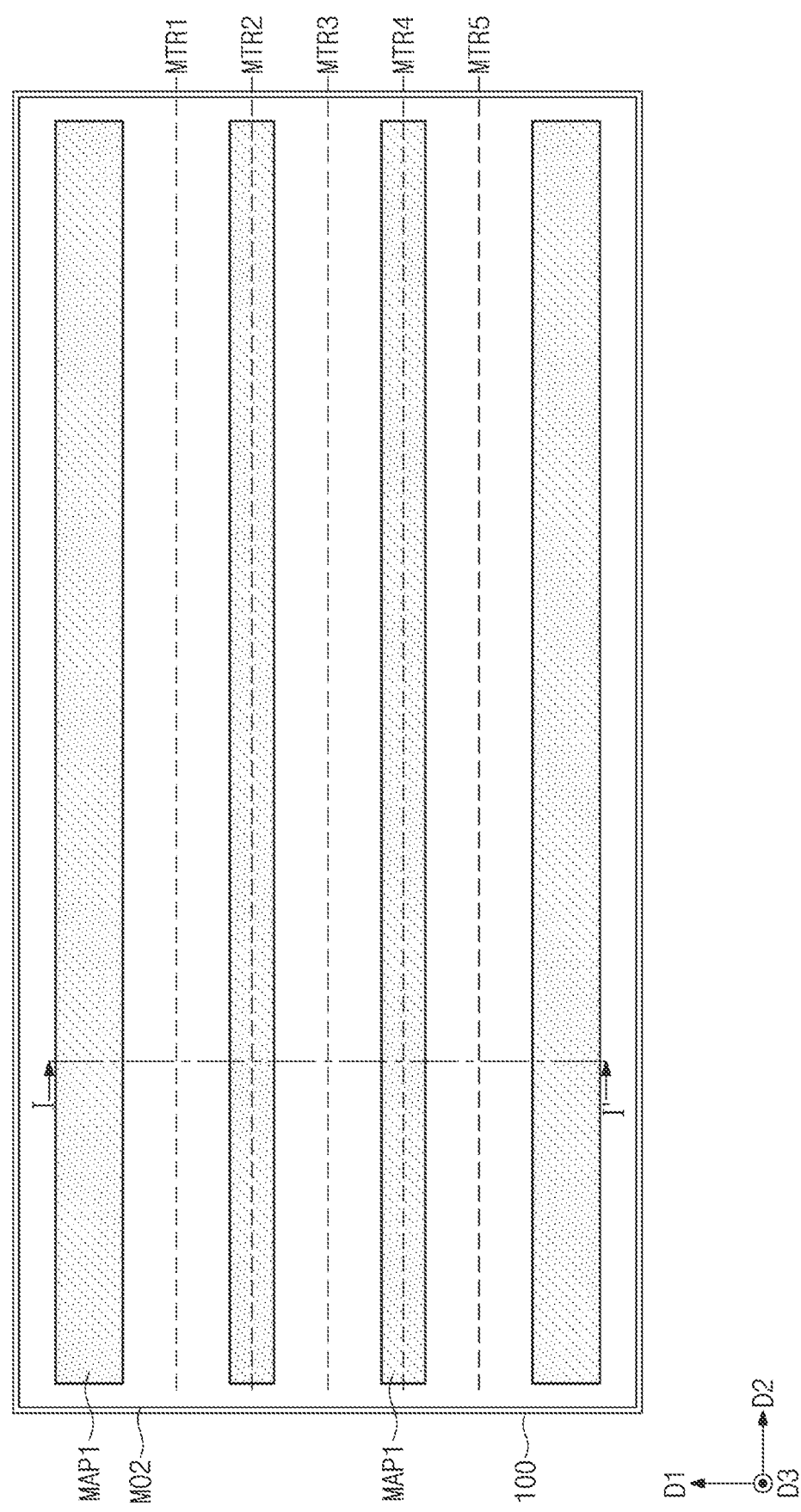
FIGS. 5, 7, 9, 11, 13, 15, 17, and 19 are plan views illustrating a method of fabricating a first metal layer, according to some embodiments of the inventive concepts.
Figure 6:
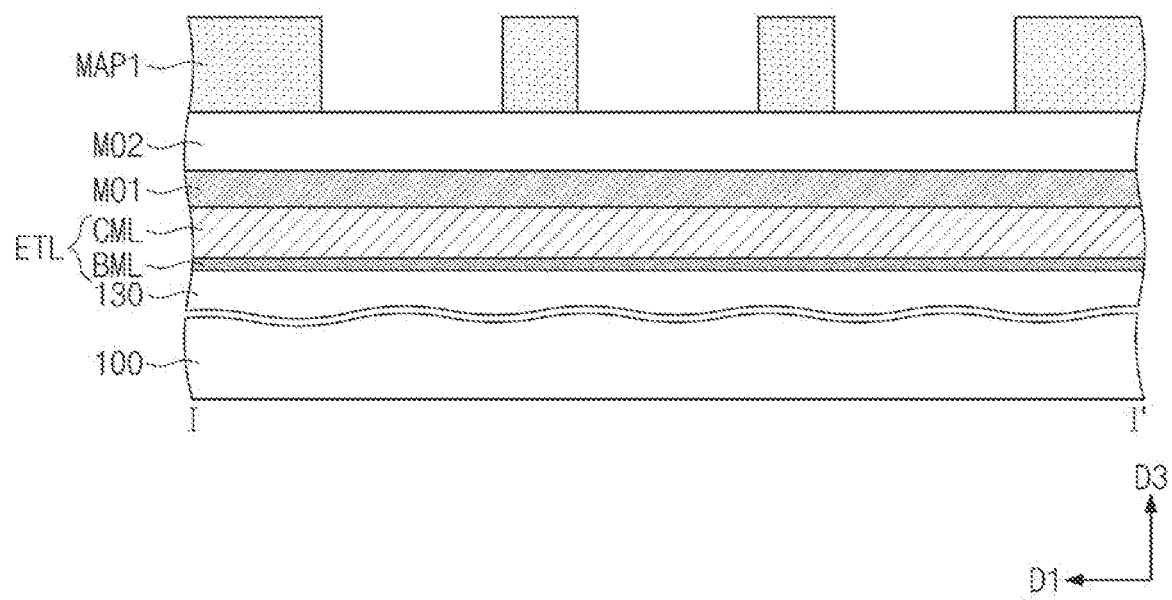
FIGS. 6, 8A, 10A, 12A, 14A, 16A, 18A, and 20A are sectional views taken along lines I-I' of FIGS. 5, 7, 9, 11, 13, 15, 17, and 19, respectively.

Referring to FIGS. 5 and 6, the logic transistors previously described with reference to FIGS. 1 and 2A to 2D may be formed on the substrate 100. The third interlayer insulating layer 130 may be formed on the logic transistors. An etch target layer ETL may be formed on the third interlayer insulating layer 130. The etch target layer ETL may include a barrier layer BML and a metal layer CIVIL, which may be sequentially stacked. The barrier layer BML may be formed of or include at least one of tantalum nitride (TaN), titanium nitride (TiN), tantalum oxide (TaO), titanium oxide (TiO), manganese nitride (MnN), or manganese oxide (MnO). The metal layer CIVIL may be formed of or may include at least one metallic material (e.g., copper (Cu), aluminum (Al), ruthenium (Ru), cobalt (Co), tungsten (W), and molybdenum (Mo)). A first mold layer MO1 and a second mold layer MO2 may be sequentially formed on the etch target layer ETL.

First line patterns MAP1 may be formed on the second mold layer MO2. The first line patterns MAP1 may extend in the second direction D2 and may be parallel to each other. Each of the first line patterns MAP1 may serve as a mandrel in a multi-patterning technology according to some embodiments.

In detail, the first and fourth ones of the first line patterns MAP1 may be formed at positions corresponding to the first and second power lines MPR1 and MPR2 previously described with reference to FIG. 1. The second and third ones of the first line patterns MAP1 may be formed on the second and fourth interconnection tracks MTR2 and MTR4, respectively. The first to fourth ones of the first line patterns MAP1 may have different widths in the first direction D1.

Figure 7:
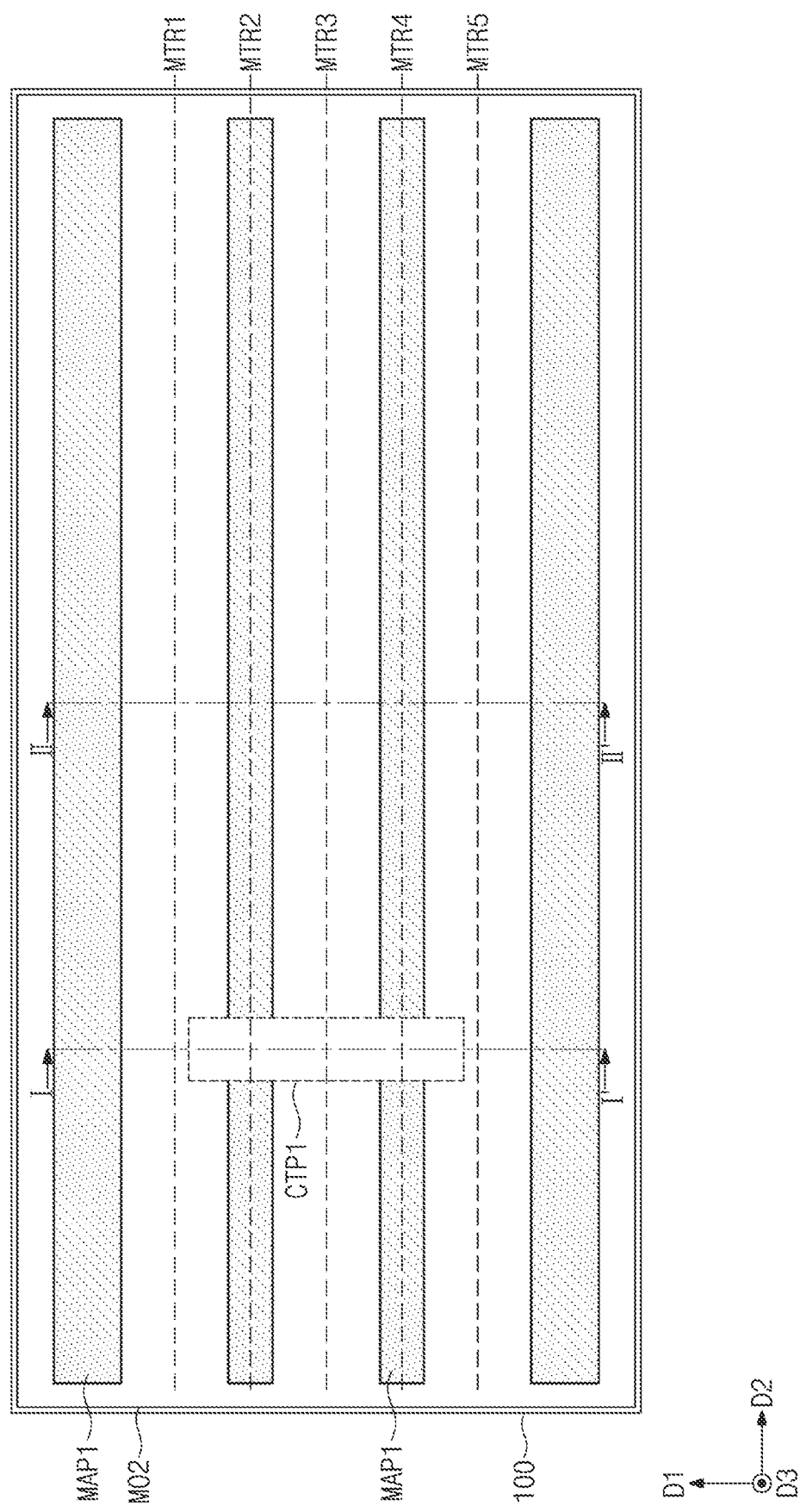
Figure 8A:
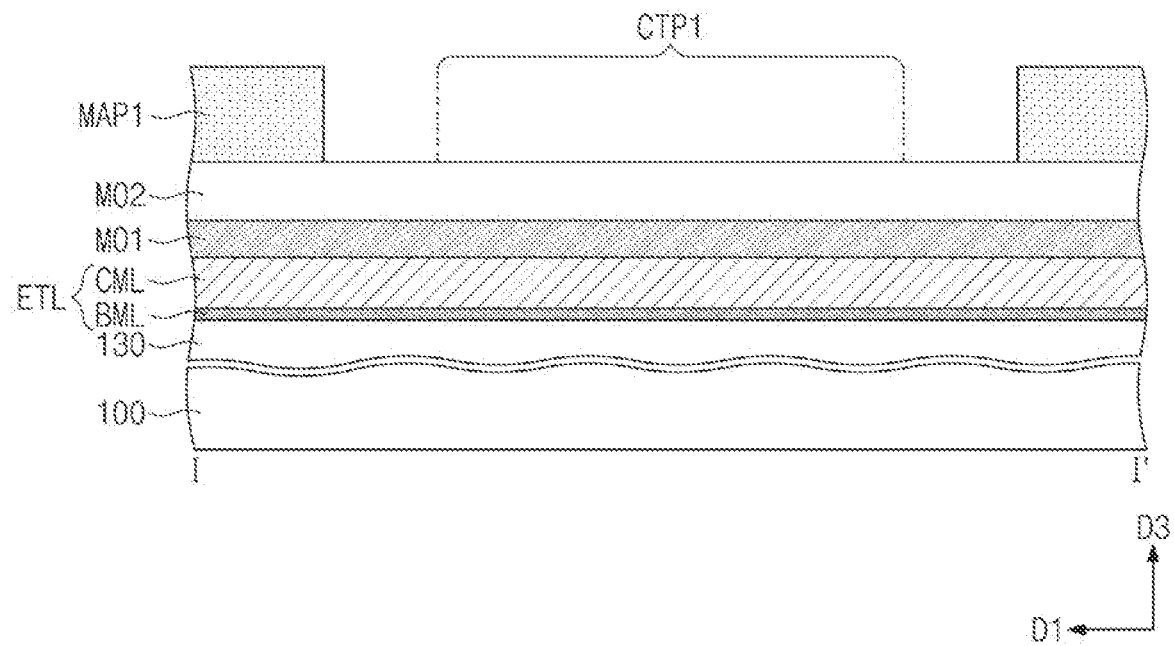
Figure 8B:
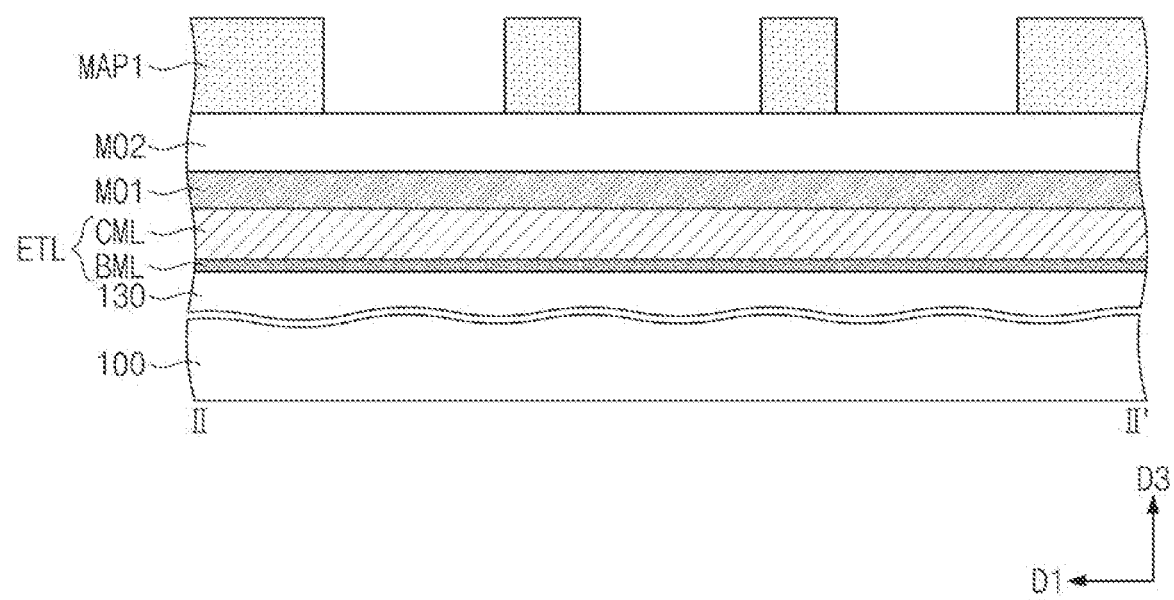
FIGS. 8B, 10B, 12B, 14B, 16B, 18B, and 20B are sectional views taken along lines II-II' of FIGS. 7, 9, 11, 13, 15, 17, and 19, respectively.

Referring to FIGS. 7, 8A, and 8B, the first line patterns MAP1 may be removed from a first cutting region CTP1 by an etching process. For example, although not shown, a mask pattern defining the first cutting region CTP1 may be formed by a photolithography process, and then, the first line patterns MAP1 may be etched using the mask pattern as an etch mask.

The first line pattern MAP1 on the second interconnection track MTR2 may be divided into a pair of the first line patterns MAP1 by the first cutting region CTP1. The first line pattern MAP1 on the fourth interconnection track MTR4 may be divided into a pair of the first line patterns MAP1 by the first cutting region CTP1.

Figure 9:
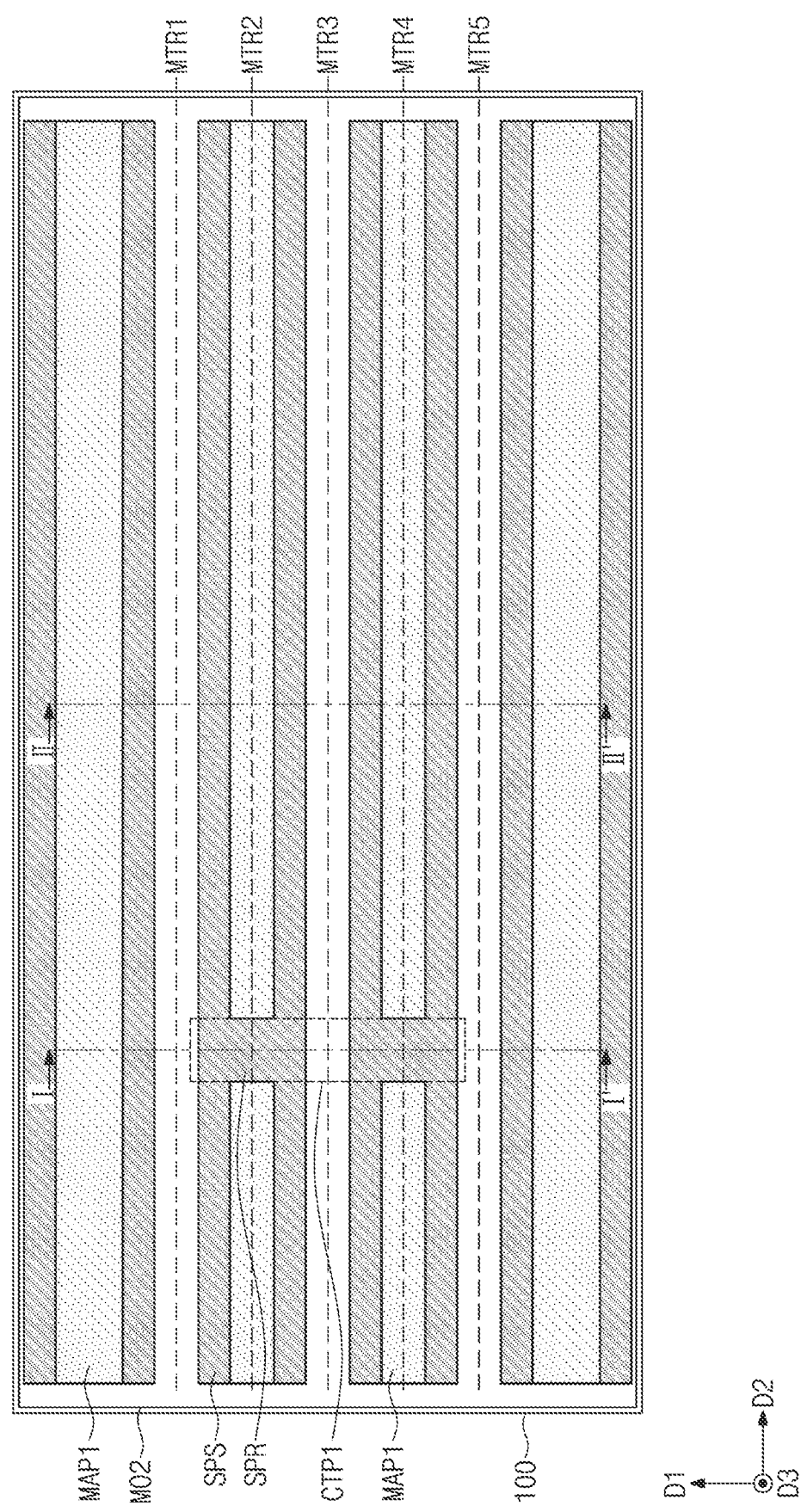
Figure 10A:
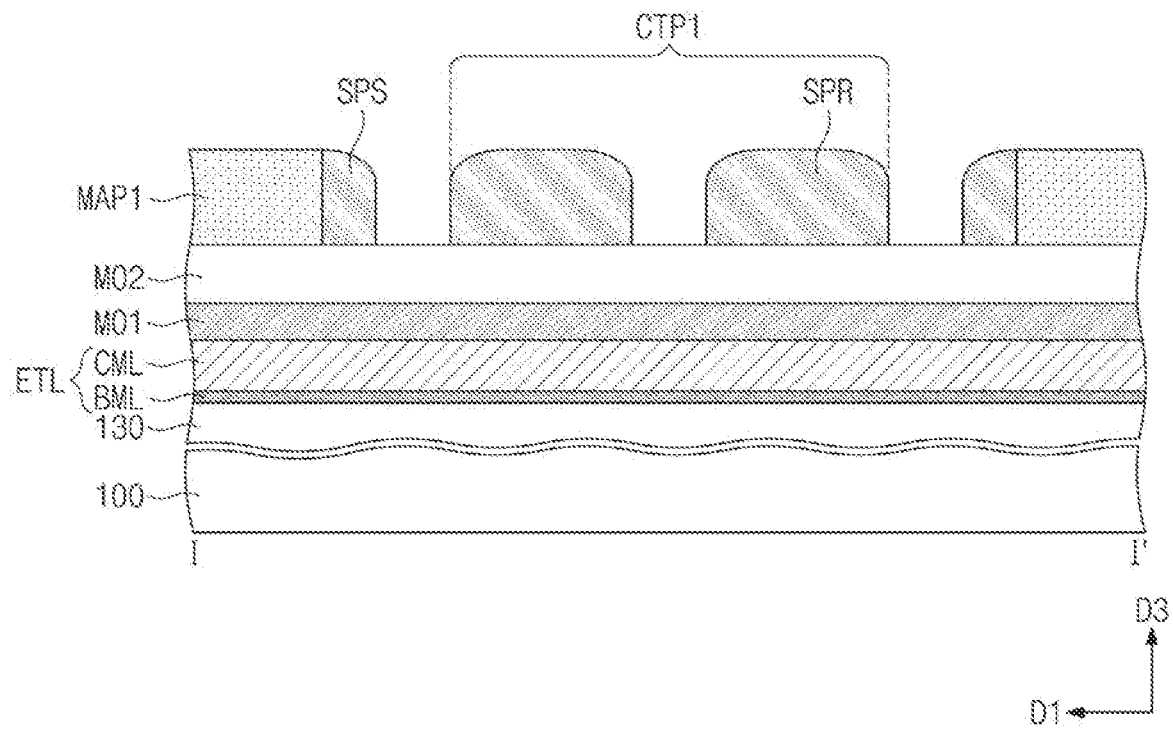
Figure 10B:
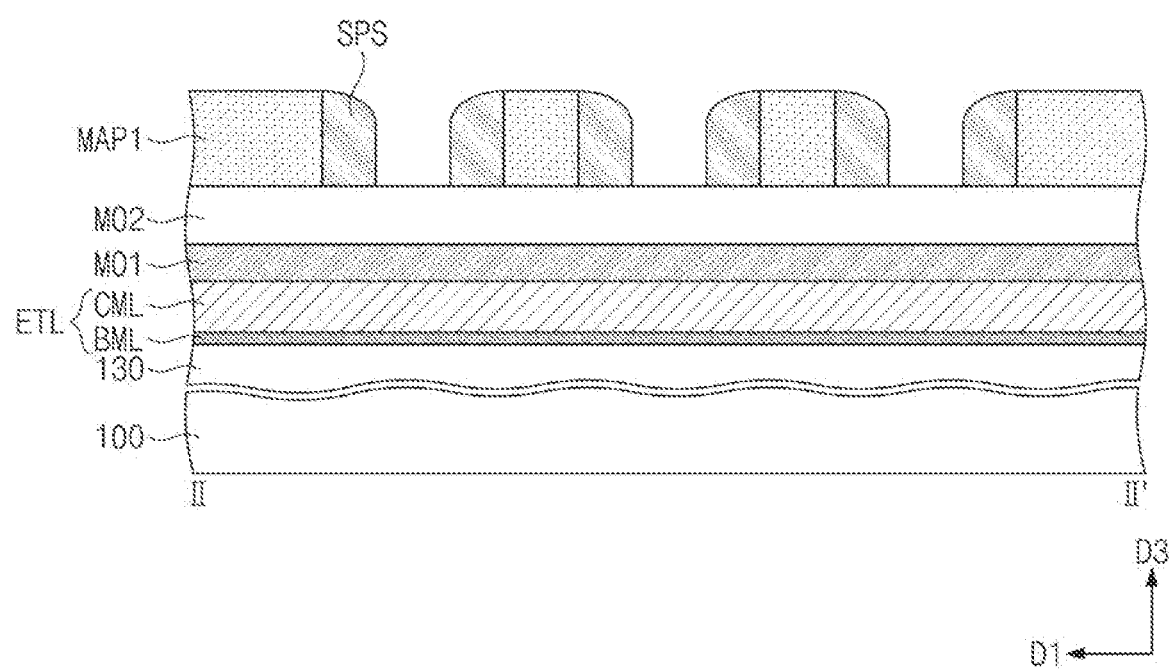

Referring to FIGS. 9, 10A, and 10B, spacers SPS may be formed on the first line patterns MAP1. The spacer SPS may be formed on a side surface of each of the first line patterns MAP1. When viewed in a plan view, each of the spacers SPS may be a line-shaped pattern that extends along the first line pattern MAP1 in the second direction D2.

In greater detail, the formation of the spacers SPS may include forming a spacer layer on the first line patterns MAP1 and anisotropically etching the spacer layer to expose top surfaces of the first line patterns MAP1 or a top surface of the second mold layer MO2.

The spacers SPS may be connected to each other in the first cutting region CTP1 and in some embodiments may fill the area between the pairs of the first line patterns MAP1 in the first cutting region CTP1. For example, the spacer SPS may include a connecting portion SPR filling the first cutting region CTP1.

Figure 11:
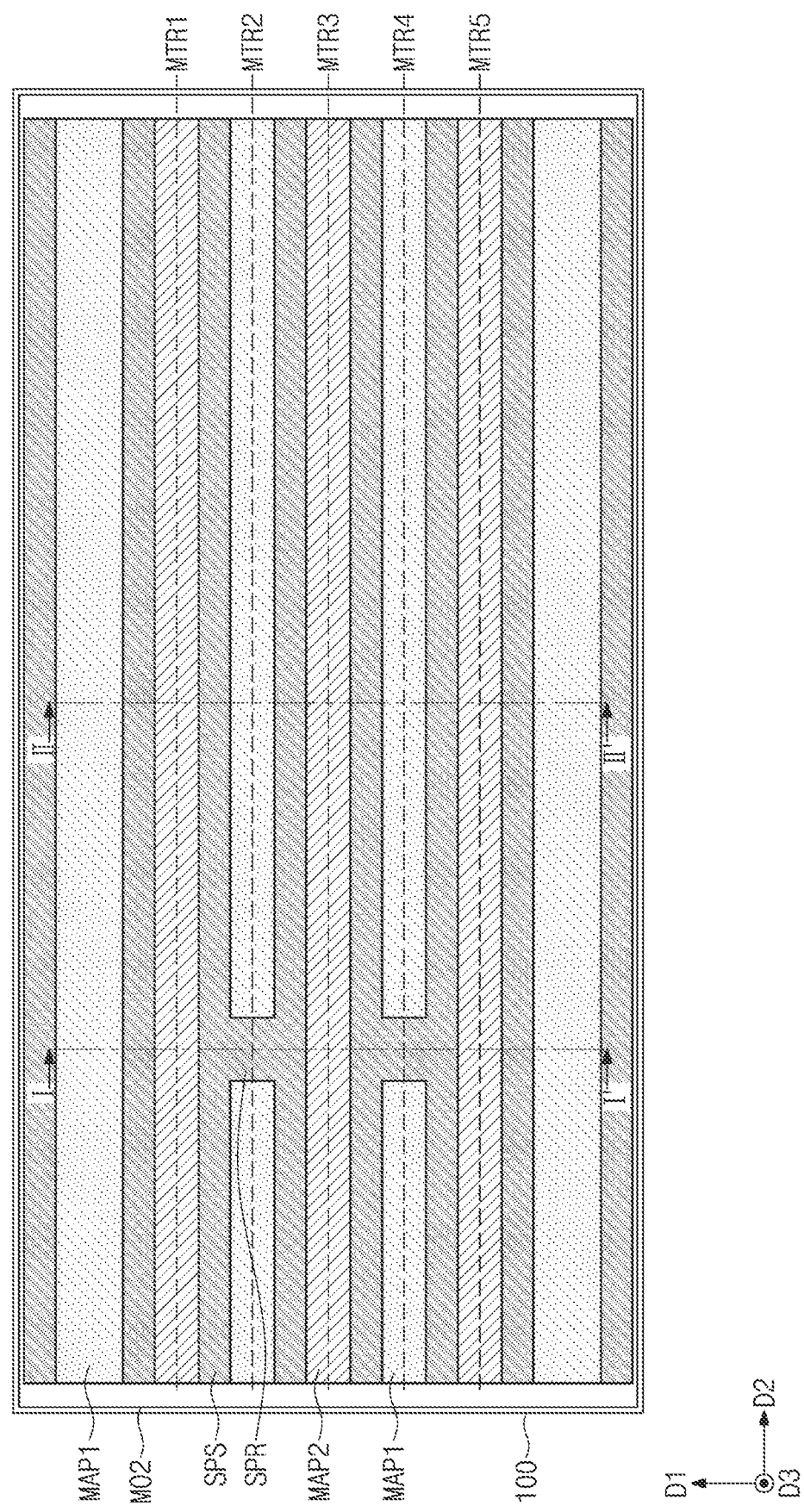
Figure 12A:
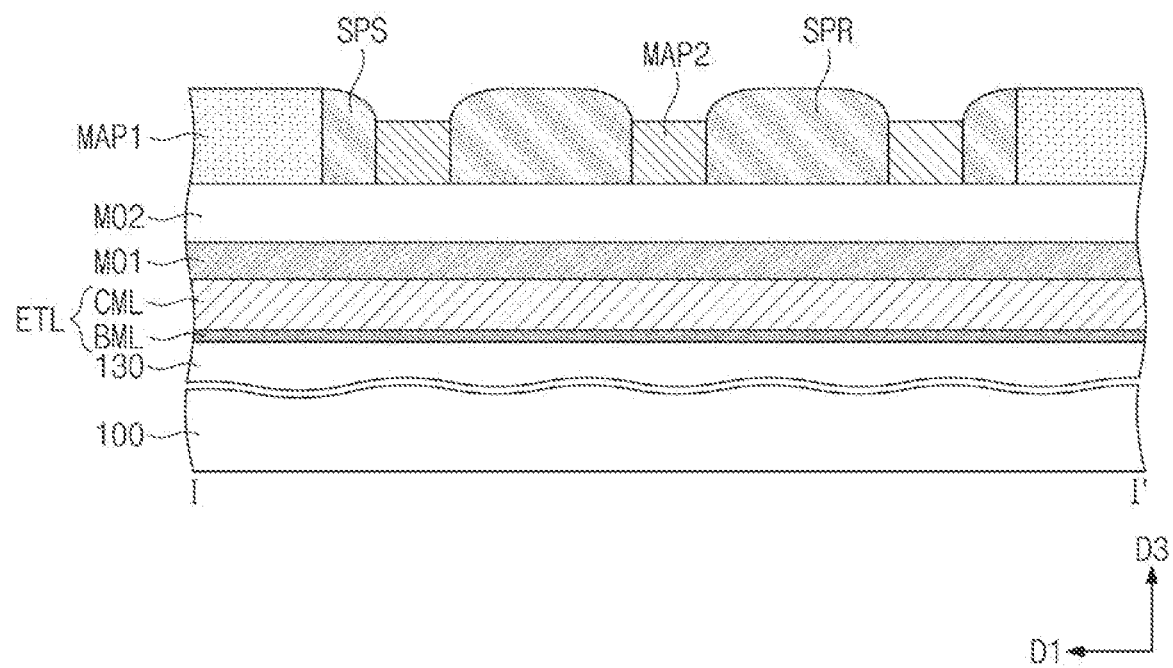
Figure 12B:
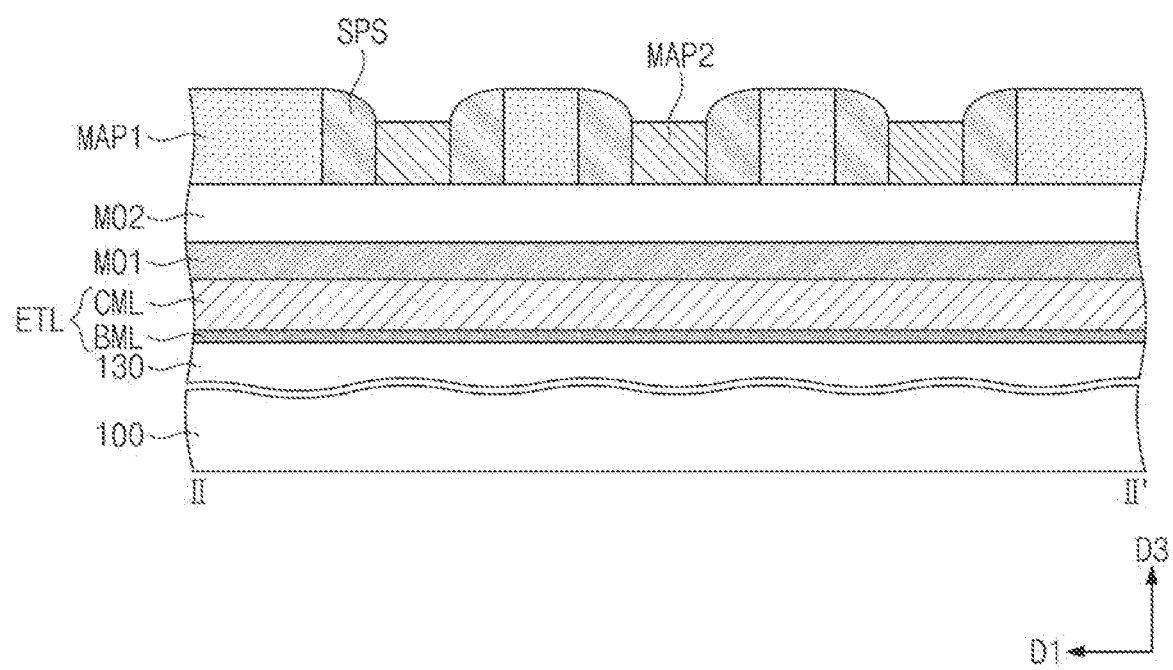

Referring to FIGS. 11, 12A, and 12B, second line patterns MAP2 may be formed on the second mold layer MO2 to fill empty spaces between the spacers SPS, respectively. The second line patterns MAP2 may extend in the second direction D2 and may be parallel to each other. The first one of the second line patterns MAP2, the second one of the second line patterns MAP2, and the third one of the second line patterns MAP2 may be formed on the first interconnection track MTR1, the third interconnection track MTR3, and the fifth interconnection track MTR5, respectively.

In greater detail, the formation of the second line patterns MAP2 may include forming an insulating layer on the second mold layer MO2 and recessing the insulating layer to expose upper portions of the spacers SPS (e.g., in an etch-back manner).

According to some embodiments, the first line patterns MAP1 may be formed to have a line shape, without any substantial change of or substantial deviation along the second direction D2 in the linewidth thereof in the first direction D1. By using the first line patterns MAP1 as a mandrel, the second line patterns MAP2 may be formed in a line shape, without any substantial change or substantial deviation along the second direction D2 in the linewidth of the second line patterns MAP2 in the first direction D1.

Figure 13:
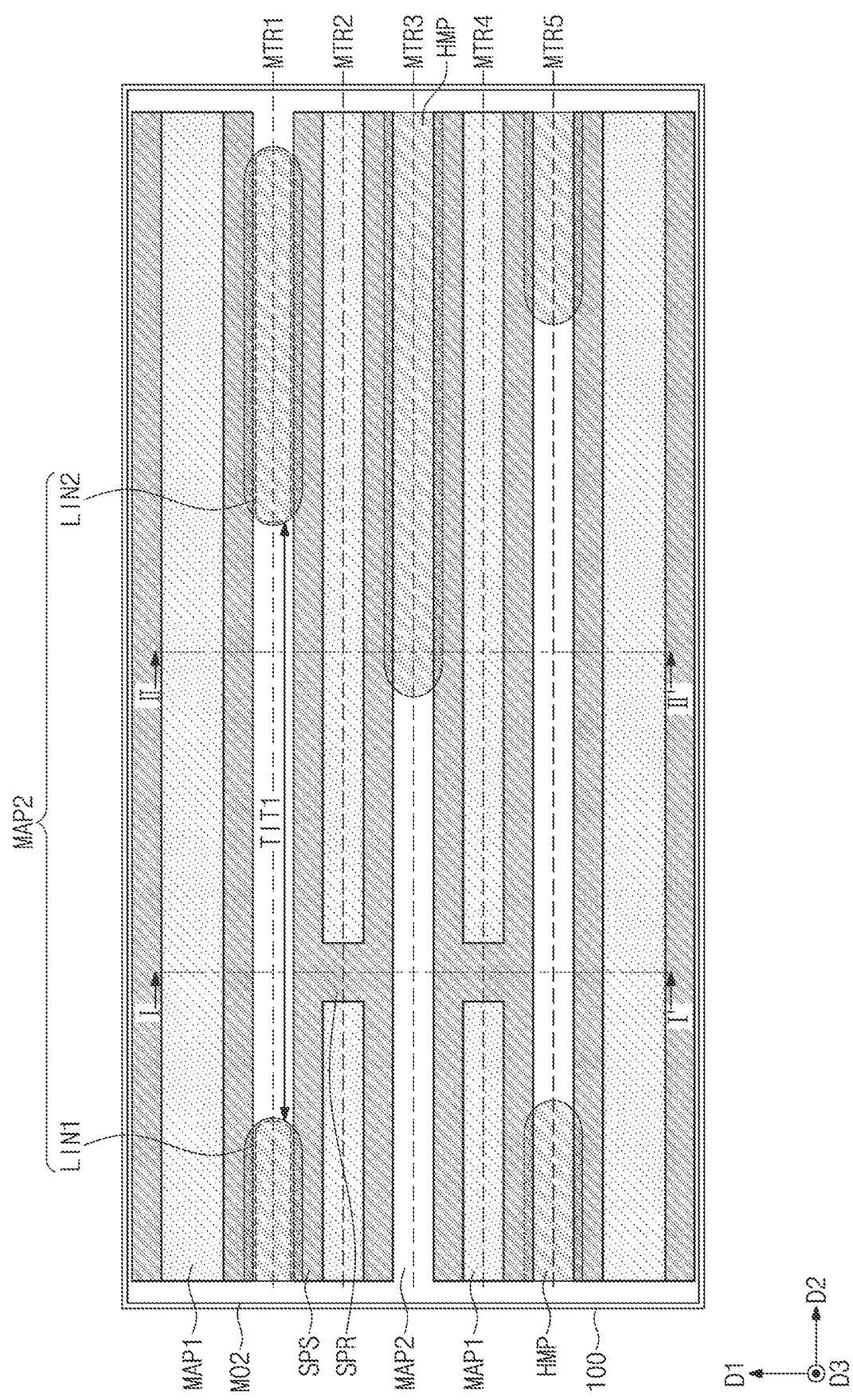
Figure 14A:
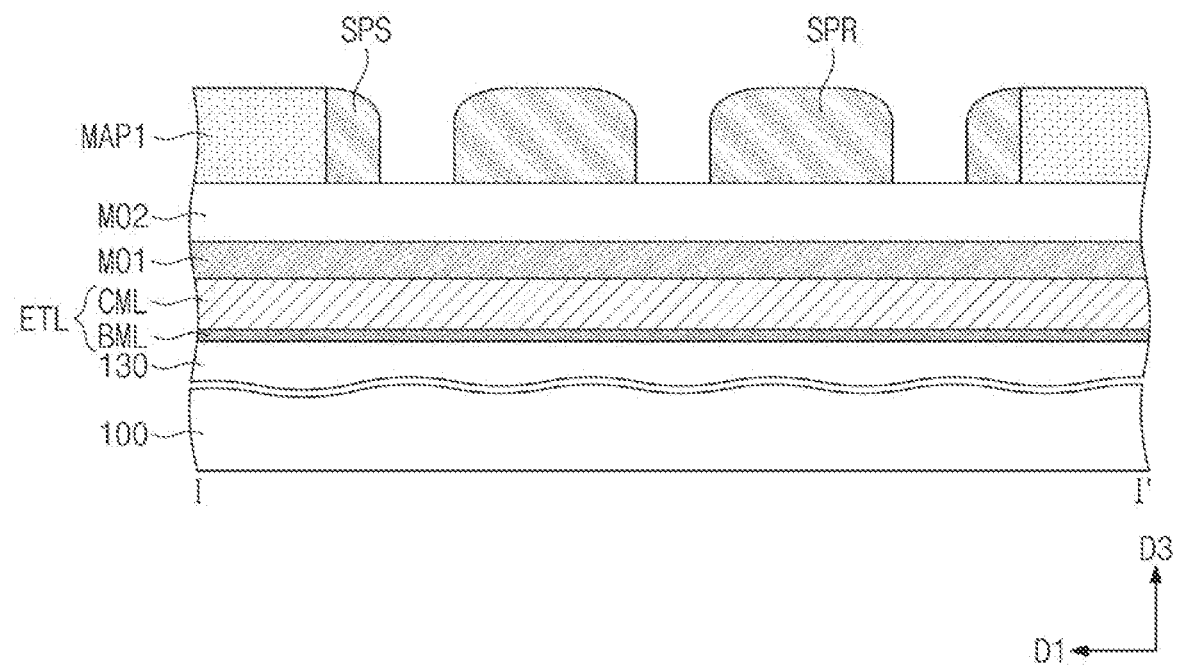
Figure 14B:
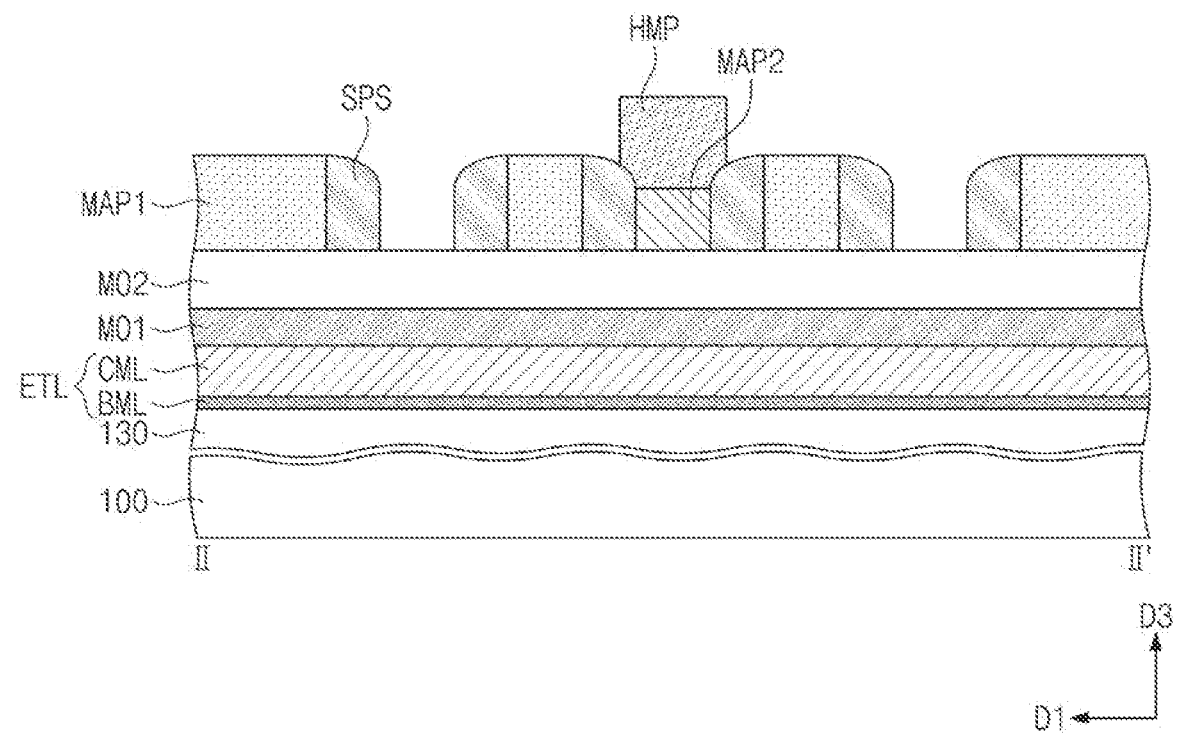

Referring to FIGS. 13, 14A, and 14B, hard mask patterns HMP may be formed on the second line patterns MAP2. The hard mask patterns HMP may be formed through a first photolithography process. The second line patterns MAP2 may be selectively etched using the hard mask patterns HMP as an etch mask. The etching process may be performed using an anisotropic etching process. The second line patterns MAP2 below the hard mask patterns HMP may not be removed during the etching process, because they are protected by the hard mask patterns HMP.

In greater detail, a first line LIN1 and a second line LIN2 may be formed from the first one of the second line patterns MAP2 (i.e., the second line pattern MAP2 on the first interconnection track MTR1) through the first photolithography process. The first line LIN1 and the second line LIN2 may correspond to the first and second interconnection lines MI1$a$ and MI1$b$, respectively, described with reference to FIG. 3. In other words, the first line LIN1 and the second line LIN2 may be spaced apart from each other in the second direction D2 by the first distance TIT1. The first line LIN1 and the second line LIN2, which are spaced apart from each other by a relatively large distance, may be formed through the hard mask patterns HMP.

Due to the planar shape of the hard mask pattern HMP, a first end of the first line LIN1 and a second end of the second line LIN2 may be formed to have a relatively large curvature. This may be substantially the same as the first end EN1 of the first interconnection line MI1$a$ and the second end EN2 of the second interconnection line MI1$b$, previously described with reference to FIG. 3.

Figure 15:
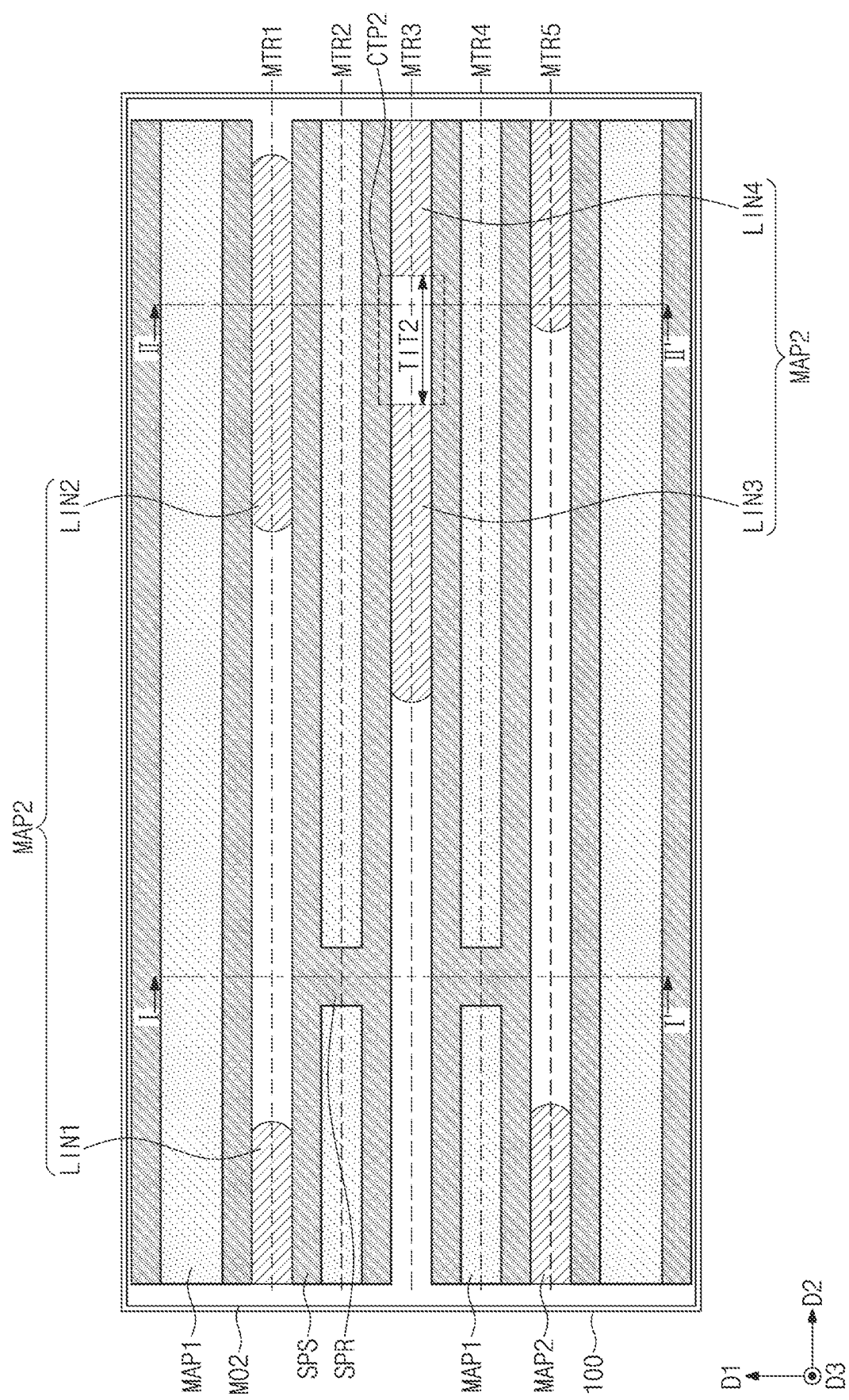
Figure 16A:
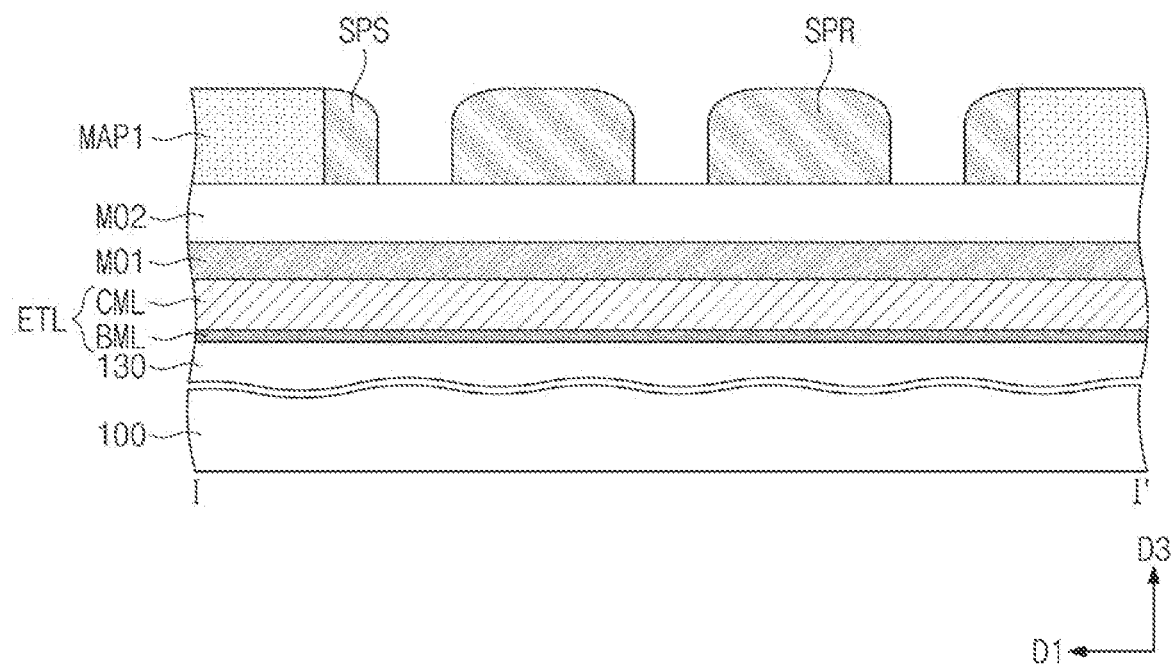
Figure 16B:
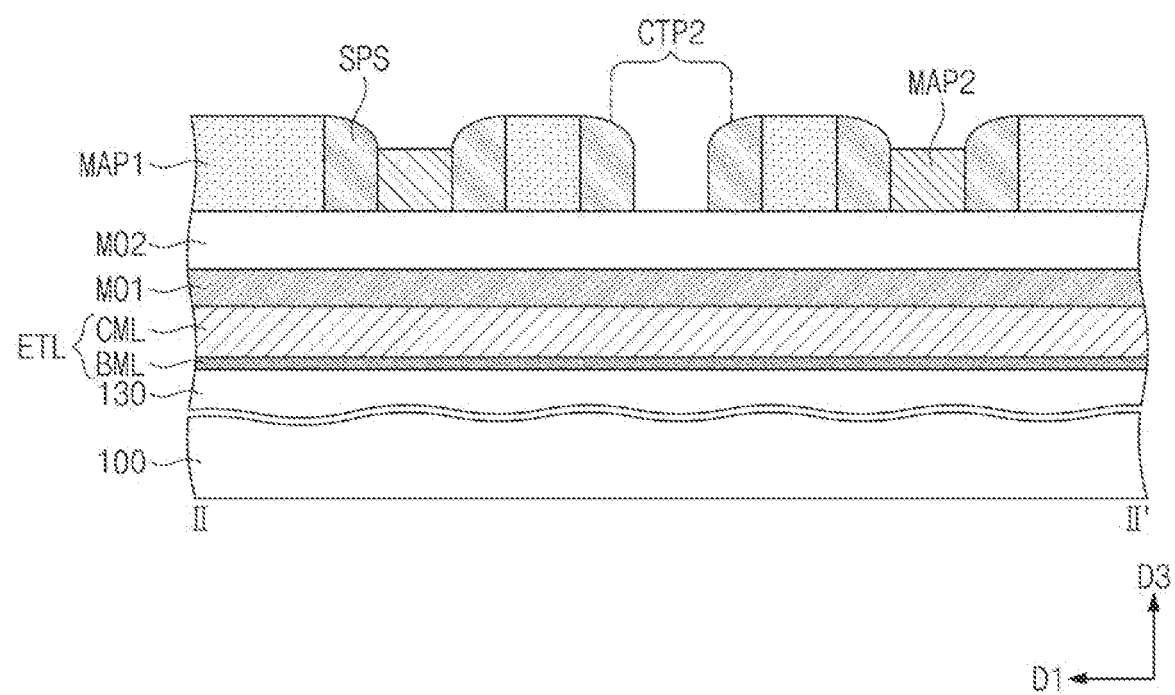

Referring to FIGS. 15, 16A, and 16B, the second line pattern MAP2 may be removed from a second cutting region CTP2 by an etching process. For example, although not shown, a mask pattern defining the second cutting region CTP2 may be formed by a second photolithography process, and then, the second line pattern MAP2 may be etched using the mask pattern as an etch mask.

In greater detail, a third line LIN3 and a fourth line LIN4 may be formed from the second one of the second line patterns MAP2 (i.e., the second line pattern MAP2 on the third interconnection track MTR3) through the second photolithography process. The third line LIN3 and the fourth line LIN4 may correspond to the third and fourth interconnection lines MI3$a$ and MI3$b$, respectively, described with reference to FIG. 3. In other words, the third line LIN3 and the fourth line LIN4 may be spaced apart from each other in the second direction D2 by the second distance TIT2. The third line LIN3 and the fourth line LIN4, which are spaced apart from each other by a relatively small distance, may be formed through the second cutting region CTP2.

Due to the planar shape of the second cutting region CTP2, a third end of the third line LIN3 and a fourth end of the fourth line LIN4 may be formed to have a relatively small curvature. This may be substantially the same as the fourth end EN4 of the third interconnection line MI3$a$ and the fifth end EN5 of the fourth interconnection line MI3$b$, previously described with reference to FIG. 3.

Figure 17:
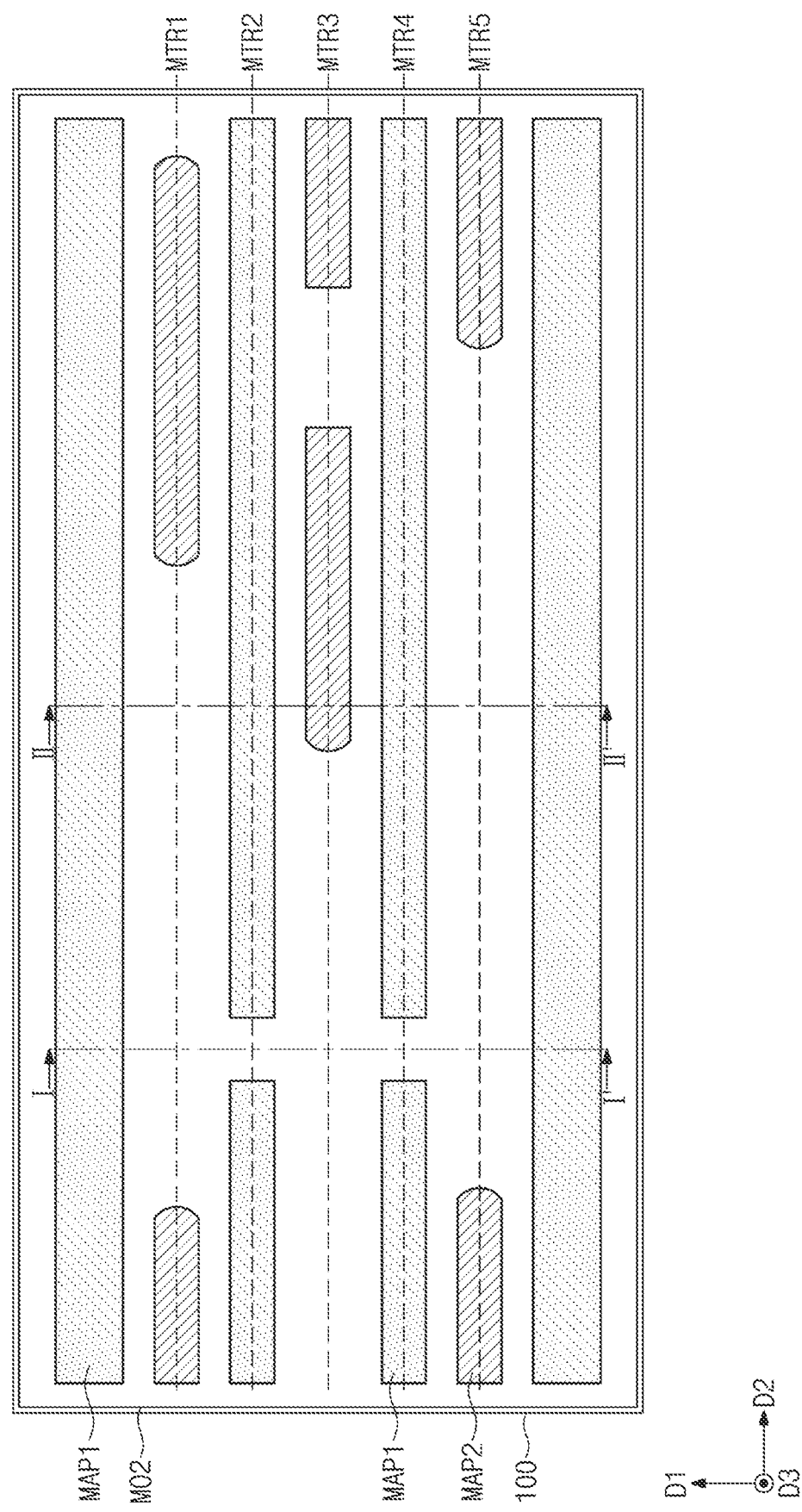
Figure 18A:
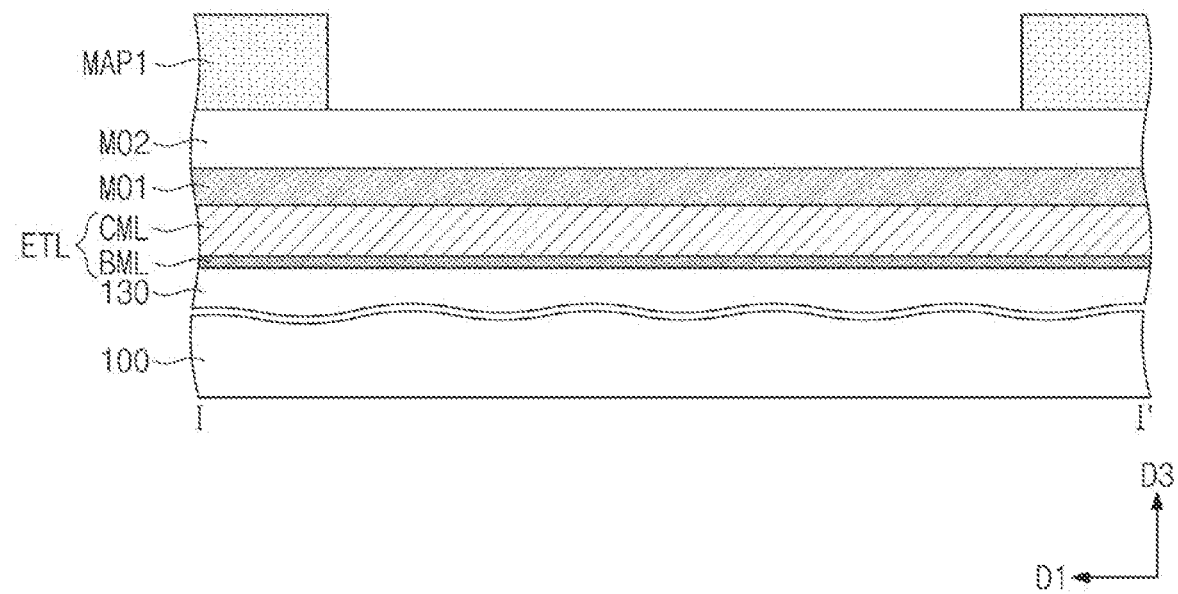
Figure 18B:
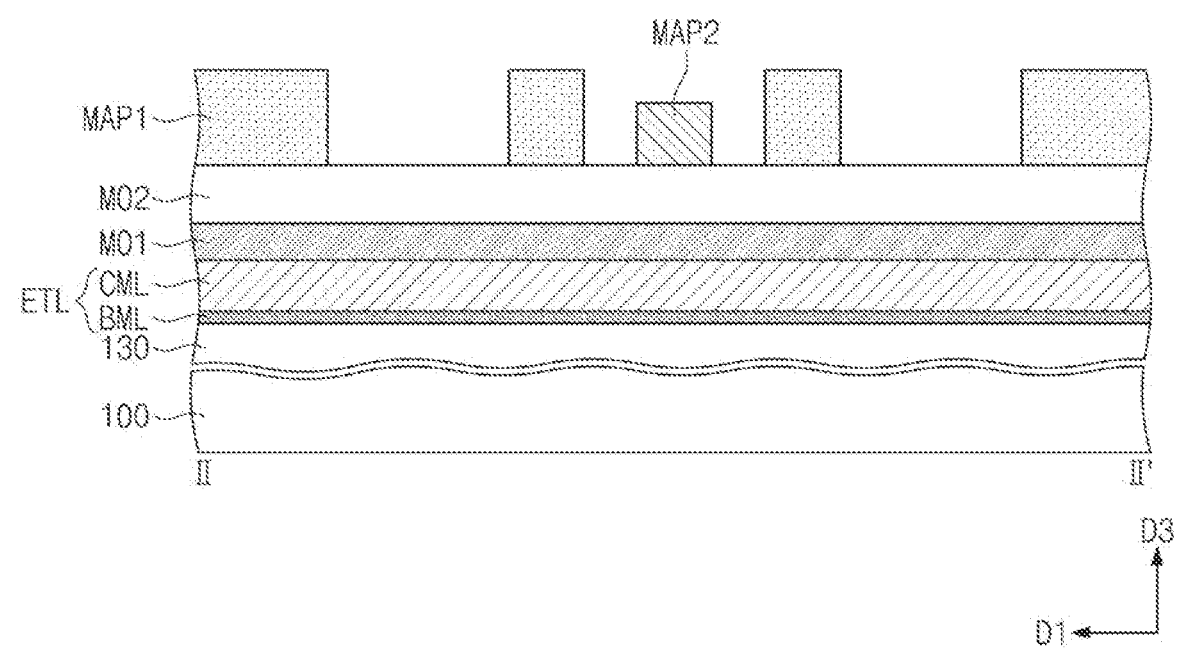

Referring to FIGS. 17, 18A, and 18B, the spacers SPS may be selectively removed. Accordingly, only the first and second line patterns MAP1 and MAP2 may be left on the second mold layer MO2.

Figure 19:
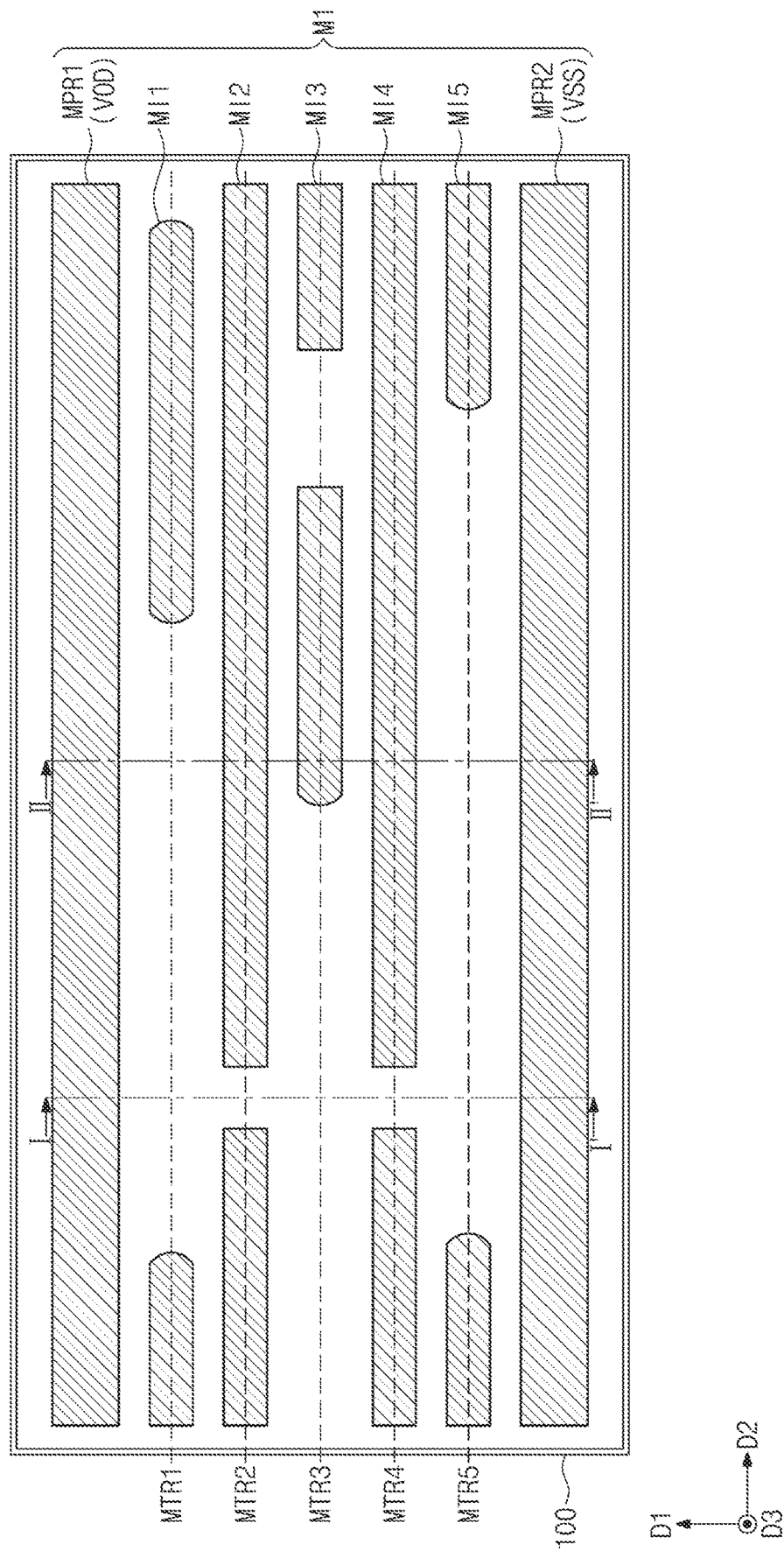
Figure 20A:
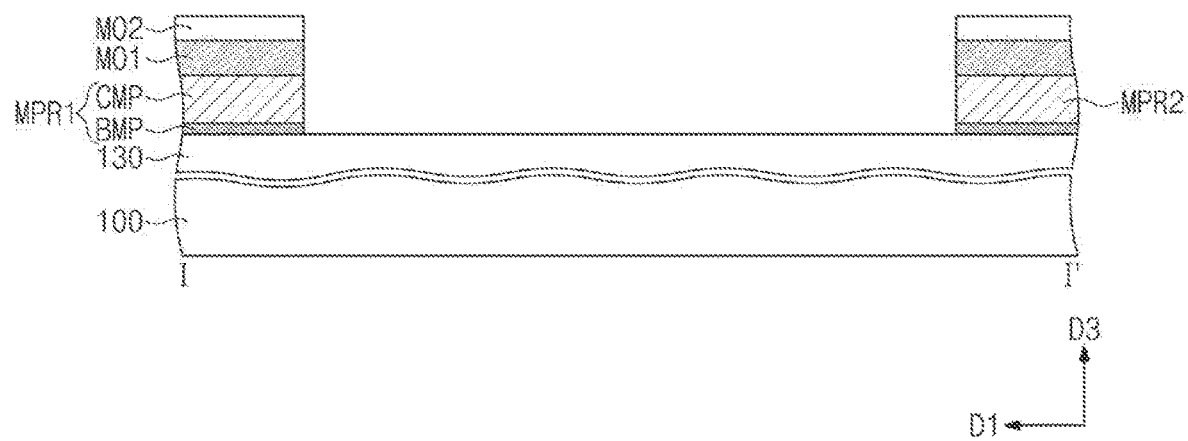
Figure 20B:
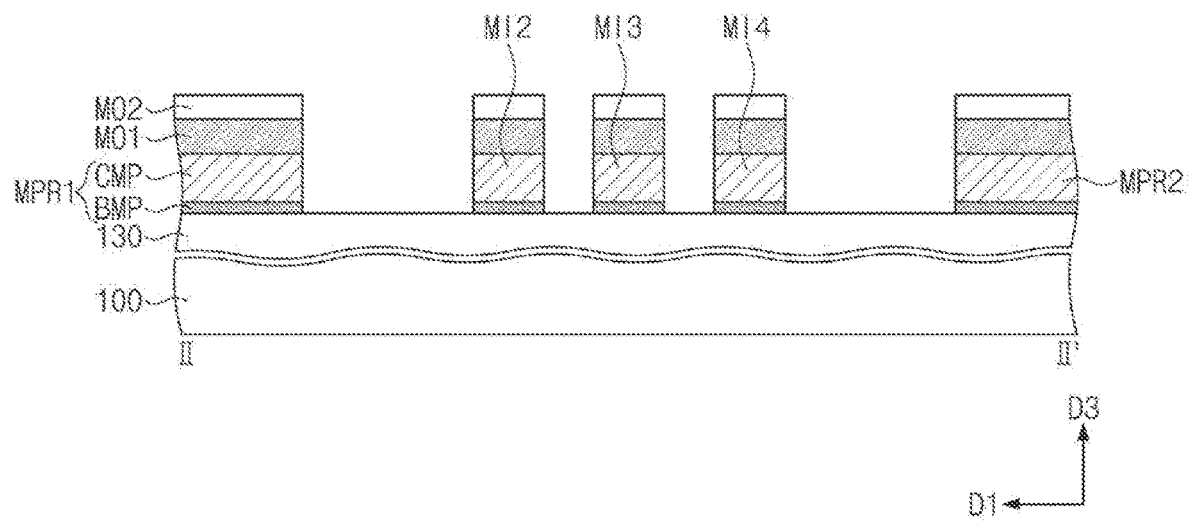

Referring to FIGS. 19, 20A, and 20B, the first and second mold layers MO1 and MO2 may be patterned using the first and second line patterns MAP1 and MAP2 as an etch mask. Next, the etch target layer ETL may be patterned using the patterned first and second mold layers MO1 and MO2 as an etch mask. Accordingly, the interconnection lines MPR1, MPR2, and MI1 to MI5 of the first metal layer M1 may be formed on the third interlayer insulating layer 130.

Each of the interconnection lines MPR1, MPR2, and MI1 to MI5 may include a barrier pattern BMP and a metal pattern CMP. The barrier pattern BMP may cover a bottom surface of the metal pattern CMP. In some embodiments, the interconnection lines MPR1, MPR2, and MI1 to MI5 may be formed by a subtractive process of etching the etch target layer ETL.

FIGS. 21, 23, 25, 27, 29, and 31 are plan views illustrating a method of fabricating a first metal layer, according to some embodiments of the inventive concepts. FIGS. 22A, 24A, 26A, 28A, 30A, and 32A are sectional views taken along lines I-I' of FIGS. 21, 23, 25, 27, 29, and 31, respectively. FIGS. 22B, 24B, 26B, 28B, 30B, and 32B are sectional views taken along lines II-II' of FIGS. 21, 23, 25, 27, 29, and 31, respectively. For concise description, elements previously described with reference to FIGS. 5 to 20B may be identified by previously-used reference numbers, and an overlapping description thereof may be omitted.

The etch target layer ETL according to some embodiments may be the third interlayer insulating layer 130. In other words, the barrier layer BML and the metal layer CIVIL may be omitted, unlike the afore-described embodiment. In the fabrication method according to some embodiments, the interconnection lines may be formed by a damascene process of filling a concave region of an interlayer insulating layer with a metal layer, not by a subtractive process of etching the metal layer.

Figure 21:
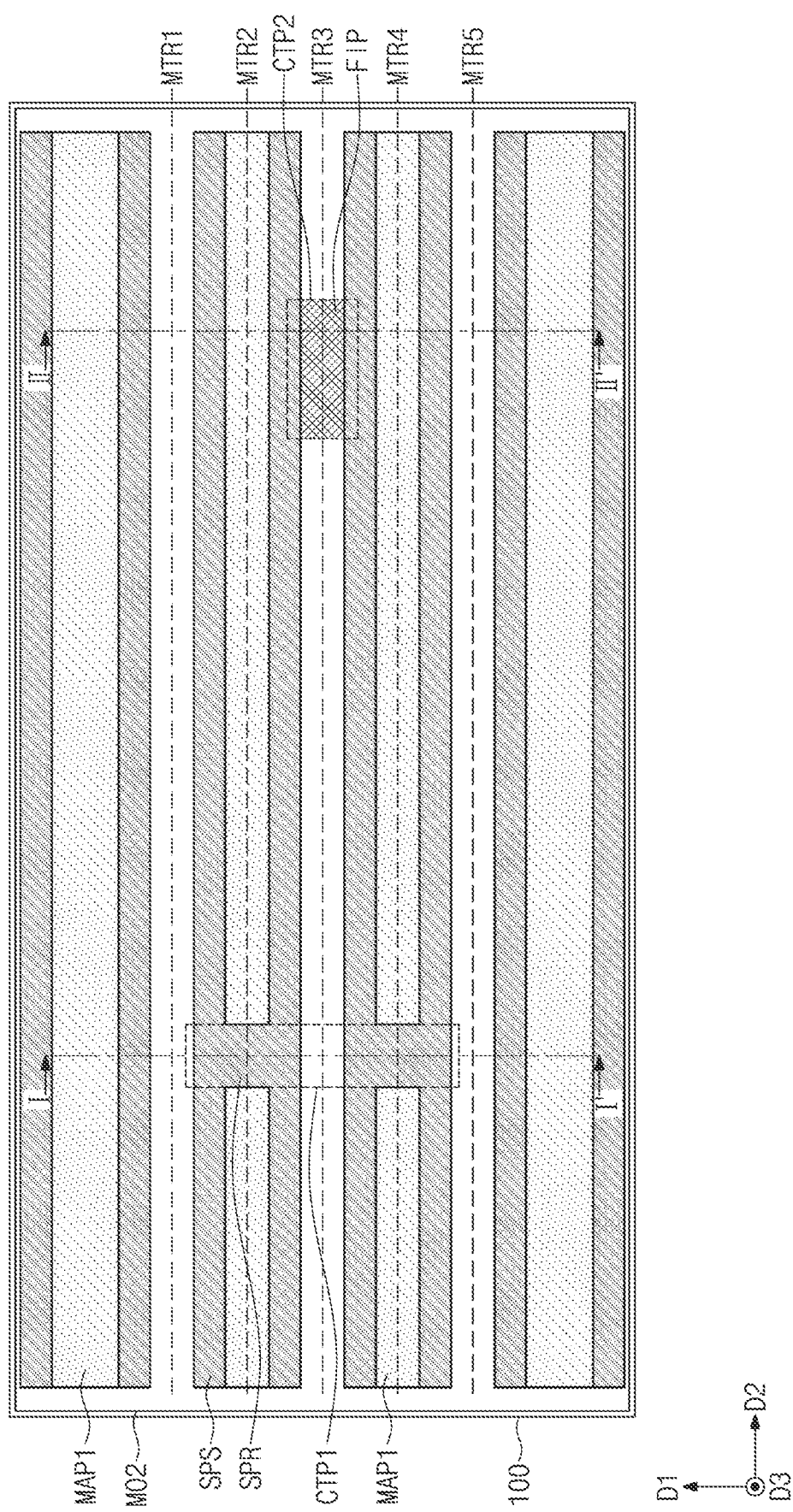
FIGS. 21, 23, 25, 27, 29, and 31 are plan views illustrating a method of fabricating a first metal layer, according to some embodiments of the inventive concepts.
Figure 22A:
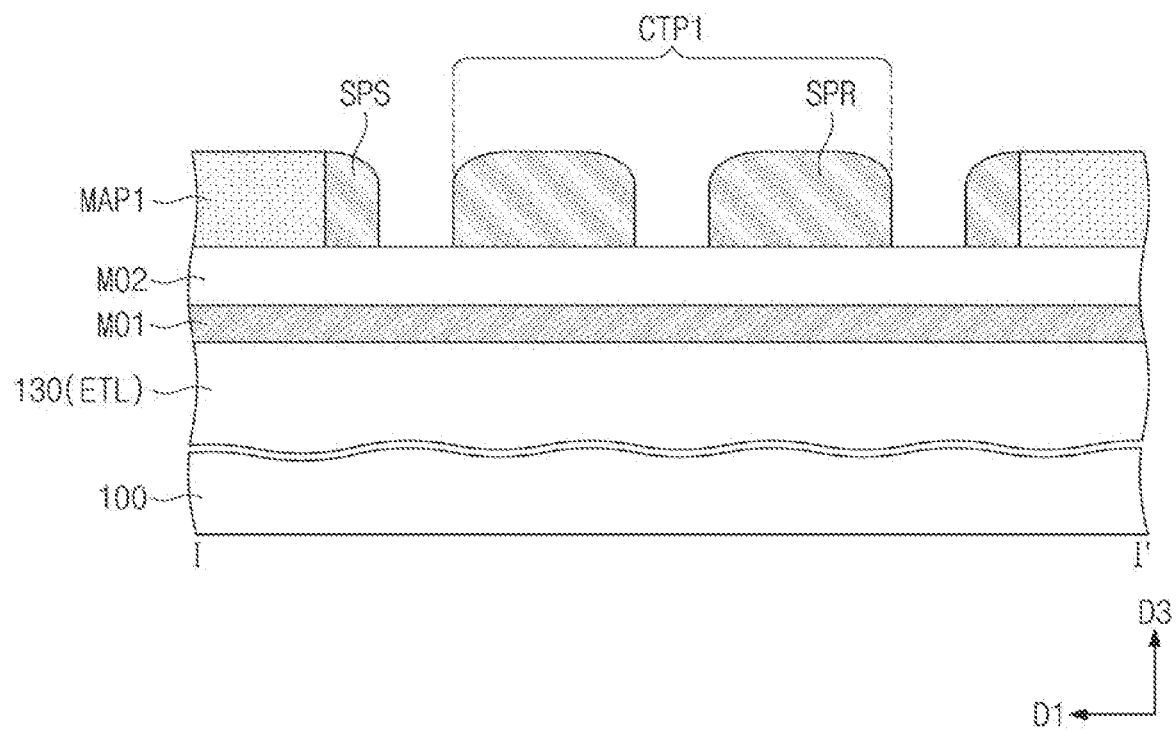
FIGS. 22A, 24A, 26A, 28A, 30A, and 32A are sectional views taken along lines I-I' of FIGS. 21, 23, 25, 27, 29, and 31, respectively.
Figure 22B:
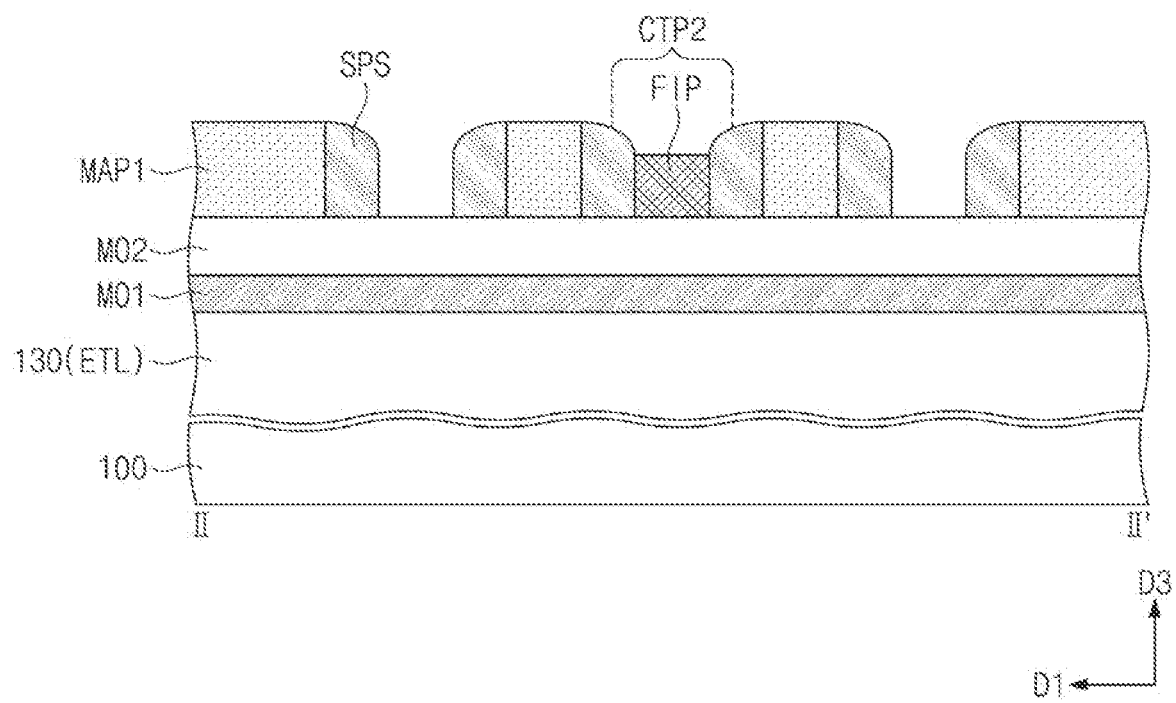
FIGS. 22B, 24B, 26B, 28B, 30B, and 32B are sectional views taken along lines II-II' of FIGS. 21, 23, 25, 27, 29, and 31, respectively.

Referring to FIGS. 21, 22A, and 22B, a filling pattern FIP may be formed on the resulting structure of FIGS. 9, 10A, and 10B. The filling pattern FIP may be formed in the second cutting region CTP2. The filling pattern FIP may be formed in a space between adjacent ones of the spacers SPS, in the second cutting region CTP2.

Figure 23:
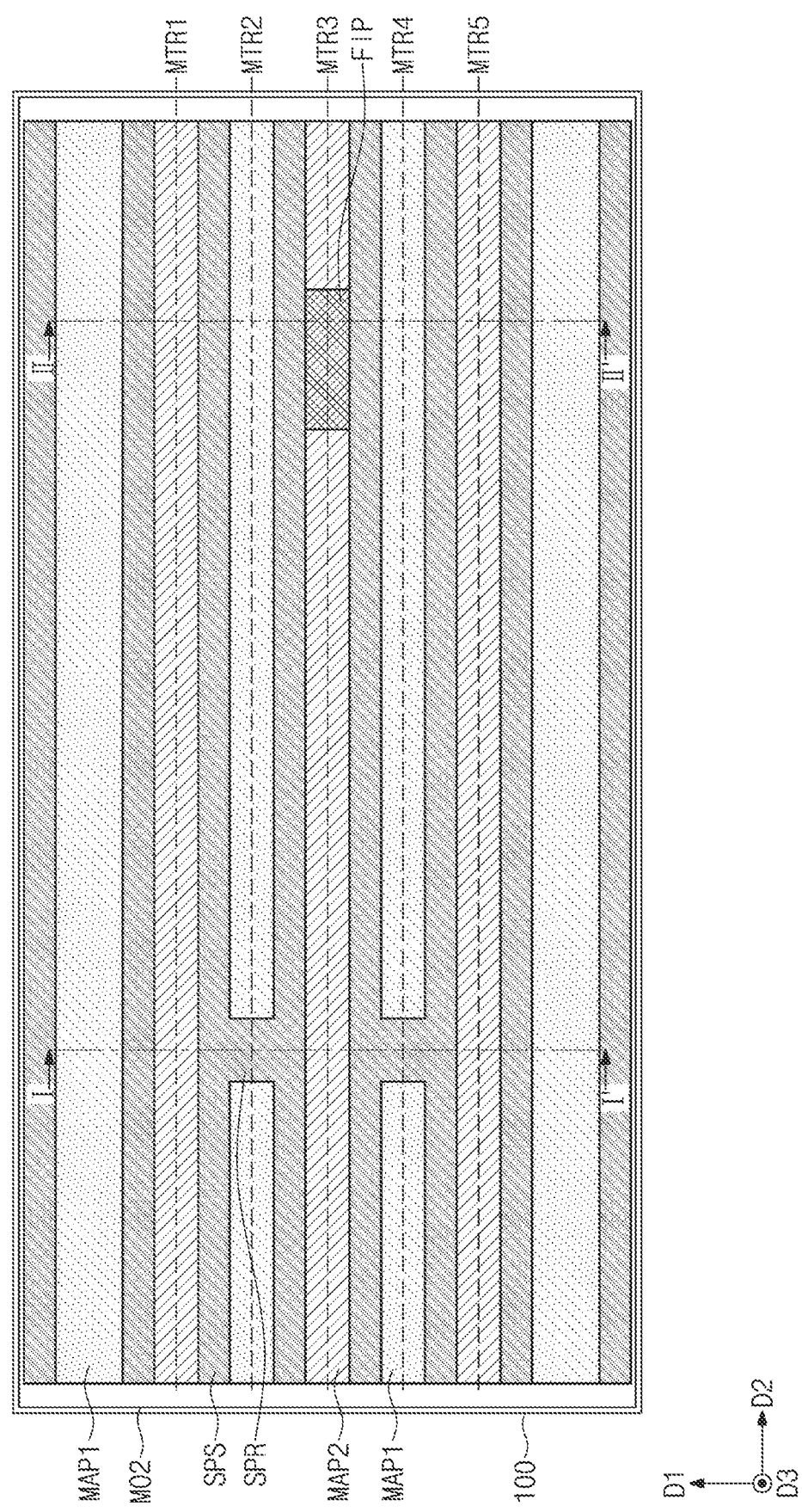
Figure 24A:
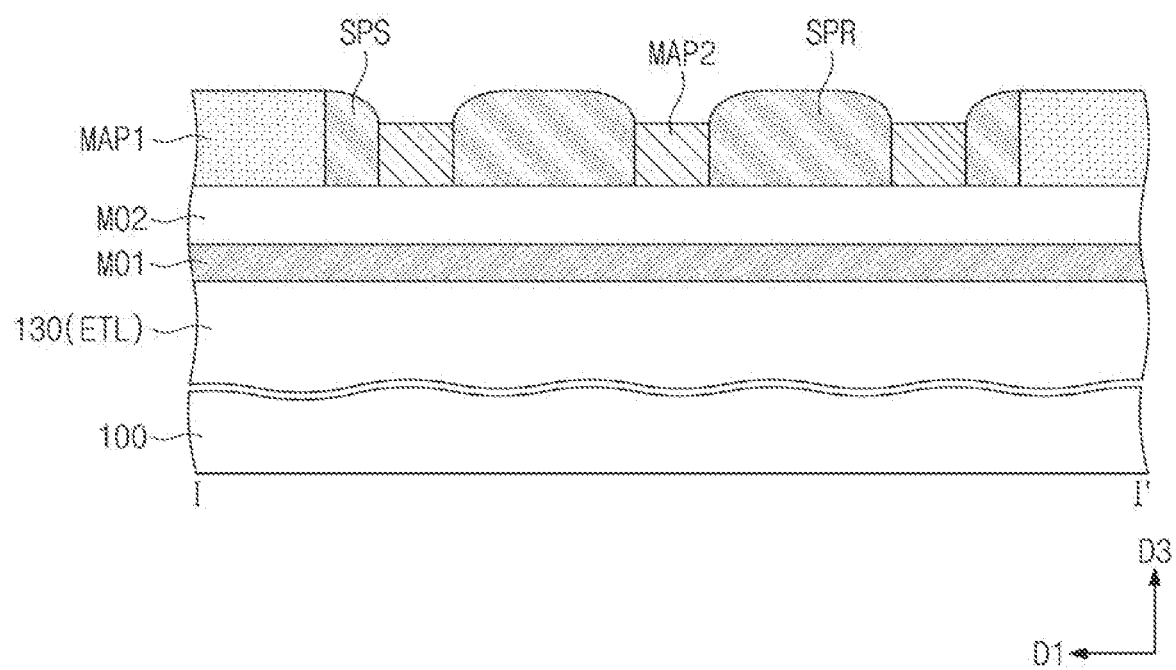
Figure 24B:
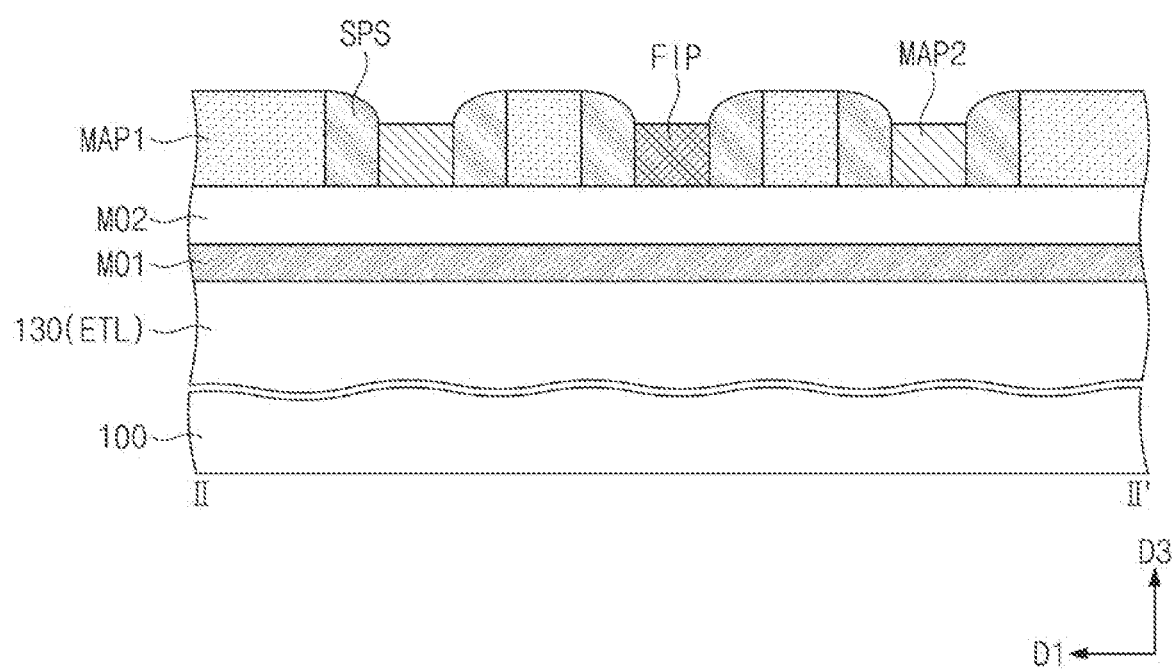

Referring to FIGS. 23, 24A, and 24B, the second line patterns MAP2 may be formed on the second mold layer MO2 to fill empty spaces between the spacers SPS, respectively. The second line patterns MAP2 may extend in the second direction D2 and may be parallel to each other. The second line pattern MAP2 on the third interconnection track MTR3 may be divided into a pair of the second line patterns MAP2 by the filling pattern FIP.

Figure 25:
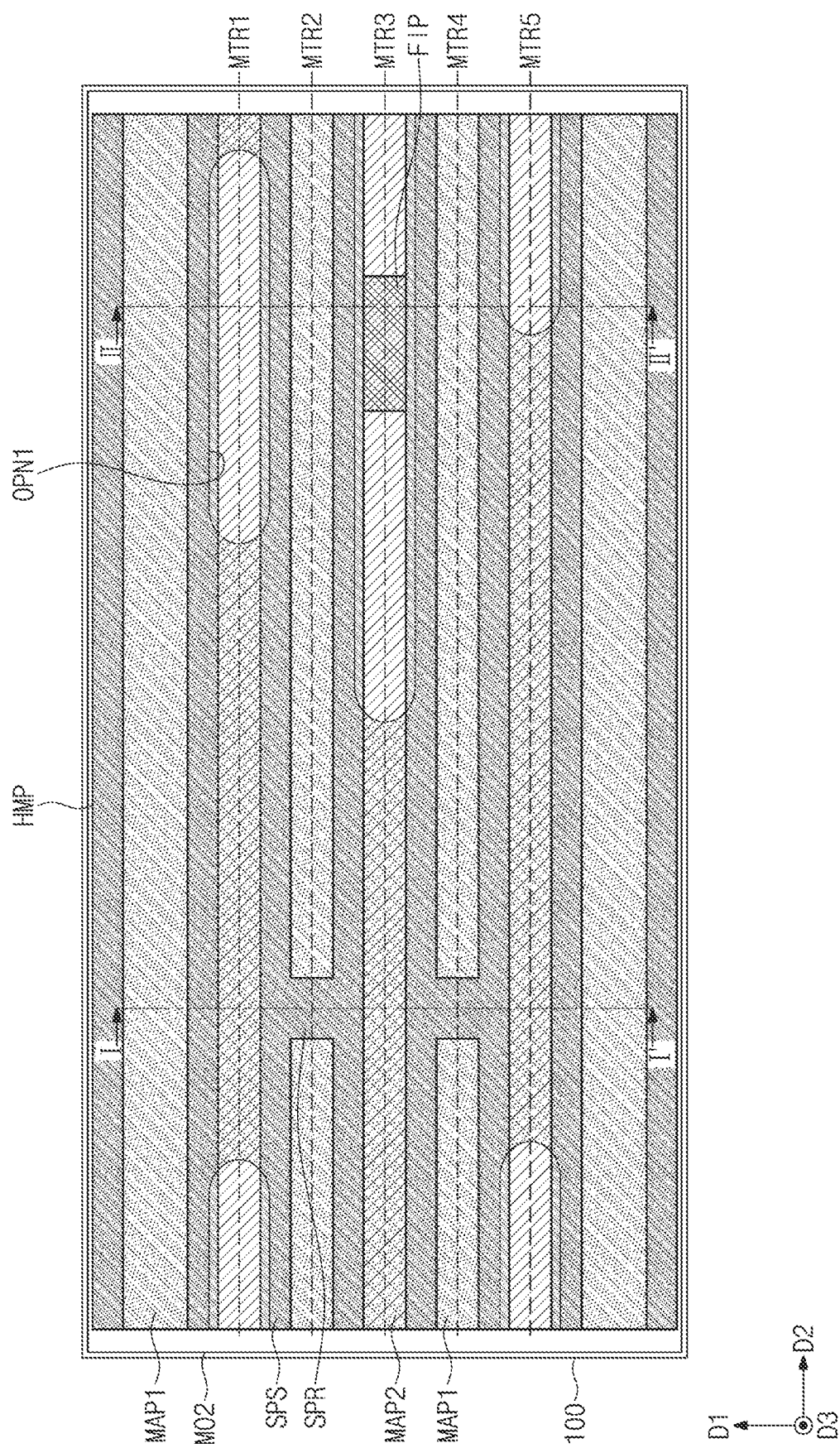
Figure 26A:
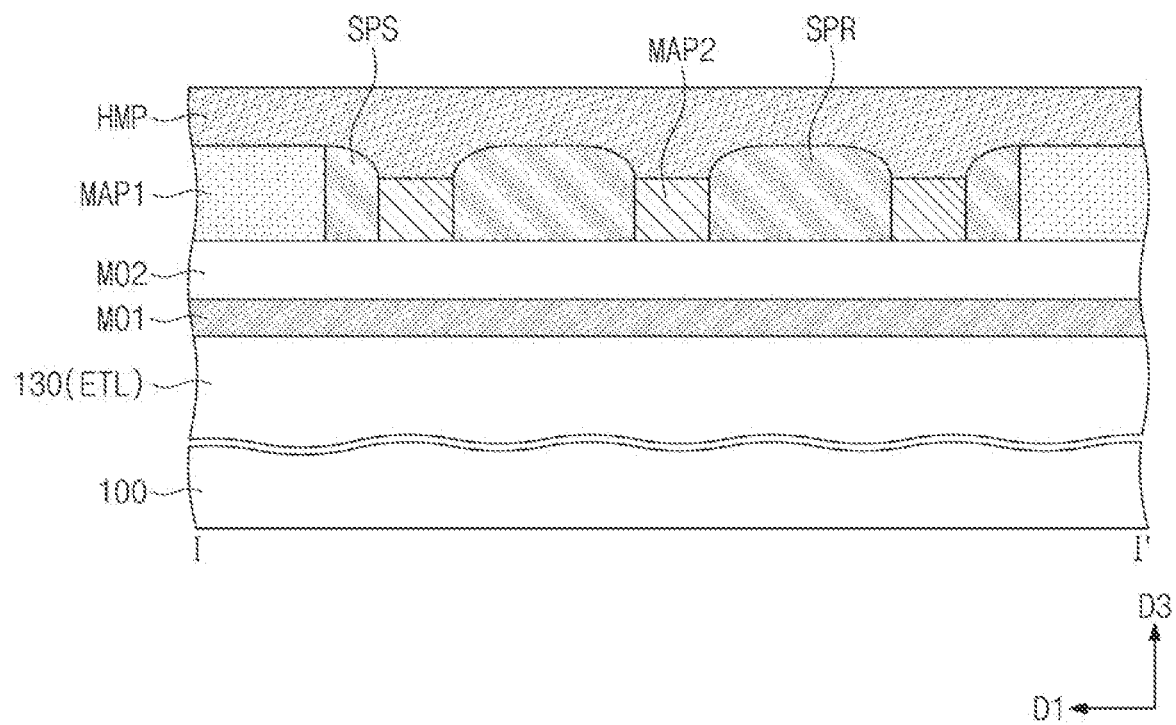
Figure 26B:
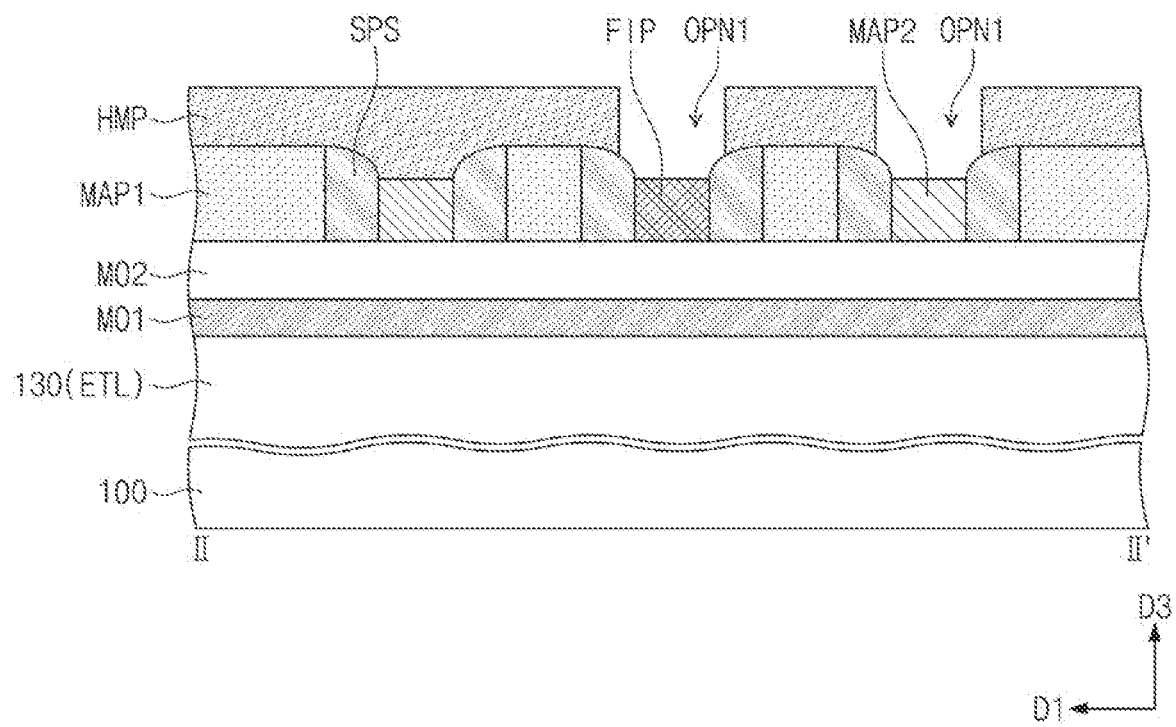

Referring to FIGS. 25, 26A, and 26B, the hard mask pattern HMP may be formed on the first and second line patterns MAP1 and MAP2. The hard mask pattern HMP may include a plurality of first openings OPN1. Each of the first openings OPN1 may be formed to overlap at least a portion of the second line pattern MAP2. For example, at least a portion of the second line pattern MAP2 may be exposed through the first opening OPN1. In some embodiments, the filling pattern FIP may also be exposed through the first opening OPN1.

Figure 27:
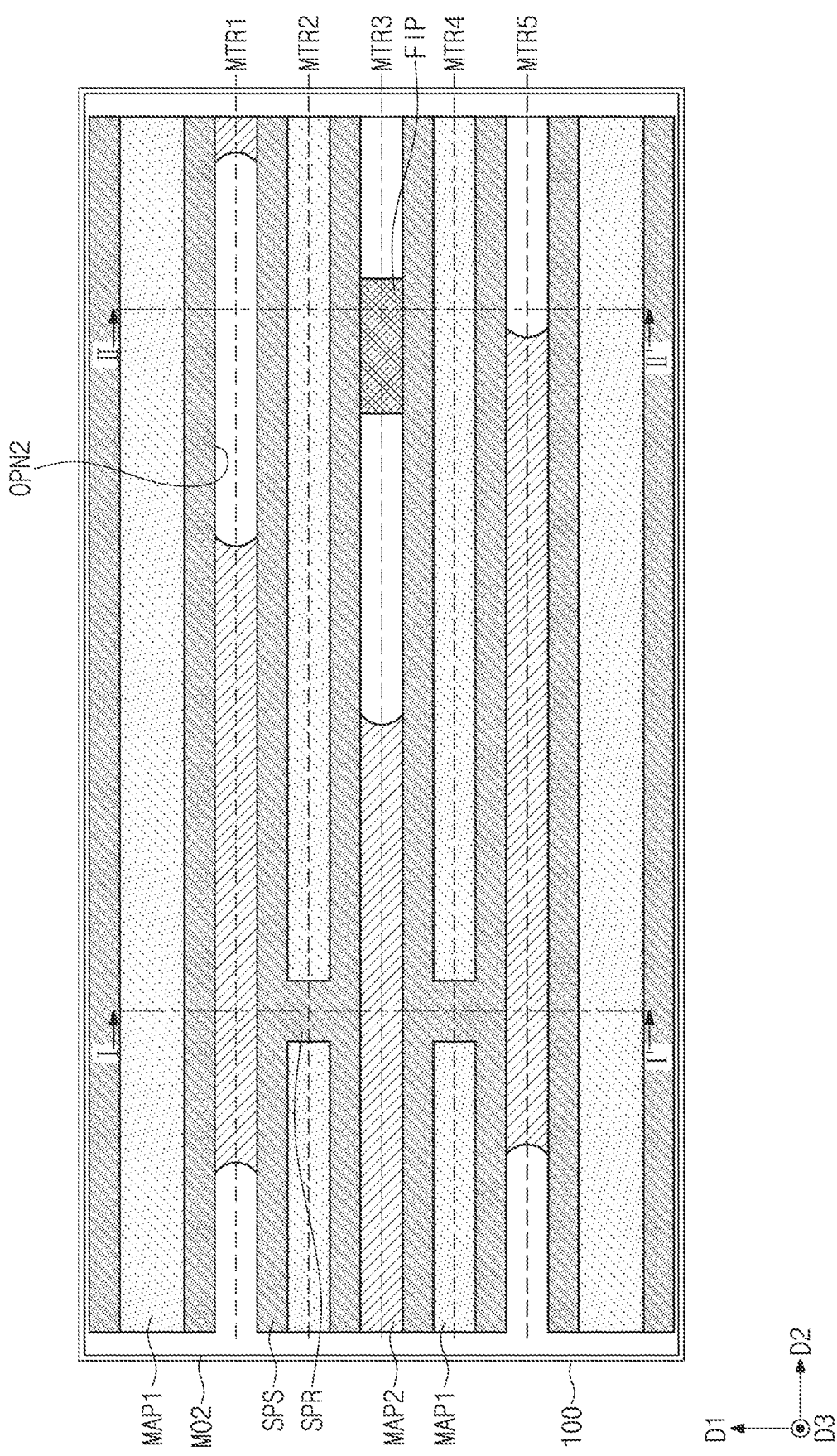
Figure 28A:
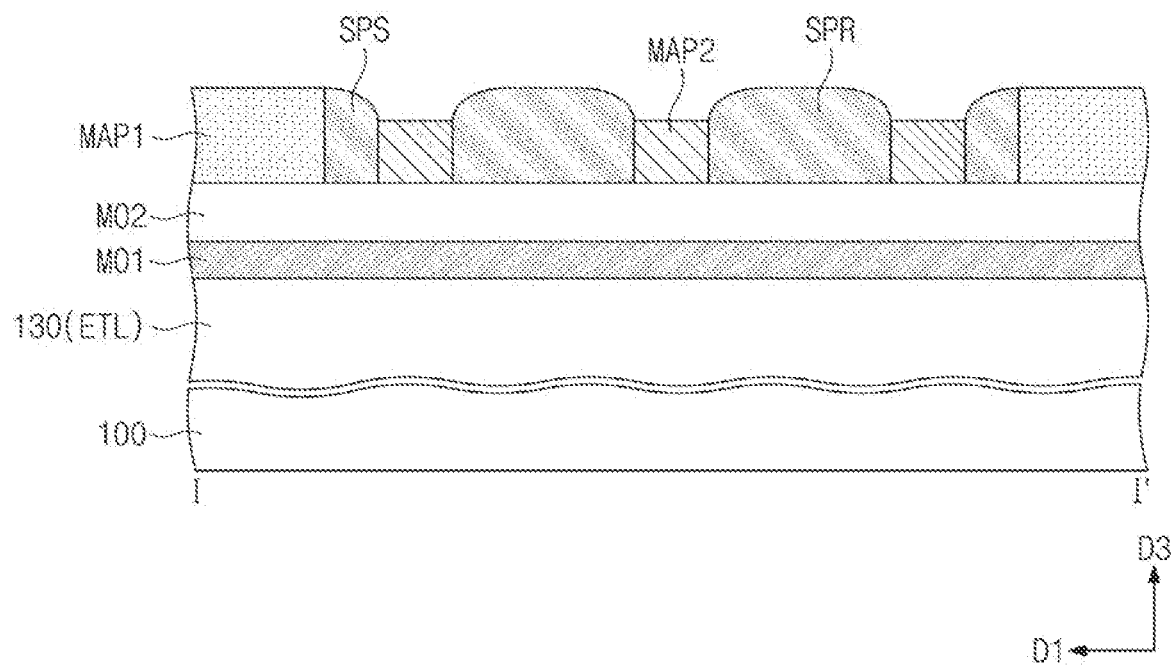
Figure 28B:
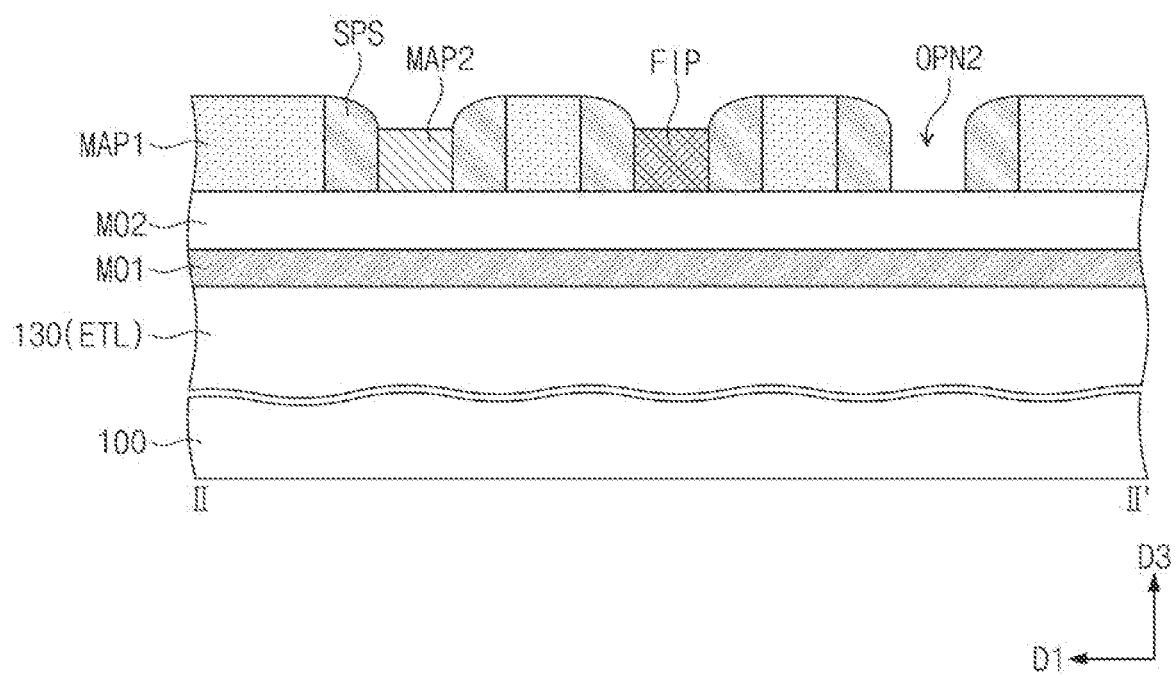

Referring to FIGS. 27, 28A, and 28B, the portions of the second line patterns MAP2, which are exposed through the first openings OPN1, may be selectively removed using the hard mask pattern HMP as an etch mask. Since the filling pattern FIP has an etch selectivity with respect to the second line pattern MAP2, the filling pattern FIP may not be removed during the removal of the second line patterns MAP2 and may be left as it is.

Empty regions, which are formed by removing the second line patterns MAP2, may be defined as second openings OPN2, respectively. Each of the second openings OPN2 may expose the top surface of the second mold layer MO2, between the spacers SPS.

Figure 29:
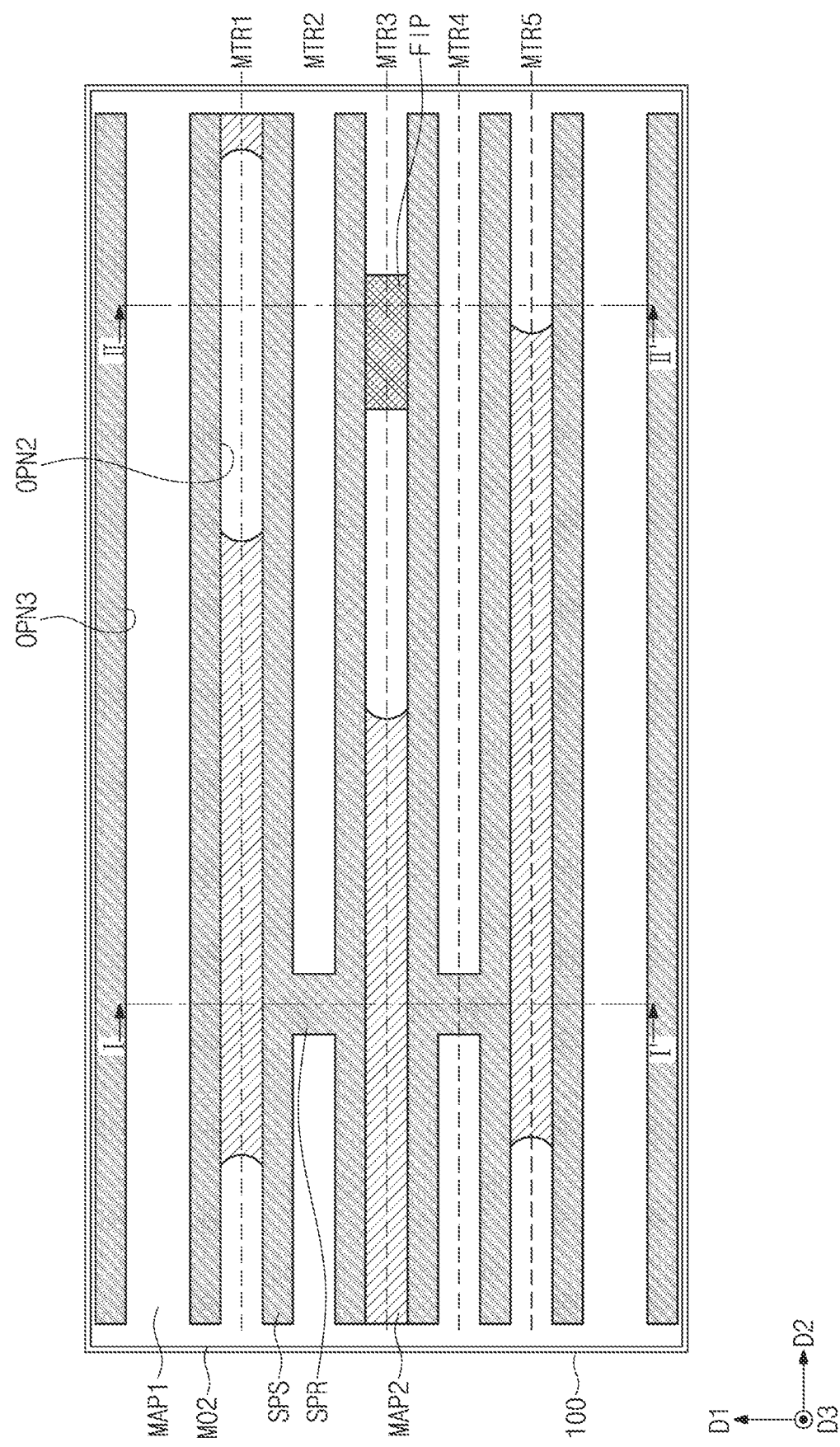
Figure 30A:
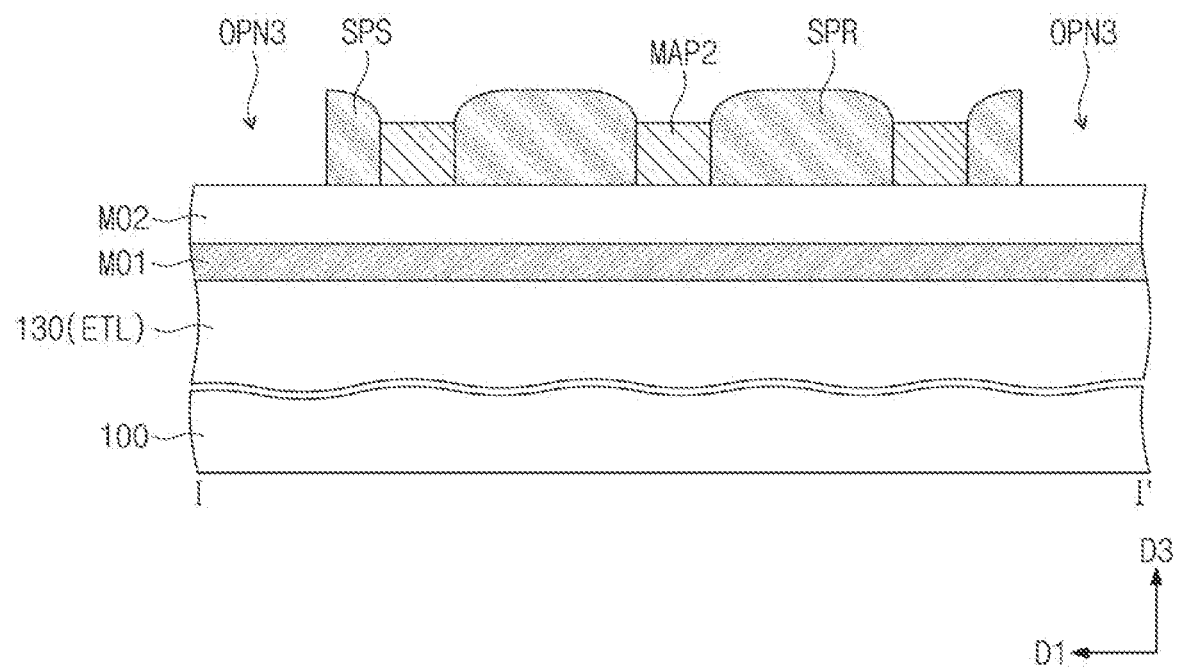
Figure 30B:
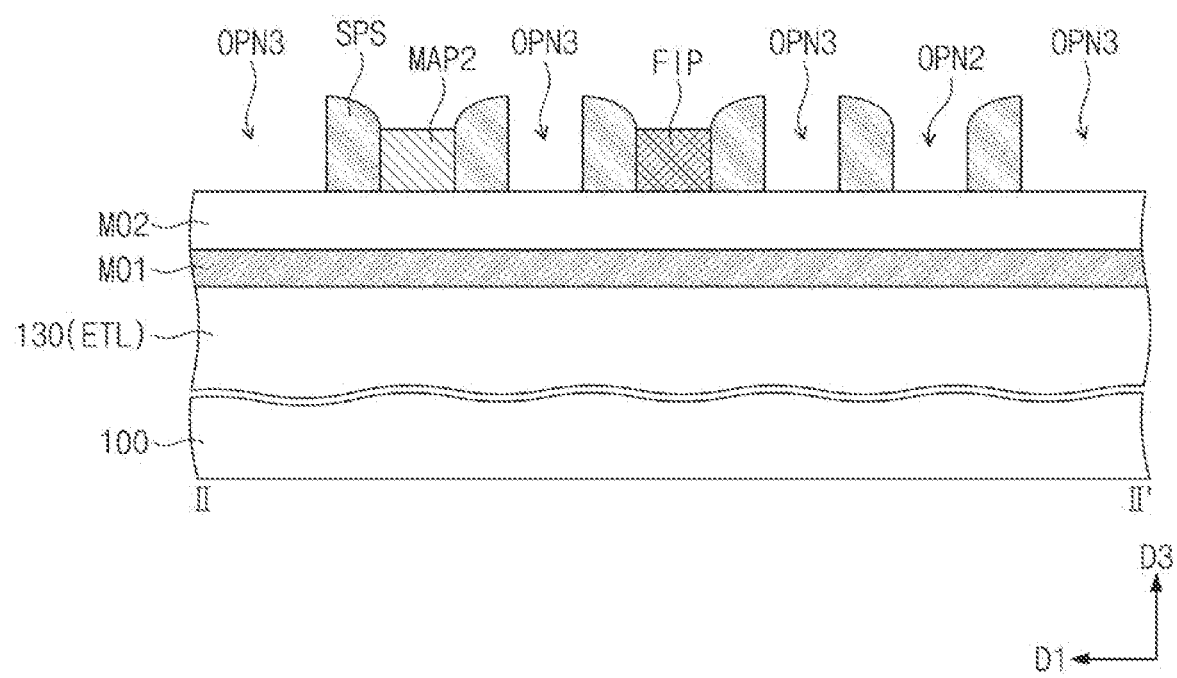

Referring to FIGS. 29, 30A, and 30B, the first line patterns MAP1 may be selectively removed. For example, empty regions, which are formed by removing the first line patterns MAP1, may be defined as third openings OPN3, respectively. Each of the third openings OPN3 may expose the top surface of the second mold layer MO2, between the spacers SPS.

Since the first line patterns MAP1 are selectively removed, the spacers SPS, portions of the second line patterns MAP2, and the filling pattern FIP may be left on the second mold layer MO2.

Figure 31:
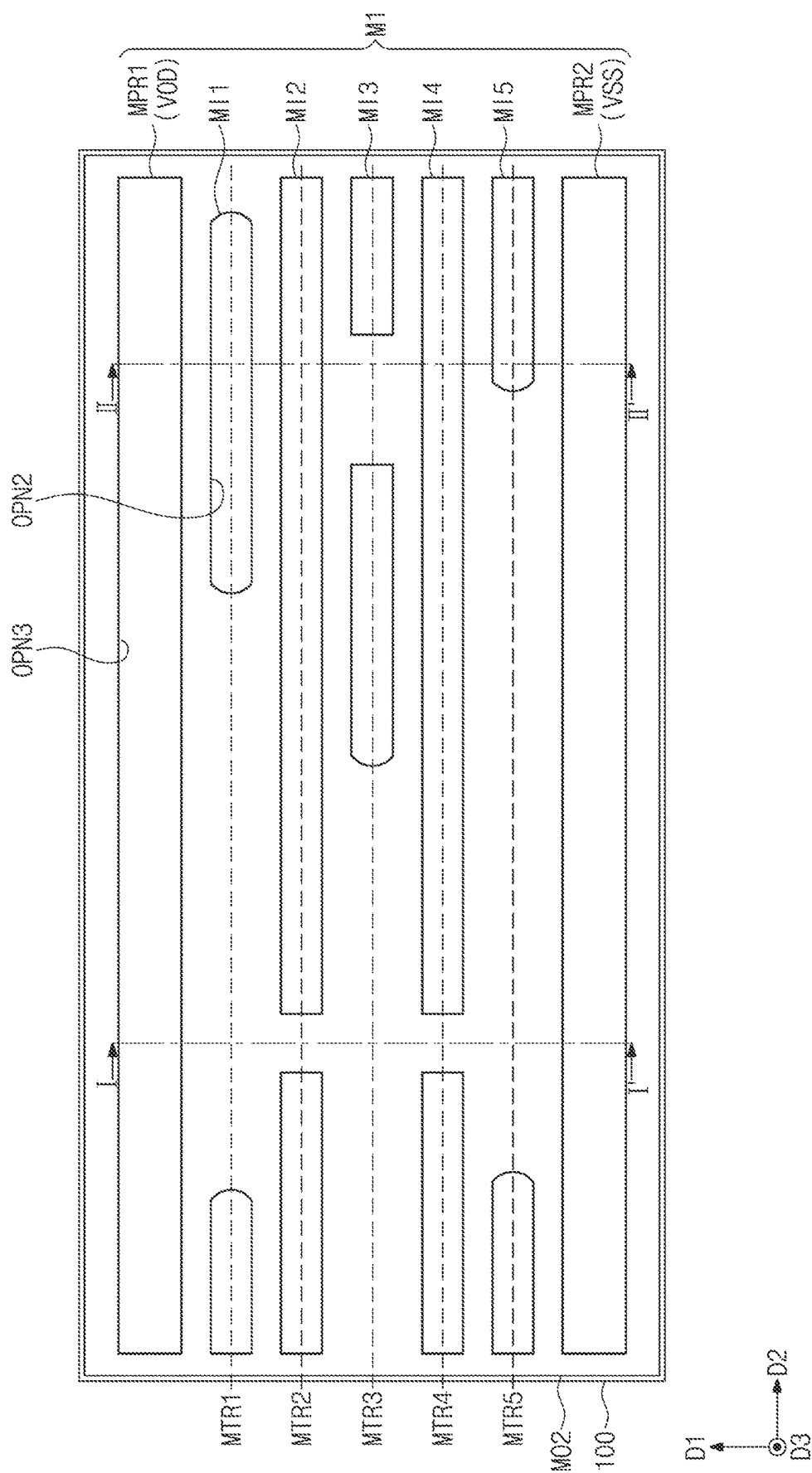
Figure 32A:
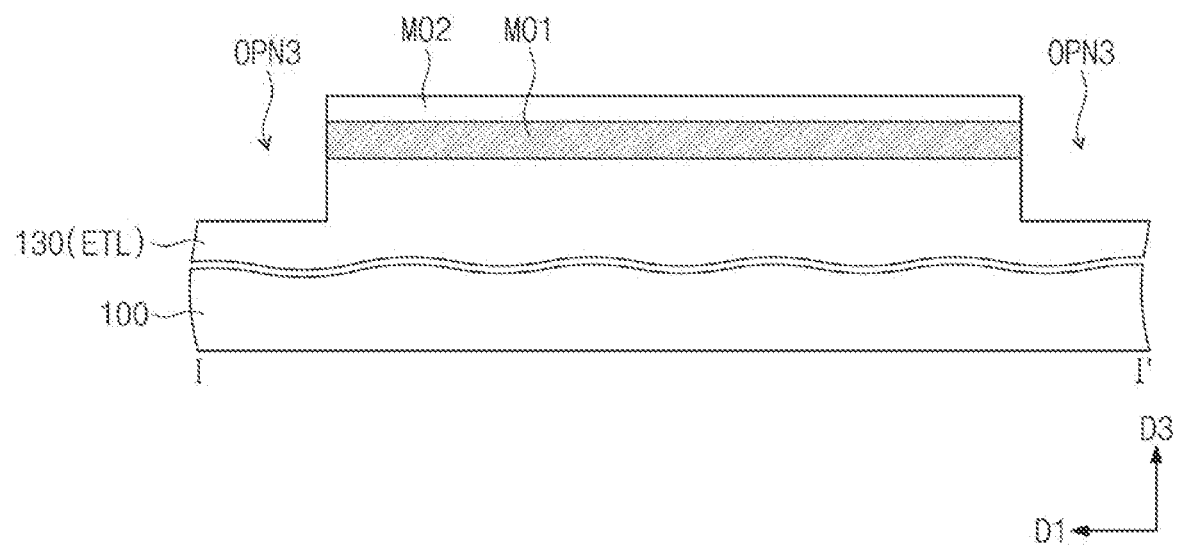
Figure 32B:
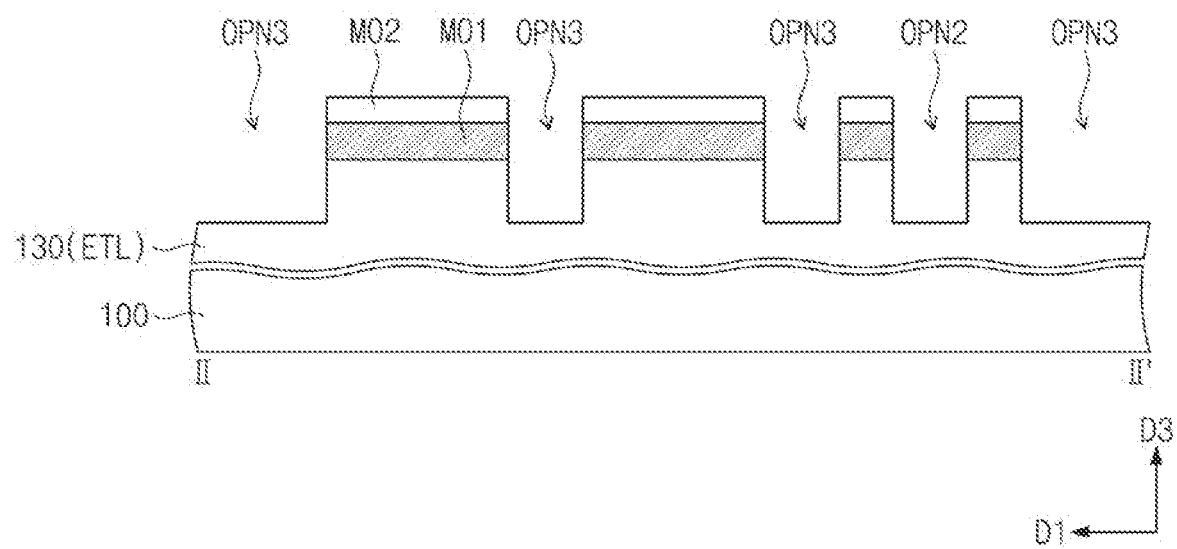

Referring to FIGS. 31, 32A, and 32B, the first and second mold layers MO1 and MO2 may be patterned using the spacers SPS, the second line patterns MAP2, and the filling pattern FIP, which are left on the second mold layer MO2, as an etch mask. Next, an upper portion of the etch target layer ETL (i.e., the third interlayer insulating layer 130) may be recessed using the patterned first and second mold layers MO1 and MO2 as an etch mask. As a result, the second and third openings OPN2 and OPN3 defined above may be extended into the upper portion of the third interlayer insulating layer 130.

Thereafter, the second and third openings OPN2 and OPN3 may be filled with a metallic material. Accordingly, the interconnection lines of the first metal layer M1 may be formed in the upper portion of the third interlayer insulating layer 130.

Figure 33:
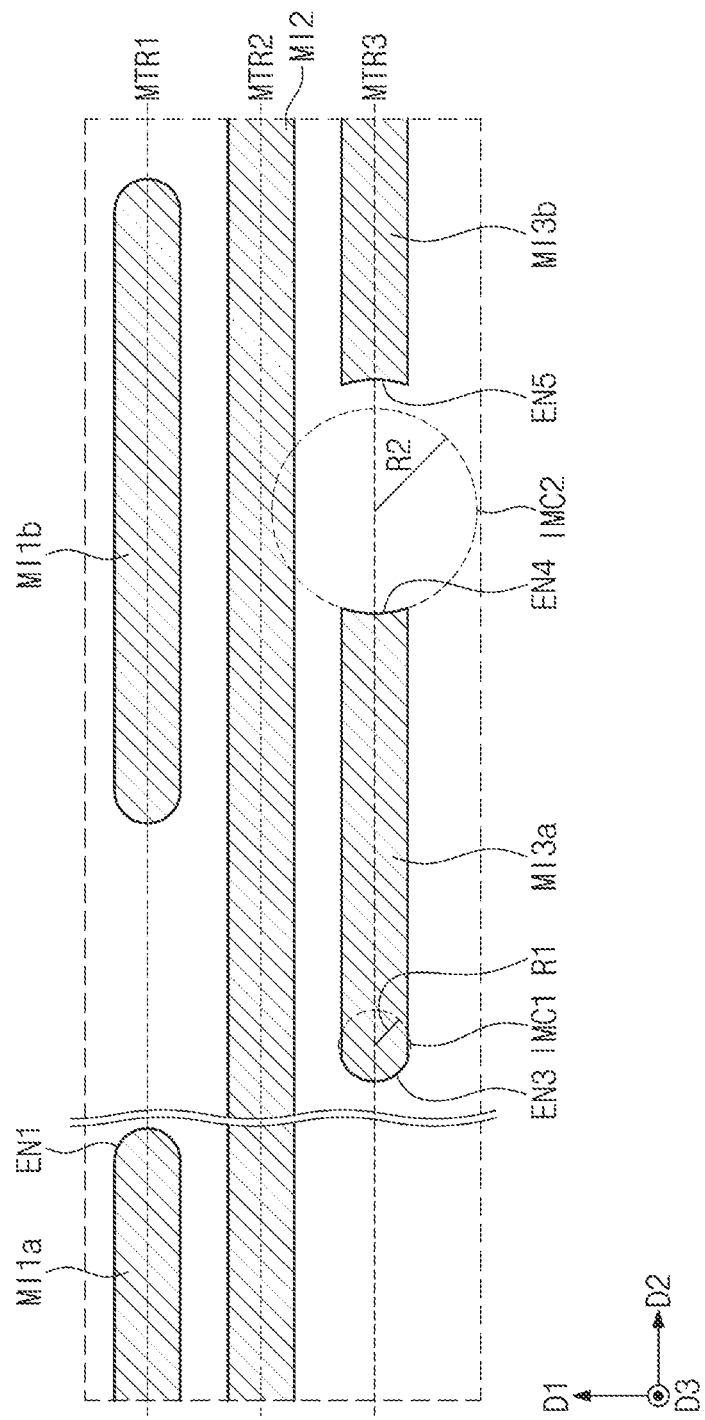
FIGS. 33 and 34 are plan views, each of which illustrates first to third lower interconnection lines of FIG. 1, according to some embodiments of the inventive concepts.
Figure 34:
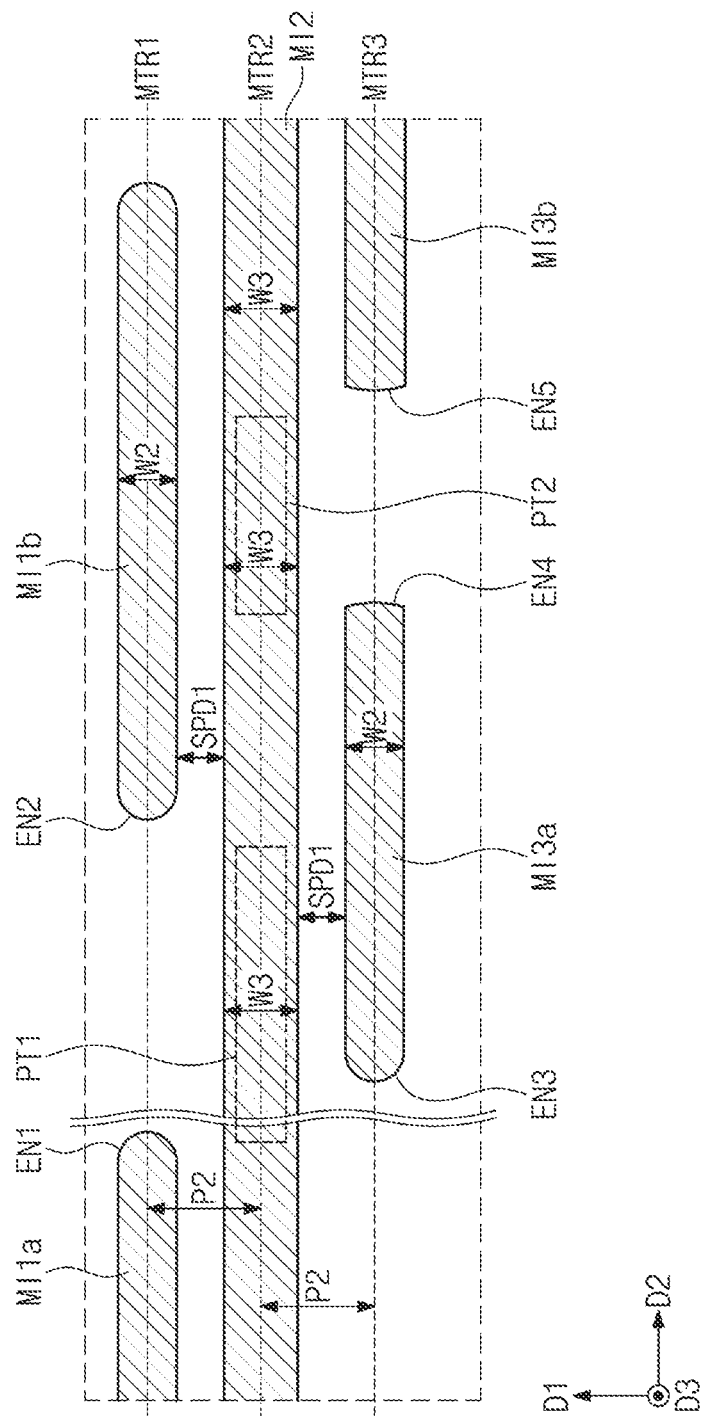

FIGS. 33 and 34 are plan views, each of which illustrates first to third lower interconnection lines of FIG. 1, according to some embodiments of the inventive concepts. For concise description, elements previously described with reference to FIGS. 1 to 3 may be identified by previously-used reference numbers, and an overlapping description thereof may be omitted.

Referring to FIG. 33, the fourth end EN4 of the third interconnection line MI3a may have a curvature opposite to a curvature of the third end EN3. In greater detail, the second imaginary circle IMC2 corresponding to the fourth end EN4 of the third interconnection line MI3a may be defined outside the third interconnection line MI3a. The center of the second imaginary circle IMC2 corresponding to the fourth end EN4 of the third interconnection line MI3a may be outside the third interconnection line MI3a. By contrast, the first imaginary circle IMC1 corresponding to the third end EN3 of the third interconnection line MI3a may be defined within the third interconnection line MI3a. The center of the first imaginary circle IMC1 corresponding to the third end EN3 of the third interconnection line MI3a may be within the third interconnection line MI3a. The fifth end EN5 of the fourth interconnection line MI3b may also have substantially the same curvature as the fourth end EN4. In other words, an imaginary circle corresponding to the fifth end EN5 of the fourth interconnection line MI3b may also be defined outside the fourth interconnection line MI3b. Stated differently, the fourth end EN4 of the third interconnection line MI3a and the fifth end EN5 of the fourth interconnection line MI3b may be curved away or concave from each other across the distance (e.g., TIT2) therebetween.

Referring to FIG. 34, the first to fourth interconnection lines MI1a, MI1b, MI3a, and MI3b on the first and third interconnection tracks MTR1 and MTR3 may have the same linewidth (i.e., the second width W2). By contrast, the second lower interconnection line MI2 on the second interconnection track MTR2 may have a linewidth W3 that is different from the second width W2. In some embodiments, the linewidth W3 of the second interconnection track MTR2 may be larger than the second width W2. In some embodiments, the linewidth W3 of the second interconnection track MTR2 may be smaller than the second width W2.

Even when the linewidth W3 of the second lower interconnection line MI2 is different from the linewidth W2 of each of the first and third lower interconnection lines MI1 and MI3, the distance SPD1 between the first and second lower interconnection lines MI1 and MI2 may be equal to the distance SPD1 between the third and second lower interconnection lines MI3 and MI2. This is because the pitch P2 between the first and second lower interconnection lines MI1 and MI2 is still the same as the pitch P2 between the third and second lower interconnection lines MI3 and MI2.

According to the afore-described fabrication method, the second lower interconnection line MI2 on the second interconnection track MTR2 may have a linewidth that is determined by a linewidth of the first line pattern MAP1, and the first and third lower interconnection lines MI1 and MI3 on the first and third interconnection tracks MTR1 and MTR3 may have a linewidth that is determined by a linewidth of the second line patterns MAP2. Thus, in the case where the first and second line patterns MAP1 and MAP2 are formed to have different linewidths from each other, the linewidths of the lower interconnection lines may be different from each other, as shown in FIG. 34.

Although not fully shown in FIG. 34, referring back to FIG. 1, since the first, third and fifth lower interconnection lines MI1, MI3, and MI5 on the first, third and fifth interconnection tracks MTR1, MTR3, and MTR5 are formed by the second line patterns MAP2, they may have the same linewidth or substantially the same linewidth (e.g., the second width W2). Since the second and fourth lower interconnection lines MI2 and MI4 on the second and fourth interconnection tracks MTR2 and MTR4 are formed by the first line patterns MAP1, they may have the same linewidth or substantially the same linewidth (e.g., a third width W3). In some embodiments, the second width W2 may be different from the third width W3.

FIGS. 35A to 35D are sectional views, which are respectively taken along lines A-A', B-B', C-C', and D-D' of FIG. 1 to illustrate a semiconductor device according to some embodiments of the inventive concepts. For concise description, elements previously described with reference to FIGS. 1 and 2A to 2D may be identified by previously-used reference numbers, and an overlapping description thereof may be omitted.

The PMOSFET and NMOSFET regions PR and NR may be defined by a second trench TR2, which is formed in an upper portion of the substrate 100. The second trench TR2 may be located between the PMOSFET and NMOSFET regions PR and NR. The PMOSFET and NMOSFET regions PR and NR may be spaced apart from each other in the first direction D1 with the second trench TR2 interposed therebetween.

The first active patterns AP1 and the second active patterns AP2 may be provided on the PMOSFET region PR and the NMOSFET region NR, respectively. The first and second active patterns AP1 and AP2 may extend in the second direction D2 and may be parallel to each other. The first and second active patterns AP1 and AP2 may be portions of the substrate 100 protruding in a vertical direction (i.e., the third direction D3). First trenches TR1 may be defined between adjacent ones of the first active patterns AP1 and between adjacent ones of the second active patterns AP2. The first trench TR1 may be shallower than the second trench TR2.

The device isolation layer ST may fill the first and second trenches TR1 and TR2. Upper portions of the first and second active patterns AP1 and AP2 may protrude vertically above the device isolation layer ST (e.g., see FIG. 35D). Each of the upper portions of the first and second active patterns AP1 and AP2 may have a fin shape. The device isolation layer ST may not cover the upper portions of the first and second active patterns AP1 and AP2. The device isolation layer ST may cover lower side surfaces of the first and second active patterns AP1 and AP2.

The first source/drain patterns SD1 may be provided on the first active patterns AP1. The first source/drain patterns SD1 may be impurity regions of a first conductivity type (e.g., p-type). The first channel pattern CH1 may be interposed between each pair of the first source/drain patterns SD1. The second source/drain patterns SD2 may be provided on the second active patterns AP2. The second source/drain patterns SD2 may be impurity regions of a second conductivity type (e.g., n-type). The second channel pattern CH2 may be interposed between each pair of the second source/drain patterns SD2. Other features associated with the first and second source/drain patterns SD1 and SD2 may be the same as or similar to those in the example embodiments described with reference to FIGS. 1 and 2A to 2D.

Figure 35A:
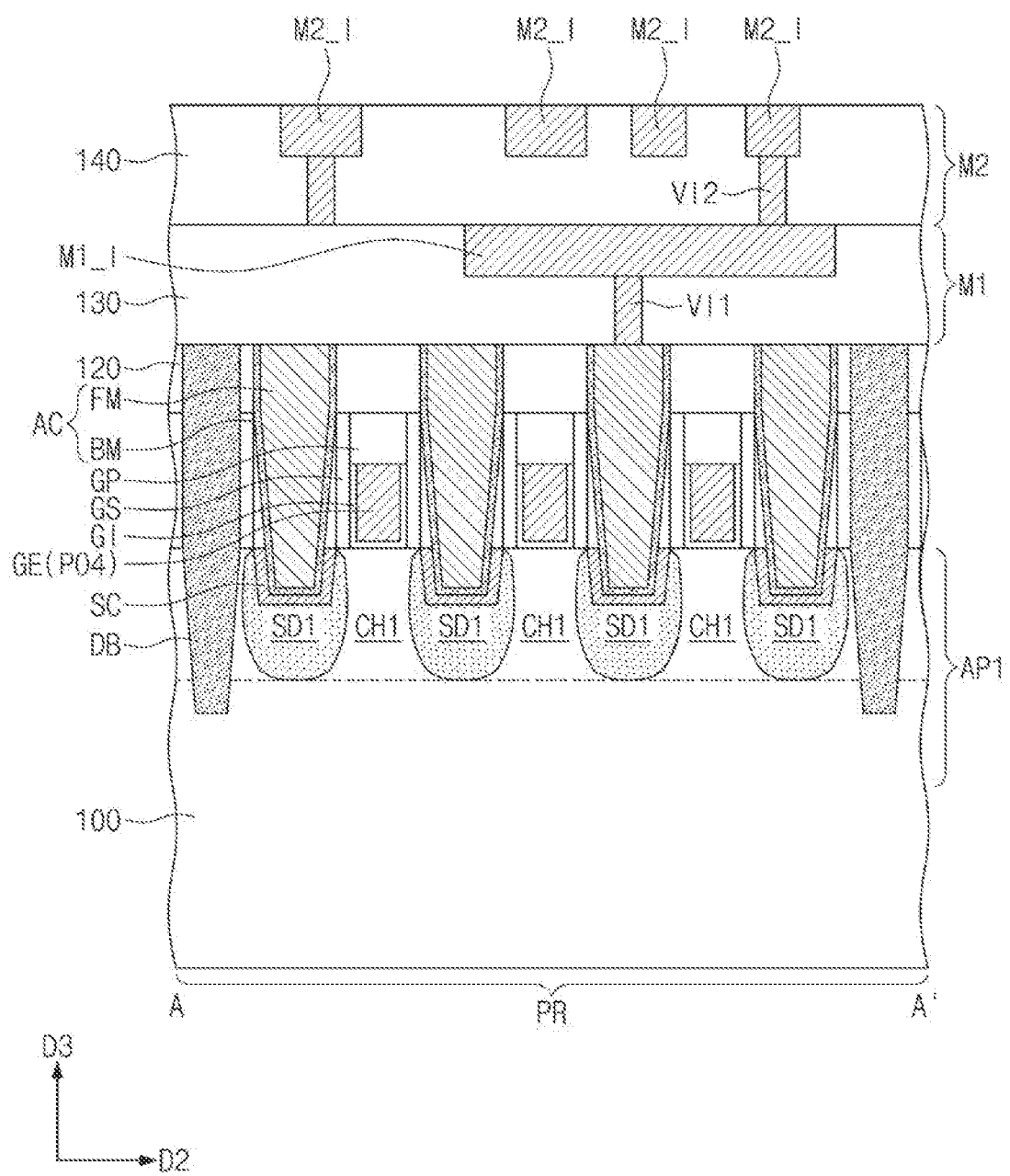
FIGS. 35A to 35D are sectional views, which are respectively taken along lines A-A', B-B', C-C', and D-D' of FIG. 1 to illustrate a semiconductor device according to some embodiments of the inventive concepts.
Figure 35B:
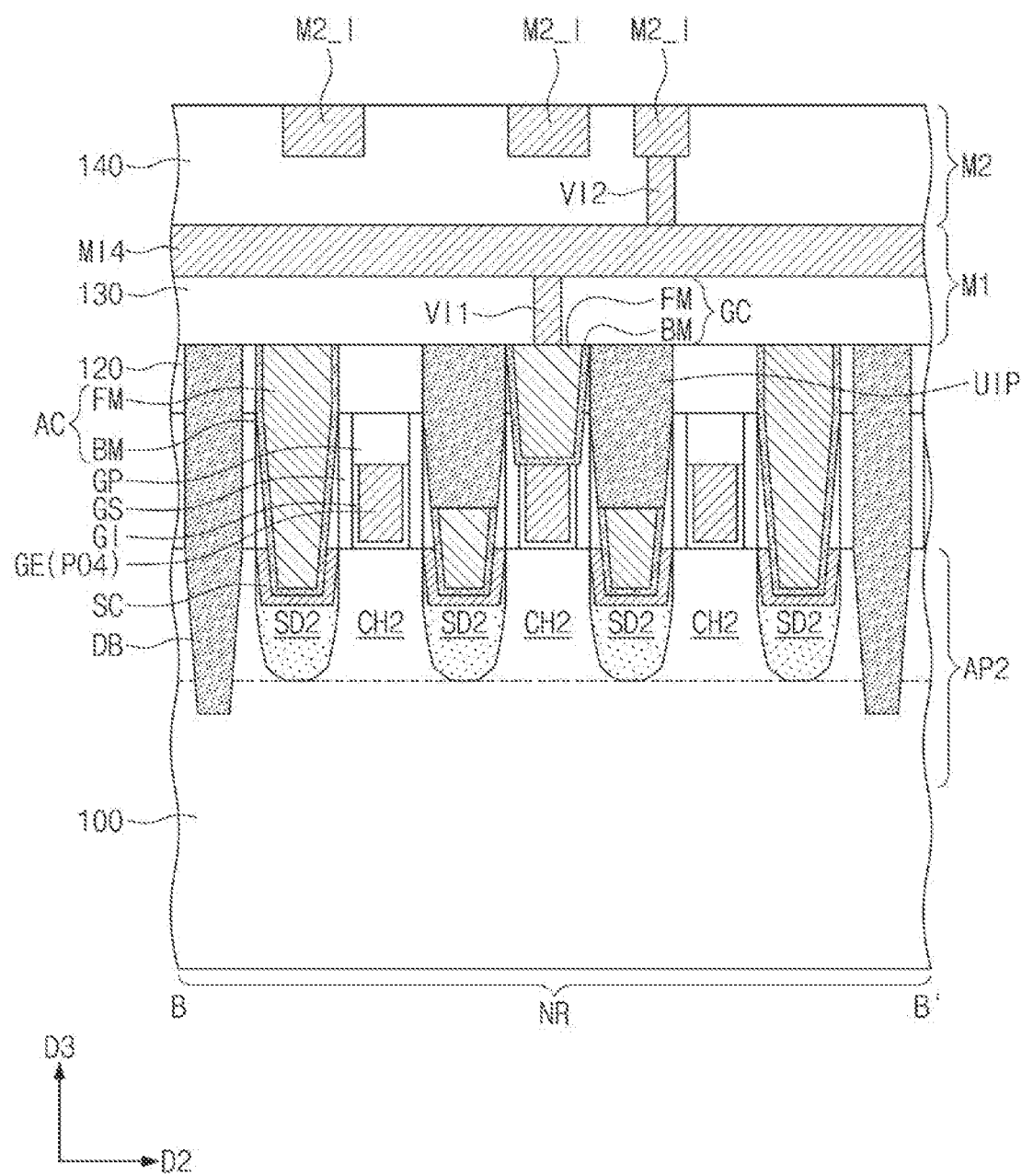
Figure 35C:
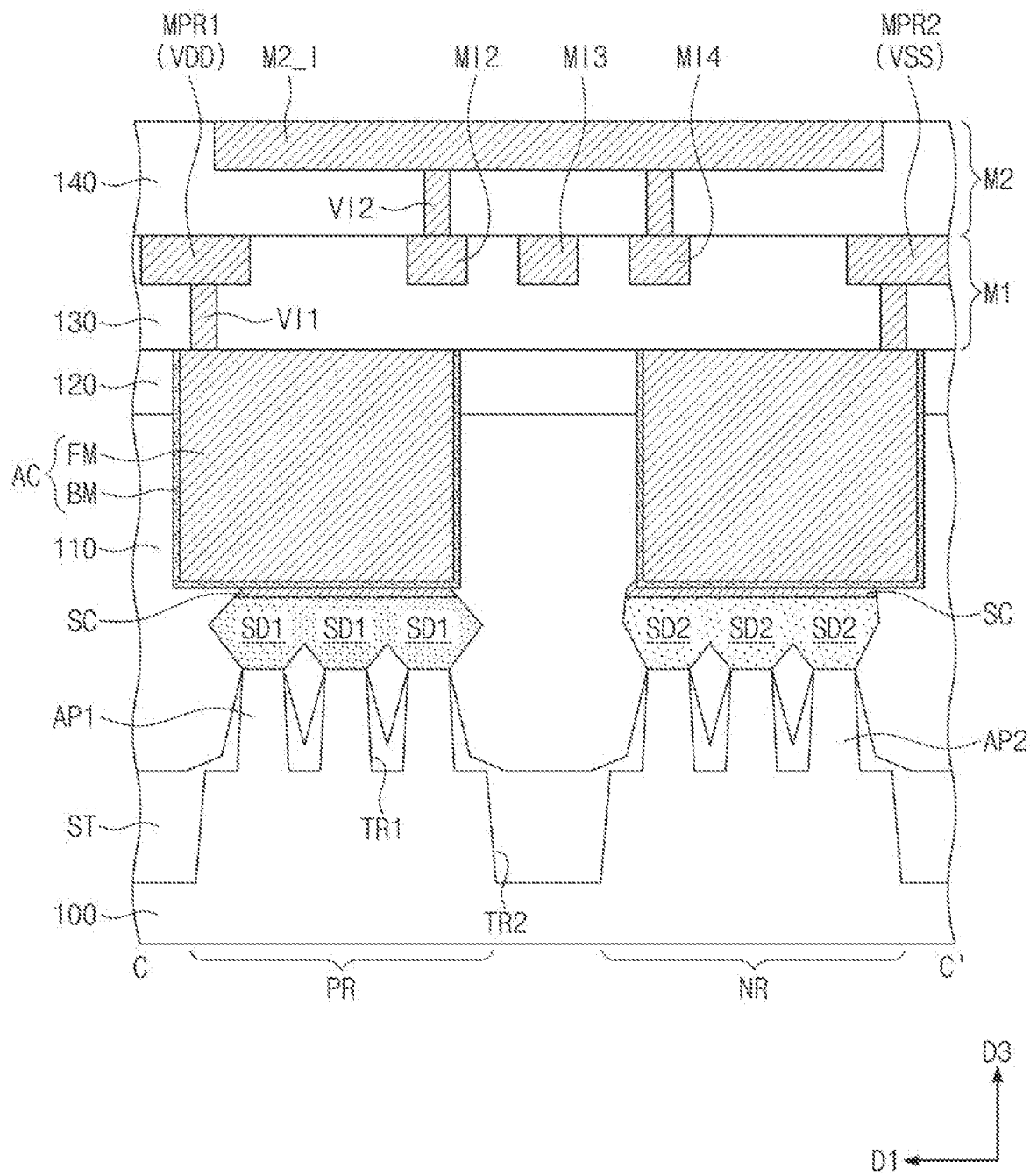
Figure 35D:
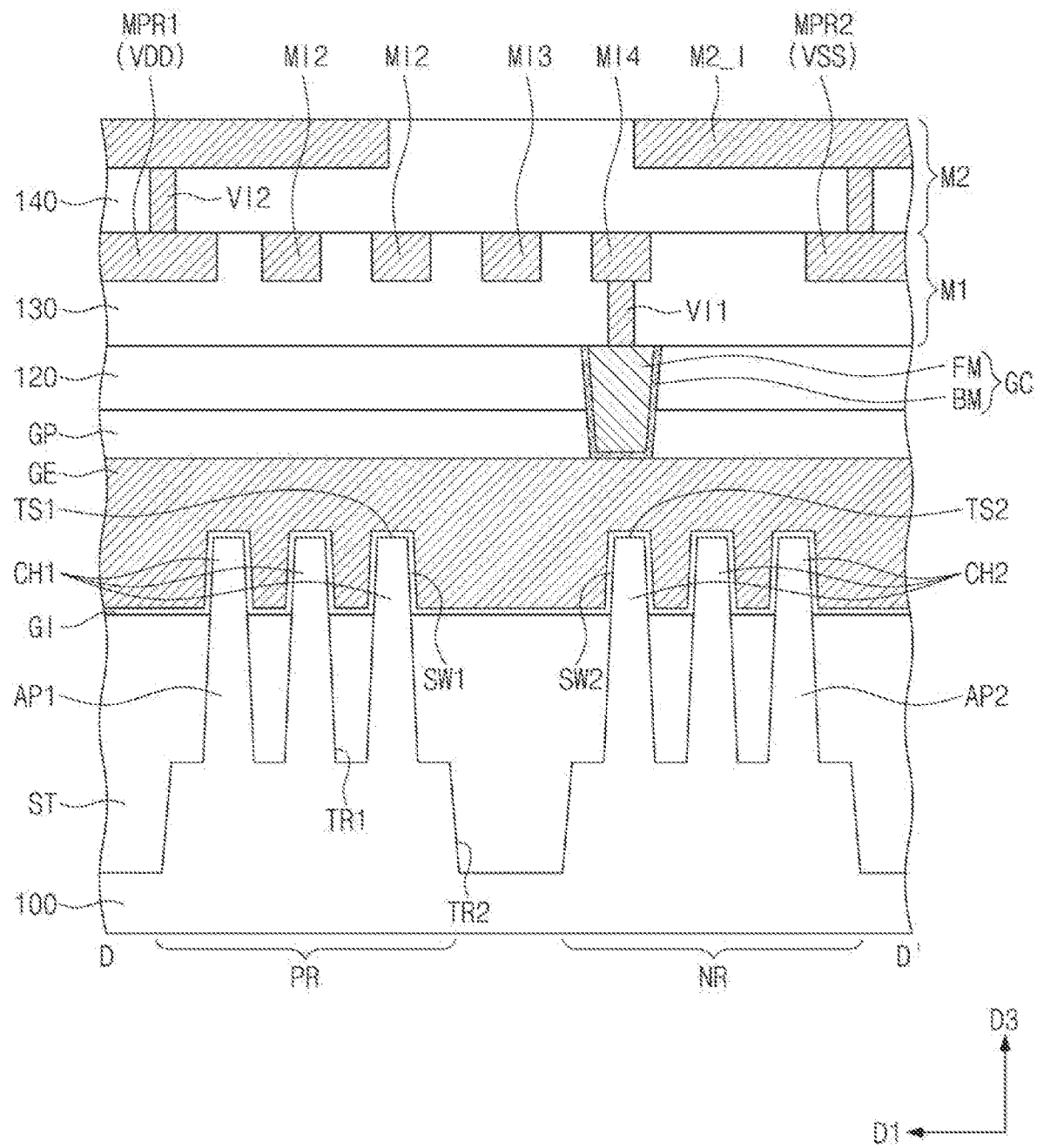

The gate electrodes GE may cross the first and second active patterns AP1 and AP2 and to extend in the first direction D1. The gate electrodes GE may be vertically overlapped with the first and second channel patterns CH1 and CH2. Each of the gate electrodes GE may surround top and opposite side surfaces of each of the first and second channel patterns CH1 and CH2. Referring to FIG. 35D, the gate electrode GE may be provided on a first top surface TS1 of the first channel pattern CH1 and at least one first side surface SW1 of the first channel pattern CH1. The gate electrode GE may be provided on a second top surface TS2 of the second channel pattern CH2 and at least one second side surface SW2 of the second channel pattern CH2. In other words, the transistor according to some embodiments may be a three-dimensional field-effect transistor (e.g., FinFET), in which the gate electrode GE three-dimensionally surrounds the channel patterns CH1 and CH2.

Features associated with the active and gate contacts AC and GC and the first and second metal layers M1 and M2 may be the same as or similar to those in the example embodiments described with reference to FIGS. 1 and 2A to 2D.

In a semiconductor device according to some embodiments of the inventive concepts, since interconnection lines of a first metal layer may be formed by a multi-patterning technology, the interconnection lines may be formed to have a small linewidth and a small pitch. Accordingly, an integration density of the semiconductor device may be increased. In addition, it may be possible to prevent unnecessary metal portions (e.g., dummy portions) from being formed in the first metal layer and to minimize a volume or area of the interconnection lines in the first metal layer, even when the multi-patterning technology is used to fabricate the semiconductor device. As a result, it may be possible to reduce parasitic capacitance in the first metal layer and to improve electric characteristics of the device.

While example embodiments of the inventive concepts have been particularly shown and described, it will be understood by one of ordinary skill in the art that variations in form and detail may be made therein without departing from the scope of the attached claims.

What is claimed is:

1. A semiconductor device, comprising:
a logic cell on a substrate, the logic cell comprising a PMOSFET region and an NMOSFET region; and
a first metal layer on the logic cell,
wherein the first metal layer comprises:
a first power line and a second power line that have lengths extending in a second direction and are parallel to each other; and
a first lower interconnection line, a second lower interconnection line, and a third lower interconnection line, respectively arranged on a first interconnection track, a second interconnection track, and a third interconnection track that have lengths extending in the second direction between the first power line and the second power line and are parallel to each other, with the second interconnection track between the first interconnection track and the third interconnection tracks,
wherein the first lower interconnection line comprises a first interconnection line and a second interconnection line spaced apart from each other in the second direction by a first distance, and the third lower interconnection line comprises a third interconnection line and a fourth interconnection line spaced apart from each other in the second direction by a second distance smaller than the first distance,
wherein the first interconnection line has a first end with a first convex curvature having a first center within the first interconnection line, wherein the first end faces the second interconnection line, wherein the second interconnection line has a second end with a second convex curvature having a second center within the second interconnection line, wherein the second end faces the first interconnection line,
wherein the third interconnection line has a third end with a third convex curvature having a third center within the third interconnection line and a fourth end with a fourth convex curvature having a fourth center within the third interconnection line, wherein the fourth end is opposite to the third end, and
wherein the second lower interconnection line has a length extending in the second direction with a uniform linewidth at a first portion across from the first distance between the first interconnection line and the second interconnection line and at a second portion across from the second distance between the third interconnection line and the fourth interconnection line, wherein the uniform linewidth extends in a first direction orthogonal to the second direction.

2. The semiconductor device of claim 1, wherein the first convex curvature of the first end is larger than the fourth convex curvature of the fourth end.

3. The semiconductor device of claim 1, wherein the fourth convex curvature of the fourth end is different from the third convex curvature of the third end.

4. The semiconductor device of claim 3, wherein the third convex curvature of the third end is larger than the fourth convex curvature of the fourth end.

5. The semiconductor device of claim 1, wherein the second end has a second arc corresponding to a first imaginary circle,
the fourth end has a fourth arc corresponding to a second imaginary circle, and
a radius of the first imaginary circle is smaller than a radius of the second imaginary circle.

6. The semiconductor device of claim 5, wherein a center of the first imaginary circle is within the first interconnection line, and
a center of the second imaginary circle is outside the third interconnection line.

7. The semiconductor device of claim 1, wherein a linewidth of each of the first interconnection line, a remaining portion of the second interconnection line, a third interconnection line and a fourth interconnection line is equal to a first width, the uniform linewidth of each of the first portion and the second portion of the second lower interconnection line is equal to a second width, and
the first width is different from the second width.

8. The semiconductor device of claim 1, further comprising:
a first active pattern and a second active pattern on the PMOSFET region and the NMOSFET region, respectively;
a device isolation layer on the substrate to define the first active pattern and the second active patterns;
a first channel pattern and a second channel pattern on the first active pattern and the second active patterns, respectively;
first source/drain patterns on both sides of the first channel pattern;
second source/drain patterns on both sides of the second channel pattern;
a gate electrode that extends in the first direction and crosses the first channel pattern and the second channel pattern;
an active contact connected to at least one of the first source/drain patterns and the second source/drain patterns; and
a gate contact connected to the gate electrode,
wherein the first metal layer is on and connected to the active contact and the gate contact.

9. A semiconductor device, comprising:
a logic cell on a substrate, the logic cell comprising a PMOSFET region and an NMOSFET region; and
a first metal layer on the logic cell,
wherein the first metal layer comprises:
a first power line and a second power line that have lengths extending in a second direction and are parallel to each other; and
a first lower interconnection line, a second lower interconnection line, a third lower interconnection line, a fourth lower interconnection line, and a fifth lower interconnection line, which are respectively disposed on a first interconnection track, a second interconnection track, a third interconnection track, a fourth interconnection track, and a fifth interconnection track that are sequentially defined between the first power line and the second power line and have lengths extending in the second direction parallel to each other,
wherein the first interconnection track, the second interconnection track, the third interconnection track, the fourth interconnection track, and the fifth interconnection track are arranged, at a constant pitch, in a first direction that crosses the second direction,
wherein a linewidth of the first lower interconnection line, a linewidth of the third lower interconnection line, and a linewidth of the fifth lower interconnection line are equal to a first width, wherein a linewidth of the second lower interconnection line and a linewidth of the fourth lower interconnection line are equal to a second width, wherein the first width is different from the second width, wherein the first lower interconnection line comprises a first interconnection line and a second interconnection line, which are spaced apart from each other in the second direction by a first distance, the first interconnection line having a first end with a first convex curvature that faces the second interconnection line, and the second interconnection line having a second end with a second convex curvature that faces the first interconnection line, wherein the third lower interconnection line comprises a third interconnection line and a fourth interconnection line, which are spaced apart from each other in the second direction by a second distance smaller than the first distance, the third interconnection line having a third end and a fourth end, wherein the fourth end faces the fourth interconnection line, and wherein the linewidth of an entirety of the second lower interconnection line is uniform.

10. The semiconductor device of claim 9, wherein the second lower interconnection line comprises a first portion, which is across from the first distance between the first interconnection line and the second interconnection line.

11. The semiconductor device of claim 9, wherein a fourth convex curvature of the fourth end is smaller than a third convex curvature of the third end.

12. A semiconductor device, comprising:
an active pattern on a substrate;
a device isolation layer in a trench that defines the active pattern;
a source/drain pattern on the active pattern and a channel pattern connected to the source/drain pattern, the channel pattern comprising a first semiconductor pattern, a second semiconductor pattern, and a third semiconductor pattern, which are sequentially stacked to be spaced apart from each other;
a gate electrode that extends and crosses the channel pattern, the gate electrode comprising a first portion between the active pattern and the first semiconductor pattern, a second portion between the first semiconductor pattern and the second semiconductor pattern, a third portion between the second semiconductor pattern and the third semiconductor pattern, and a fourth portion on the third semiconductor pattern;
a gate insulating layer between the channel pattern and the gate electrode;
gate spacers on opposite side surfaces of the fourth portion of the gate electrode, respectively;
a gate capping pattern on a top surface of the gate electrode;
a first interlayer insulating layer on the gate capping pattern;
an active contact that penetrates the first interlayer insulating layer and is coupled to the source/drain pattern;
a gate contact that penetrates the first interlayer insulating layer and is coupled to the gate electrode;
a second interlayer insulating layer on the first interlayer insulating layer;
a first metal layer in the second interlayer insulating layer and connected to the active contact and the gate contact;
a third interlayer insulating layer on the second interlayer insulating layer; and
a second metal layer in the third interlayer insulating layer, wherein the first metal layer comprises:
a first power line and a second power line that have lengths extending in a second direction and are spaced apart from each other; and
a first lower interconnection line, a second lower interconnection line, and a third lower interconnection line, which are respectively arranged on a first interconnection track, a second interconnection track, and a third interconnection track that have lengths extending in the second direction between the first power line and the second power line and are parallel to each other, with the second interconnection track between the first interconnection track and the third interconnection track, wherein the first lower interconnection line comprises a first interconnection line and a second interconnection line, which are spaced apart from each other in the second direction by a first distance, wherein the third lower interconnection line comprises a third interconnection line and a fourth interconnection line, which are spaced apart from each other in the second direction by a second distance smaller than the first distance, wherein the first interconnection line has a first end with a first convex curvature having a first center within the first interconnection line, wherein the first end faces the second interconnection line, wherein the second interconnection line has a second end with a second convex curvature having a second center within the second interconnection line, wherein the second end faces the first interconnection line, wherein the third interconnection line has a third end with a third convex curvature having a third center within the third interconnection line and a fourth end with a fourth convex curvature having a fourth center within the third interconnection line, wherein the fourth end is opposite to the third end, and wherein the second lower interconnection line has a length extending in the second direction with a uniform linewidth along an entirety of the second lower interconnection line in a first direction orthogonal to the second direction.

13. The semiconductor device of claim 12, wherein the first convex curvature of the first end is larger than the fourth convex curvature of the fourth end.

14. The semiconductor device of claim 12, wherein the fourth convex curvature of the fourth end is different from the third convex curvature of the third end.

* * * * *